United States Patent
Sagehashi et al.

(10) Patent No.: US 9,250,517 B2
(45) Date of Patent: Feb. 2, 2016

(54) POLYMER, POSITIVE RESIST COMPOSITION AND PATTERNING PROCESS

(71) Applicant: SHIN-ETSU CHEMICAL CO., LTD., Tokyo (JP)

(72) Inventors: Masayoshi Sagehashi, Joetsu (JP); Jun Hatakeyama, Joetsu (JP); Koji Hasegawa, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 46 days.

(21) Appl. No.: 13/919,558

(22) Filed: Jun. 17, 2013

(65) Prior Publication Data

US 2013/0344442 A1    Dec. 26, 2013

(30) Foreign Application Priority Data

Jun. 26, 2012 (JP) .................. 2012-142572

(51) Int. Cl.
*G03F 7/039* (2006.01)
*G03F 7/004* (2006.01)
*G03F 7/20* (2006.01)

(52) U.S. Cl.
CPC .............. *G03F 7/004* (2013.01); *G03F 7/0045* (2013.01); *G03F 7/0392* (2013.01); *G03F 7/20* (2013.01)

(58) Field of Classification Search
CPC .......... C08F 22/10; C08F 22/20; C08F 22/24; G03F 7/004; G03F 7/039; G03F 7/0392; G03F 7/0395; G03F 7/20; G03F 7/2002
USPC ..................... 430/270.1, 326, 910; 526/318
See application file for complete search history.

(56) References Cited

U.S. PATENT DOCUMENTS

| | | | |
|---|---|---|---|
| 5,879,851 A | 3/1999 | Takahashi et al. | |
| 6,448,420 B1 | 9/2002 | Kinsho et al. | |
| 6,794,110 B2 * | 9/2004 | Breyta et al. ............. | 430/270.1 |
| 6,808,860 B2 * | 10/2004 | Sato et al. ............... | 430/270.1 |
| 7,482,108 B2 | 1/2009 | Matsumaru et al. | |
| 7,537,880 B2 | 5/2009 | Harada et al. | |
| 7,569,326 B2 * | 8/2009 | Ohsawa et al. ........... | 430/270.1 |
| 7,598,016 B2 | 10/2009 | Kobayashi et al. | |
| 8,017,304 B2 | 9/2011 | Tarutani et al. | |
| 2008/0090172 A1 | 4/2008 | Hatakeyama et al. | |

FOREIGN PATENT DOCUMENTS

| | | | |
|---|---|---|---|
| JP | 2000-327633 A | | 11/2000 |
| JP | 2001-042533 | * | 2/2001 |
| JP | 3429592 B2 | | 7/2003 |
| JP | 2006-045311 A | | 2/2006 |
| JP | 2006-178317 A | | 7/2006 |
| JP | 3929648 B2 | | 6/2007 |
| JP | 2008-111103 A | | 5/2008 |
| JP | 2008-122932 A | | 5/2008 |
| JP | 2008-239918 A | | 10/2008 |
| JP | 4562784 B2 | | 10/2010 |

OTHER PUBLICATIONS

Machine translation of JP 2001-042533, published on Feb. 16, 2001.*
Kishikawa, Yasuhiro, et al., "Assessment of trade-off between resist resolution and sensitivity for optimization of hyper-NA immersion lithography", Proceedings of SPIE, 2007, vol. 6520, pp. 65203L-1-65203L-9.
Hutchinson, John, M., "The Shot Noise Impact on Resist Roughness in EUV Lithography", Proceedings of SPIE, 1998, vol. 3331, pp. 531-536.
Brainard, Robert, L, et al., "Shot Noise, LER, and Quantum Efficiency of EUV Photoresists", Proceedings of SPIE, 2004, vol. 5374, pp. 74-85.
Kozawa, Takahiro, et al., "Basic aspects of acid generation processes in chemically amplified resists for electron beam lithography", Proceedings of SPIE, 2005, vol. 5753, pp. 361-367.
Nakano, Atsuro, et al., "Deprotonation mechanism of poly(4-hydroxystyrene) and its deriative", Proceedings of SPIE, 2005, vol. 5753, pp. 1034-1039.
Wang, Mingxing, et al., "Novel Anionic Photoacid Generator (PAGs) and Photoresist for sub-50 nm Patterning by EUVL and EBL", Proceedings of SPIE, 2007, vol. 6519. pp. 65191F-1-65191F-6.

* cited by examiner

*Primary Examiner* — Anca Eoff
(74) *Attorney, Agent, or Firm* — Westerman, Hattori, Daniels & Adrian, LLP

(57) ABSTRACT

A polymer comprising recurring units of butyrolactone (meth)acrylate, recurring units having a carboxyl or phenolic group which is substituted with an acid labile group, and recurring units having a phenol group or an adhesive group in the form of 2,2,2-trifluoro-1-hydroxyethyl is quite effective as a base resin for resist. A positive resist composition comprising the polymer is improved in such properties as a contrast of alkali dissolution rate before and after exposure, acid diffusion suppressing effect, resolution, and profile and edge roughness of a pattern after exposure.

9 Claims, No Drawings

POLYMER, POSITIVE RESIST COMPOSITION AND PATTERNING PROCESS

CROSS-REFERENCE TO RELATED APPLICATION

This non-provisional application claims priority under 35 U.S.C. §119(a) on Patent Application No. 2012-142572 filed in Japan on Jun. 26, 2012, the entire contents of which are hereby incorporated by reference.

TECHNICAL FIELD

This invention relates to a polymer, a positive resist composition, typically chemically amplified positive resist composition comprising the polymer, and a patterning process using the same.

BACKGROUND ART

To meet the demand for higher integration density and operating speed of LSIs, the effort to reduce the pattern rule is in rapid progress. The wide-spreading flash memory market and the demand for increased storage capacities drive forward the miniaturization technology. As the advanced miniaturization technology, manufacturing of microelectronic devices at the 65-nm node by the ArF lithography has been implemented in a mass scale. Manufacturing of 45-nm node devices by the next generation ArF immersion lithography is approaching to the verge of high-volume application. The candidates for the next generation 32-nm node include ultra-high NA lens immersion lithography using a liquid having a higher refractive index than water in combination with a high refractive index lens and a high refractive index resist film, extreme ultraviolet (EUV) lithography of wavelength 13.5 nm, and double patterning version of the ArF lithography, on which active research efforts have been made.

With respect to high-energy radiation of very short wavelength such as electron beam (EB) or x-ray, hydrocarbons and similar light elements used in resist materials have little absorption. Then polyhydroxystyrene base resist materials are under consideration.

The exposure system for mask manufacturing made a transition from the laser beam exposure system to the EB exposure system to increase the accuracy of line width. Since a further size reduction becomes possible by increasing the accelerating voltage of the electron gun in the EB exposure system, the accelerating voltage increased from 10 kV to 30 kV and reached 50 kV in the current mainstream system, with a voltage of 100 kV being under investigation.

As the accelerating voltage increases, a lowering of sensitivity of resist film becomes of concern. As the accelerating voltage increases, the influence of forward scattering in a resist film becomes so reduced that the contrast of electron image writing energy is improved to ameliorate resolution and dimensional control whereas electrons can pass straightforward through the resist film so that the resist film becomes less sensitive. Since the mask exposure tool is designed for exposure by direct continuous writing, a lowering of sensitivity of resist film leads to an undesirably reduced throughput. Due to a need for higher sensitivity, chemically amplified resist compositions are contemplated.

As the feature size reduces, image blurs due to acid diffusion become a problem. To insure resolution for fine patterns with a size of 45 nm et seq., not only an improvement in dissolution contrast is important as previously reported, but control of acid diffusion is also important as reported in SPIE Vol. 6520 65203L-1 (2007). Since chemically amplified resist compositions are designed such that sensitivity and contrast are enhanced by acid diffusion, an attempt to minimize acid diffusion by reducing the temperature and/or time of post-exposure baking (PEB) fails, resulting in drastic reductions of sensitivity and contrast.

A triangular tradeoff relationship among sensitivity, resolution, and edge roughness has been pointed out. Specifically, a resolution improvement requires to suppress acid diffusion whereas a short acid diffusion distance leads to a lowering of sensitivity.

The addition of an acid generator capable of generating a bulky acid is an effective means for suppressing acid diffusion. It was then proposed to incorporate in a polymer an acid generator of an onium salt having a polymerizable olefin. JP-A 2006-045311 discloses a sulfonium salt having polymerizable olefin capable of generating a specific sulfonic acid and a similar iodonium salt. JP-A 2006-178317 discloses a sulfonium salt having sulfonic acid directly attached to the main chain.

A tradeoff relationship between sensitivity and edge roughness has been pointed out. For example, SPIE Vol. 3331 p 531 (1998) describes that sensitivity is in inverse proportion to edge roughness. It is expected that the edge roughness of a resist film is reduced by increasing the exposure dose to reduce shot noise. SPIE Vol. 5374 p 74 (2004) describes a tradeoff between sensitivity and roughness in the EUV lithography in that a resist material containing a more amount of quencher is effective in reducing roughness, but suffers from a decline of sensitivity at the same time. There is a need to enhance the quantum efficiency of acid generation in order to overcome the problem.

With respect to the acid generating mechanism triggered by EB exposure, SPIE Vol. 5753 p 361 (2005) reports that PAG releases acid through the mechanism that a polymer is excited by exposure so that electrons migrate to the PAG. Since the irradiation energy of EB or EUV is higher than the threshold value (10 eV) of ionization potential energy of a base polymer, it is presumed that the base polymer is readily ionized. An exemplary material of accelerating electron migration is hydroxystyrene.

It is reported in SPIE Vol. 5753 p 1034 (2005) that poly-4-hydroxystyrene has a higher acid generation efficiency in EB exposure than poly-4-methoxystyrene, indicating that poly-4-hydroxystyrene provides for efficient migration of electrons to PAG upon EB exposure.

Reported in SPIE Vol. 6519 p 6519F1-1 (2007) is a material obtained through copolymerization of hydroxystyrene for increasing the acid generation efficiency by electron migration, a methacrylate of PAG having sulfonic acid directly bonded to a polymer backbone for suppressing acid diffusion, and a methacrylate having an acid labile group. Since hydroxystyrene has a phenolic hydroxyl group which is weakly acidic, it is effective for reducing swell in alkaline developer, but causes to increase acid diffusion. On the other hand, a methacrylate having lactone as the adhesive group is widely employed in the ArF resist composition. Since this methacrylate has high hydrophilicity and no alkali solubility, it is ineffective for reducing swell, but effective for suppressing acid diffusion. A combination of hydroxystyrene and lactone-containing methacrylate as the adhesive group can establish a fairly good balance among sensitivity improvement, swell reduction, and acid diffusion control, but is still insufficient.

Copolymerization of hydroxyphenyl methacrylate with lactone-containing methacrylate and further methacrylate of PAG having sulfonic acid directly bonded to the polymer backbone makes it possible to form a resist film having high sensitivity and high resolution while controlling acid diffusion. Like the hydroxystyrene discussed above, phenol groups have a sensitizing effect relative to EB and EUV as well as an effect of suppressing swell in aqueous alkaline developer. However, if phenol groups are excessively incorporated, then the pattern may experience a film thickness loss, failing to take advantage of the sensitizing effect of phenol groups. In this case, increasing the proportion of hydroxyphenyl methacrylate is effective for further enhancing sensitivity. However, an increased proportion of hydroxyphenyl methacrylate makes the polymer more alkaline soluble, resulting in a film thickness loss and hence, pattern collapse.

CITATION LIST

Patent Document 1: JP-A 2006-045311 (U.S. Pat. No. 7,482,108)
Patent Document 2: JP-A 2006-178317
Patent Document 3: JP 3929648
Patent Document 4: JP 4562784 (U.S. Pat. No. 8,017,304)
Non-Patent Document 1: SPIE Vol. 6520 65203L-1 (2007)
Non-Patent Document 2: SPIE Vol. 3331 p 531 (1998)
Non-Patent Document 3: SPIE Vol. 5374 p 74 (2004)
Non-Patent Document 4: SPIE Vol. 5753 p 361 (2005)
Non-Patent Document 5: SPIE Vol. 5753 p 1034 (2005)
Non-Patent Document 6: SPIE Vol. 6519 p 6519F1-1 (2007)

SUMMARY OF INVENTION

An object of the present invention is to provide a polymer, a positive resist composition, typically chemically amplified positive resist composition comprising the polymer, and a patterning process using the resist composition, wherein the composition exhibits a higher resolution than the prior art positive resist compositions and minimal edge roughness (LER, LWR), and forms a pattern of good profile after exposure.

Making extensive investigations in search for a positive resist material capable of meeting the current requirements including high sensitivity, high resolution, and minimal edge roughness, the inventors have found that a polymer comprising recurring units of butyrolactone (meth)acrylate, recurring units having a carboxyl or phenolic group which is substituted with an acid labile group, and recurring units having a phenol group or an adhesive group in the form of 2,2,2-trifluoro-1-hydroxyethyl, as defined below, is quite effective as a base resin in a positive resist composition, typically chemically amplified positive resist composition; and that a resist composition comprising the polymer is improved in such properties as a contrast of alkali dissolution rate before and after exposure, acid diffusion suppressing effect, resolution, and profile and edge roughness of a pattern after exposure, and thus best suited as a micropatterning material for the fabrication of VLSI and photomasks.

The inventive polymer is comprised of γ-butyrolactone (meth)acrylate having alkyl groups on constituent carbon atoms. The well-balanced distribution of alkyl groups on lactone ring ensures that the polymer is smoothly dissolved in alkaline developer and unsusceptible to swell in alkaline developer, avoiding pattern collapse. Also the polymer is hydrophobic enough to prevent the resist pattern from a film thickness loss following development. The recurring units having a carboxyl or phenolic group which is substituted with an acid labile group are effective for improving dissolution contrast while suppressing acid diffusion. Copolymerization of recurring units having a phenol group or an adhesive group in the form of 2,2,2-trifluoro-1-hydroxyethyl improves resolution and ensures formation of a pattern of good profile with minimal edge roughness.

The positive resist composition has a satisfactory effect of suppressing acid diffusion and a high resolution, lends itself to the lithography process, and forms a pattern of good profile and minimal edge roughness after exposure. Because of these advantages, the composition is readily implemented in practice and best suited as a VLSI-forming resist material and mask pattern forming material.

In one aspect, the invention provides a polymer comprising recurring units XA, recurring units B1 and/or B2 having a carboxyl and/or phenolic hydroxyl group whose hydrogen atom is substituted by an acid labile group, and recurring units C1 having a hydroxy-aromatic group and/or recurring units C2 having a 2,2,2-trifluoro-1-hydroxyethyl group, as represented by the general formula (1), the polymer having a weight average molecular weight of 1,000 to 500,000.

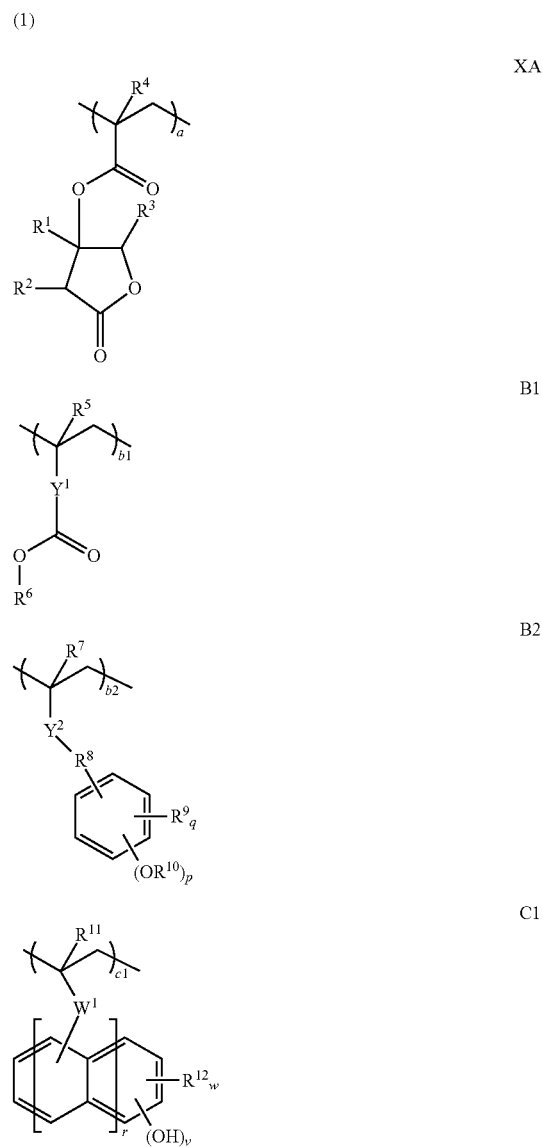

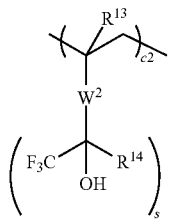

Herein $R^1$ and $R^3$ are each independently a $C_1$-$C_3$ alkyl group; $R^2$ is hydrogen or a $C_1$-$C_3$ alkyl group; $R^4$ is hydrogen or methyl; $R^5$ and $R^7$ are each independently hydrogen or methyl; $R^6$ and $R^{10}$ are each independently an acid labile group; $R^8$ is a single bond or a $C_1$-$C_6$ straight or branched alkylene group; $R^9$ is hydrogen, fluorine, trifluoromethyl, cyano or a $C_1$-$C_6$ straight, branched or cyclic alkyl group; p is 1 or 2, q is an integer of 0 to 4; $Y^1$ is a single bond, a $C_1$-$C_{12}$ linking group having an ester radical, ether radical or lactone ring, phenylene group or naphthylene group; $Y^2$ is a single bond, —C(=O)—O— or —C(=O)—NH—; $R^{11}$ and $R^{13}$ are each independently hydrogen or methyl; $W^1$ and $W^2$ are each independently a single bond, phenylene group, —$R^{15}$—C(=O)—O—$R^{16}$—, —$R^{15}$—O—$R^{16}$—, or —$R^{15}$—C(=O)—NH—$R^{16}$—; $R^{15}$ is a single bond or a $C_6$-$C_{10}$ arylene group; $R^{16}$ is a single bond or a $C_1$-$C_{10}$ straight, branched, cyclic or bridged alkylene group, $C_6$-$C_{10}$ arylene group, or $C_2$-$C_{10}$ alkenylene group, which may contain an ether radical, ester radical or fluorine; $R^{12}$ is hydrogen, fluorine, trifluoromethyl, cyano, $C_1$-$C_6$ straight, branched or cyclic alkyl, alkoxy, acyl, acyloxy, or alkoxycarbonyl group; $R^{14}$ is hydrogen, fluorine, methyl, trifluoromethyl, or difluoromethyl; $R^{14}$ and $W^2$ may bond together to form a $C_3$-$C_6$ ring which may be substituted with fluorine or have an ether radical within the ring; r is 0 or 1, s is 1 or 2, v is 1 or 2, w is an integer of 0 to 4, a, b1, b2, c1 and c2 are numbers in the range: $0<a<1.0$, $0 \leq b1<1.0$, $0 \leq b2<1.0$, $0<b1+b2<1.0$, $0 \leq c1<1.0$, $0 \leq c2<1.0$, $0<c1+c2<1.0$, $0<a+b1+b2+c1+c2 \leq 1.0$.

The polymer may further comprise recurring units of at least one type selected from sulfonium salt units D1 to D3 represented by the general formula (2).

(2)

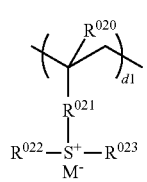

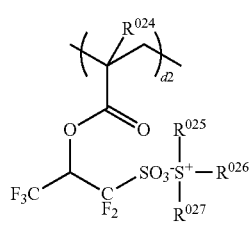

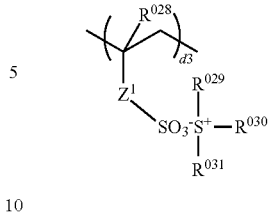

Herein $R^{020}$, $R^{024}$, and $R^{028}$ each are hydrogen or methyl, $R^{021}$ is a single bond, phenylene, —O—$R^{033}$—, or —C(=O)—Y—$R^{033}$—, Y is oxygen or NH, $R^{033}$ is a straight, branched or cyclic $C_1$-$C_6$ alkylene group, alkenylene or phenylene group, which may contain a carbonyl (—CO—), ester (—COO—), ether (—O—) or hydroxyl radical, $R^{022}$, $R^{023}$, $R^{025}$, $R^{026}$, $R^{027}$, $R^{029}$, $R^{030}$, and $R^{031}$ are each independently a straight, branched or cyclic $C_1$-$C_{12}$ alkyl group which may contain a carbonyl, ester or ether radical, or a $C_6$-$C_{12}$ aryl, $C_7$-$C_{20}$ aralkyl, or thiophenyl group, $Z^1$ is a single bond, methylene, ethylene, phenylene, fluorophenylene, —O—$R^{032}$—, or —C(=O)—$Z^2$—$R^{032}$—, $Z^2$ is oxygen or NH, $R^{032}$ is a straight, branched or cyclic $C_1$-$C_6$ alkylene group, alkenylene or phenylene group, which may contain a carbonyl, ester, ether or hydroxyl radical, $M^-$ is a non-nucleophilic counter ion, d1, d2 and d3 are in the range: $0 \leq d1 \leq 0.5$, $0 \leq d2 \leq 0.5$, $0-d3 \leq 0.5$, $0<d1+d2+d3 \leq 0.5$, and $0.2 \leq a+b1+b2+c1+c2<1.0$.

The polymer may further comprise recurring units having an adhesive group selected from the class consisting of hydroxyl, carboxyl, lactone ring, carbonate, thiocarbonate, carbonyl, cyclic acetal, ether, ester, sulfonic acid ester, cyano, amide, and —O—C(=O)-G- wherein G is sulfur or NH, the recurring units having an adhesive group being different from the recurring units XA, B1, B2, C1 and C2 and the recurring units D1 to D3.

In another aspect, the invention provides a positive resist composition comprising the polymer defined above as a base resin. Preferably the resist composition further comprises an organic solvent and an acid generator, and optionally a basic compound and/or a surfactant.

In a further aspect, the invention provides a pattern forming process comprising the steps of applying the positive resist composition defined above onto a substrate to form a coating, baking, exposing the coating to high-energy radiation, and developing the exposed coating in a developer.

Typically the high-energy radiation is KrF excimer laser of wavelength 248 nm, ArF excimer laser of wavelength 193 nm, electron beam or soft X-ray of wavelength 3 to 15 nm.

The positive resist composition, typically chemically amplified positive resist composition is used not only in the lithography for forming semiconductor circuits, but also in the formation of mask circuit patterns, micromachines, and thin-film magnetic head circuits.

ADVANTAGEOUS EFFECTS OF INVENTION

The positive resist composition has a satisfactory effect of suppressing acid diffusion and a high resolution, and forms a pattern of good profile and minimal edge roughness after exposure. The positive resist composition, typically chemically amplified positive resist composition is best suited as a micropatterning material by ArF excimer laser, KrF excimer laser, EUV and EB lithography processes for the microfabrication of VLSI and photomasks.

DESCRIPTION OF EMBODIMENTS

As used herein, the singular forms "a," "an" and "the" include plural referents unless the context clearly dictates otherwise. "Optional" or "optionally" means that the subsequently described event or circumstances may or may not occur, and that description includes instances where the event or circumstance occurs and instances where it does not. The notation (Cn-Cm) means a group containing from n to m carbon atoms per group. The terminology "(meth)acrylate" refers collectively to acrylate and methacrylate.

The acronym "PAG" stands for photoacid generator, "PEB" for post-exposure bake, "LER" for line edge roughness, and "LWR" for line width roughness.

One embodiment of the invention is a polymer comprising recurring units XA, recurring units B1 and/or B2 having a carboxyl and/or phenolic hydroxyl group whose hydrogen atom is substituted by an acid labile group, and recurring units C1 having a hydroxy-aromatic group and/or recurring units C2 having a 2,2,2-trifluoro-1-hydroxyethyl group, the polymer having a weight average molecular weight of 1,000 to 500,000. The polymer has the general formula (1).

(1)

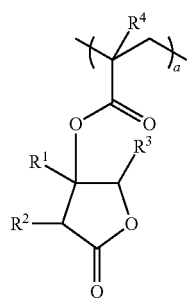

XA

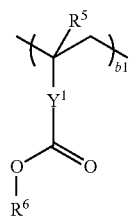

B1

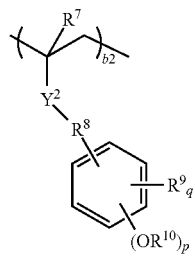

B2

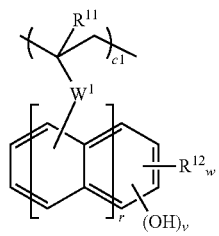

C1

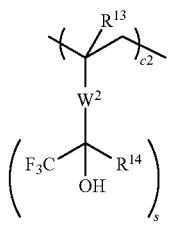

C2

Herein $R^1$ and $R^3$ are each independently a $C_1$-$C_3$ alkyl group. $R^2$ is hydrogen or a $C_1$-$C_3$ alkyl group. $R^4$ is hydrogen or methyl. $R^5$ and $R^7$ are each independently hydrogen or methyl. $R^6$ and $R^{10}$ are each independently an acid labile group. $R^8$ is a single bond or a $C_1$-$C_6$ straight or branched alkylene group. $R^9$ is hydrogen, fluorine, trifluoromethyl, cyano or a $C_1$-$C_6$ straight, branched or cyclic alkyl group, p is 1 or 2, q is an integer of 0 to 4. $Y^1$ is a single bond, a $C_1$-$C_{12}$ linking group having an ester radical, ether radical or lactone ring, a phenylene group or a naphthylene group. $Y^2$ is a single bond, —C(=O)—O— or —C(=O)—NH—. $R^{11}$ and $R^{13}$ are each independently hydrogen or methyl. $W^1$ and $W^2$ are each independently a single bond, phenylene group, —$R^{15}$—C(=O)—O—$R^{16}$—, —$R^{15}$—O—$R^{16}$—, or —$R^{15}$—C(=O)—NH—$R^{16}$—, wherein $R^{15}$ is a single bond or a $C_6$-$C_{10}$ arylene group, and $R^{16}$ is a single bond or a $C_1$-$C_{10}$ straight, branched, cyclic or bridged alkylene group, $C_6$-$C_{10}$ arylene group, or $C_2$-$C_{10}$ alkenylene group, which may contain an ether radical, ester radical or fluorine. $R^{12}$ is hydrogen, fluorine, trifluoromethyl, cyano, $C_1$-$C_6$ straight, branched or cyclic alkyl, alkoxy, acyl, acyloxy, or alkoxycarbonyl group. $R^{14}$ is hydrogen, fluorine, methyl, trifluoromethyl, or difluoromethyl. $R^{14}$ and $W^2$ may bond together to form a $C_3$-$C_6$ ring which may be substituted with fluorine or have an ether radical within the ring. The subscript r is 0 or 1, s is 1 or 2, v is 1 or 2, w is an integer of 0 to 4, a, b1, b2, c1 and c2 are numbers in the range: 0<a<1.0, 0≤b1<1.0, 0≤b2<1.0, 0<b1+b2<1.0, 0≤c1<1.0, 0≤c2<1.0, 0<c1+c2<1.0, 0<a+b1+b2+c1+c2≤1.0.

A monomer MA from which the recurring unit XA is derived has the following formula.

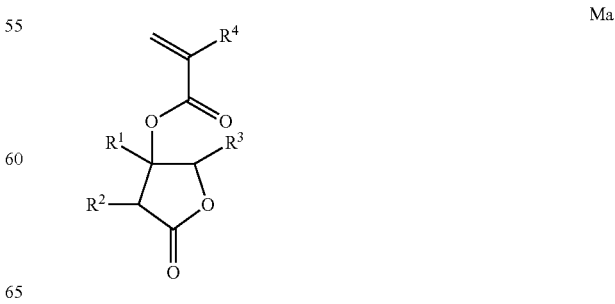

Herein $R^1$ to $R^4$ are as defined above.

Examples of the monomer MA from which the recurring unit XA is derived are shown below, but not limited thereto.

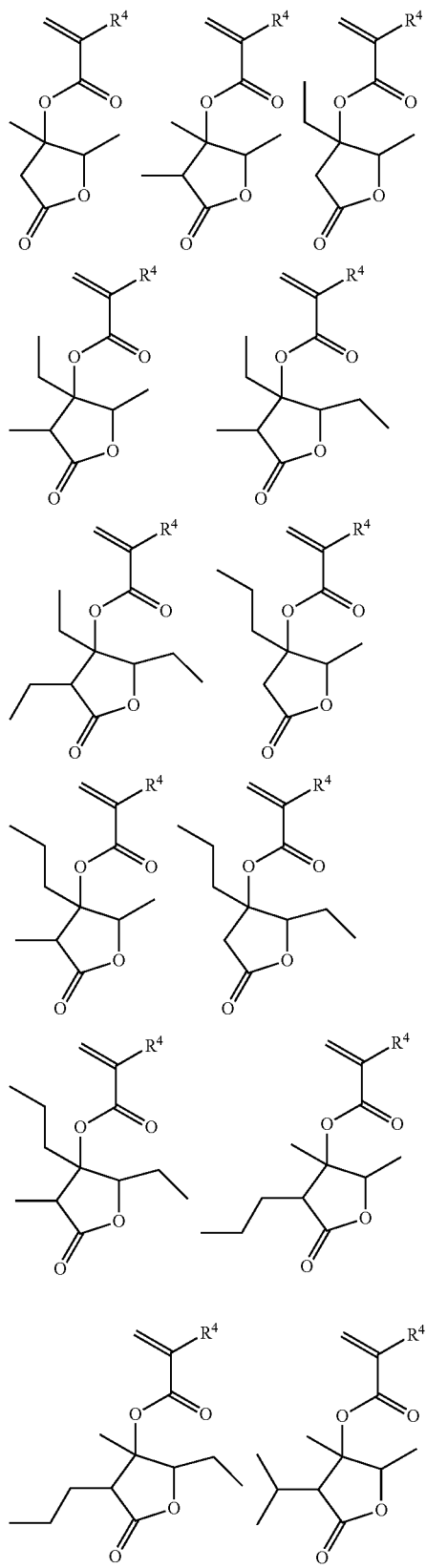

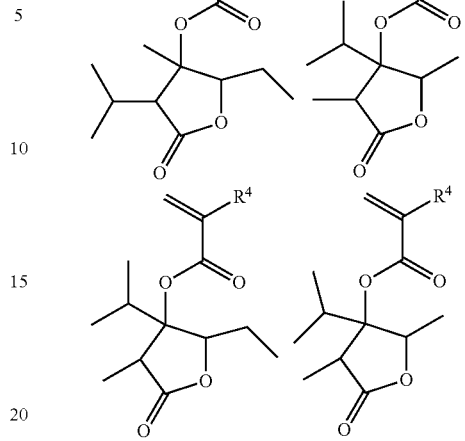

Herein $R^4$ is as defined above.

The recurring unit XA in the polymer is butyrolactone (meth)acrylate having alkyl groups of 1 to 3 carbon atoms. Normally butyrolactone (meth)acrylate is highly hydrophilic and effective for improving alkaline dissolution. When butyrolactone (meth)acrylate is copolymerized with recurring units having a hydroxy-aromatic group or hexafluoroalcohol group, a film thickness loss will occur in the pattern following development. The recurring units having a hydroxy-aromatic group or hexafluoroalcohol group are effective for suppressing swell in aqueous alkaline developer for thereby minimizing pattern collapse. In addition, the hydroxy-aromatic group has a sensitizing effect in EB and EUV lithography, offering the advantage of improved sensitivity. Thus these units are positively incorporated.

In many examples of Patent Documents 3 and 4, polymers comprising recurring units having an alkyl-substituted monocyclic lactone group are applied to ArF lithography. The inventors empirically learned that γ-butyrolactone (meth) acrylate in which only one specific carbon is substituted with methyl or geminal methyl is still insufficient to meet both the requirements of pattern film thickness loss prevention and swell suppression. In the case of mono-methyl substitution, the effect of preventing film thickness loss is less because of a less increase of hydrophobicity. A polymer having germinal methyl groups attached is too hydrophobic so that swell may occur in developer, resulting in pattern collapse. In contrast, the lactone structure disclosed herein provides for a distribution of plural alkyl groups at plural positions on γ-butyrolactone ring, with one alkyl group assigned to one carbon atom, and can prevent both pattern film thickness loss and swell.

Of the monomers Ma affording recurring units XA, preference is given to those monomers in which the total count of carbon atoms in alkyl substituents ($R^1+R^2+R^3$) on lactone ring is 2 to 9, more preferably 2 to 5. If the carbon count in each alkyl substituent is 4 or more, or if the total count of carbon atoms in alkyl substituents exceeds 9, the recurring unit XA becomes too hydrophobic, failing to attain the desired benefits.

Monomers Mb1 and Mb2 from which the acid labile group-bearing recurring units B1 and B2 in formula (1) are derived have the following formulae.

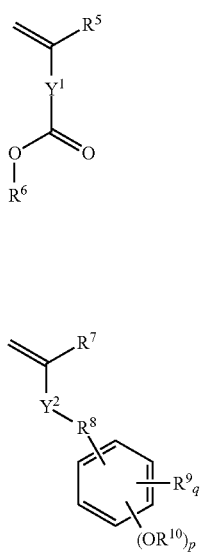
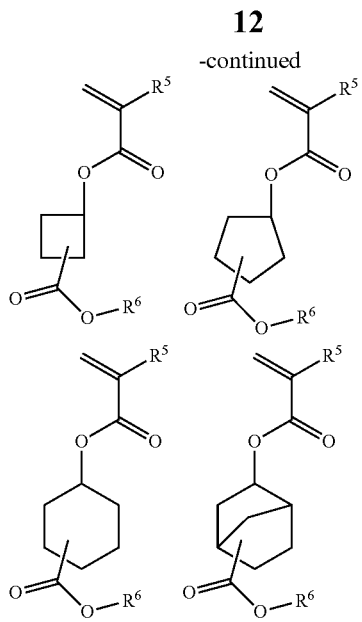
Herein $R^5$ to $R^{10}$, $Y^1$, $Y^2$, p and q are as defined above.
When $Y^1$ stands for a $C_1$-$C_{12}$ linking group having a lactone ring, the following is exemplary of the linking group.
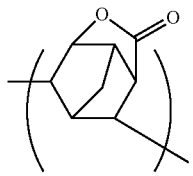
Examples of the monomer Mb1 from which the recurring unit B1 is derived are shown below, but not limited thereto.
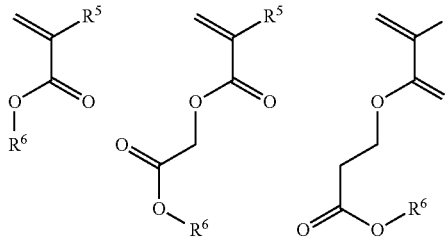
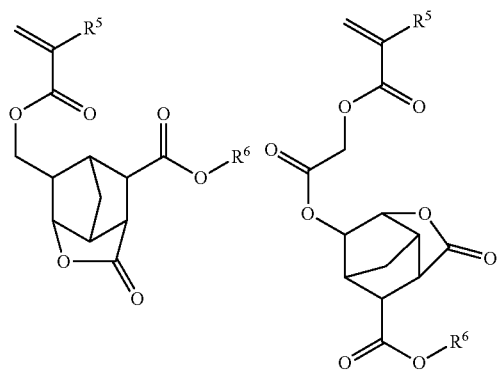
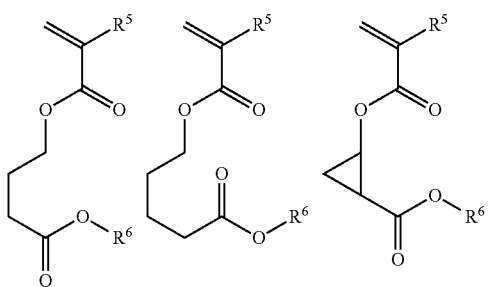
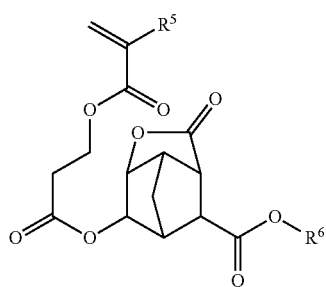

-continued
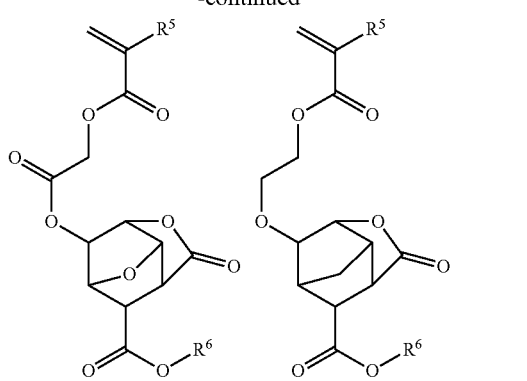
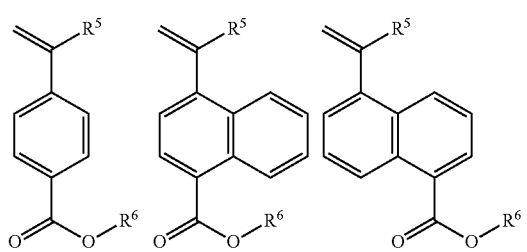
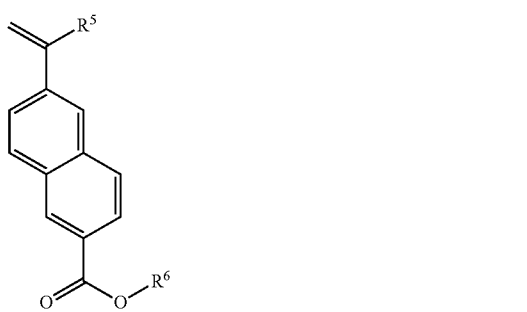
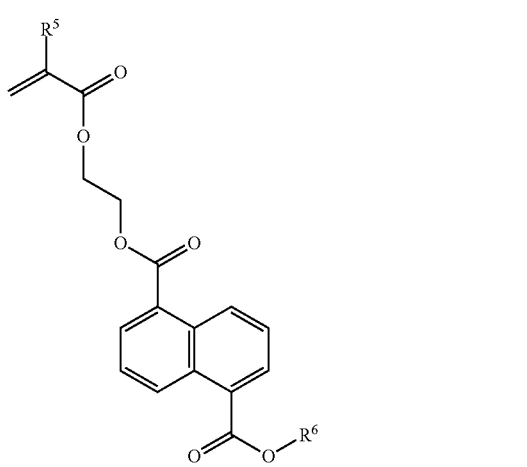
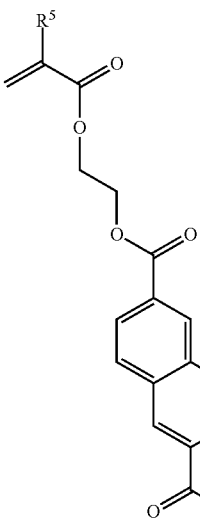
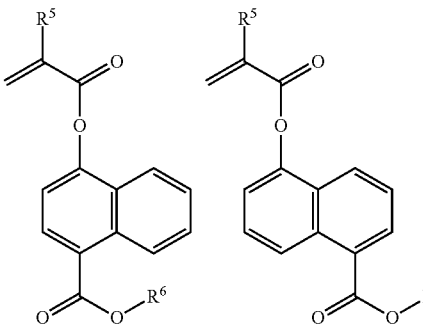
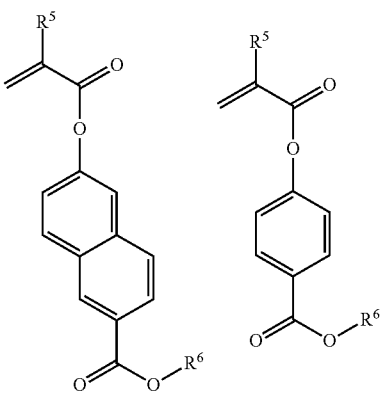
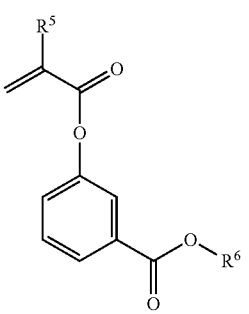
Herein $R^5$ and $R^6$ are as defined above.

Examples of the monomer Mb2 from which the recurring unit B2 is derived are shown below, but not limited thereto.
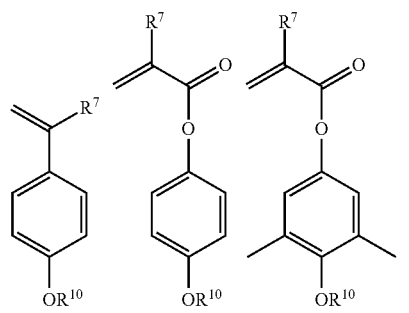
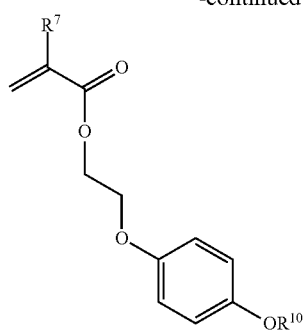
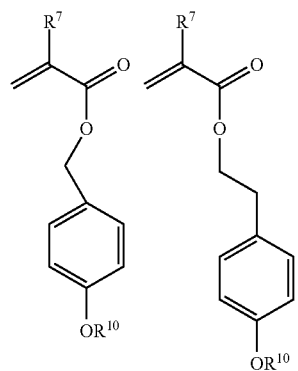
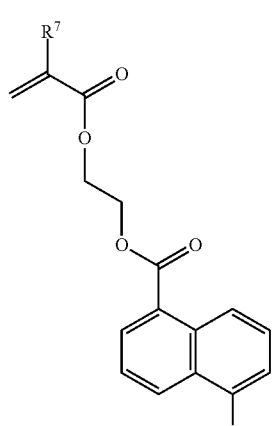
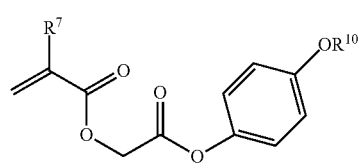
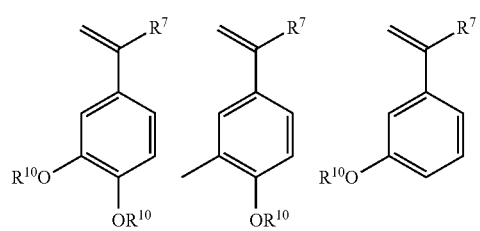
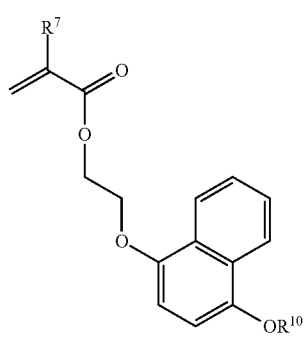
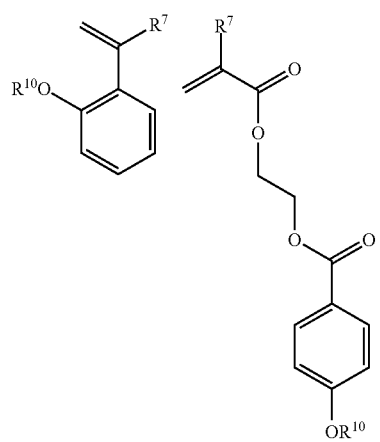
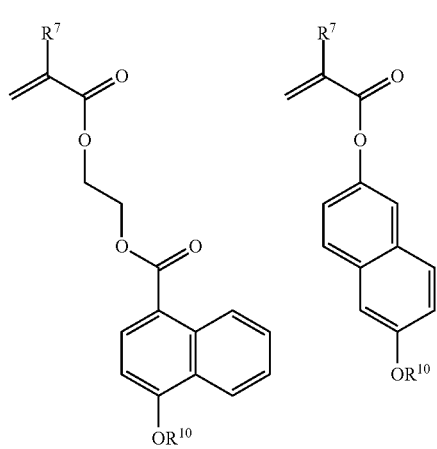

-continued

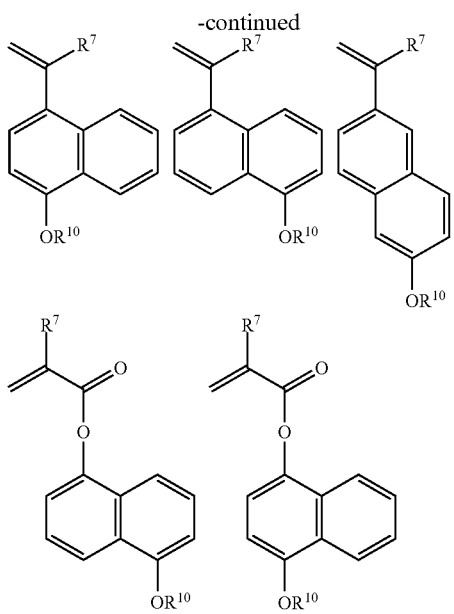

Herein $R^7$ and $R^{10}$ are as defined above.

The acid labile groups represented by $R^6$ in unit B1 and $R^{10}$ in unit B2 are selected from a variety of such groups and may be the same or different. The preferred acid labile groups include substituent groups of the following formulae (A-1) to (A-3).

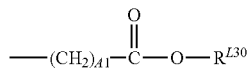 (A-1)

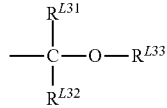 (A-2)

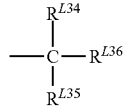 (A-3)

In formula (A-1), $R^{L30}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (A-3). Exemplary tertiary alkyl groups are tert-butyl, tert-amyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, and 2-methyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl. Letter A1 is an integer of 0 to 6.

In formula (A-2), $R^{L31}$ and $R^{L32}$ are hydrogen or straight, branched or cyclic alkyl groups of 1 to 18 carbon atoms, preferably 1 to 10 carbon atoms. Exemplary alkyl groups include methyl, ethyl, propyl, isopropyl, n-butyl, sec-butyl, tert-butyl, cyclopentyl, cyclohexyl, 2-ethylhexyl, and n-octyl. $R^{L33}$ is a monovalent hydrocarbon group of 1 to 18 carbon atoms, preferably 1 to 10 carbon atoms, which may contain a heteroatom such as oxygen, examples of which include straight, branched or cyclic alkyl groups and substituted forms of such alkyl groups in which some hydrogen atoms are replaced by hydroxyl, alkoxy, oxo, amino, alkylamino or the like. Illustrative examples of the substituted alkyl groups are shown below.

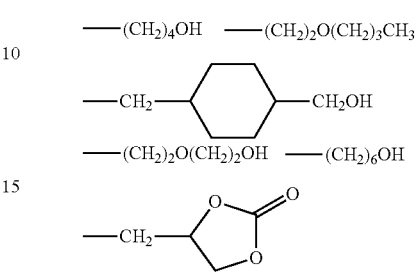

A pair of $R^{L31}$ and $R^{L32}$, $R^{L31}$ and $R^{L33}$, or $R^{L32}$ and $R^{L33}$ may bond together to form a ring with the carbon and oxygen atoms to which they are attached. Each of $R^{L31}$, $R^{L32}$ and $R^{L33}$ is a straight or branched alkylene group of 1 to 18 carbon atoms, preferably 1 to 10 carbon atoms when they form a ring, while the ring preferably has 3 to 10 carbon atoms, more preferably 4 to 10 carbon atoms.

Examples of the acid labile groups of formula (A-1) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethyl cyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl.

Also included are substituent groups having the formulae (A-1)-1 to (A-1)-10.

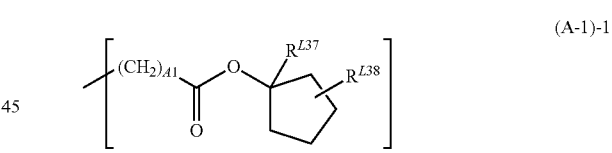 (A-1)-1

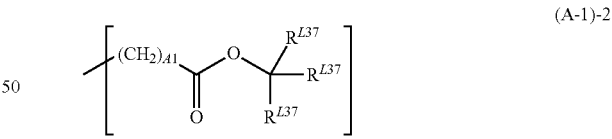 (A-1)-2

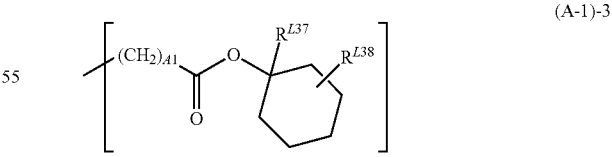 (A-1)-3

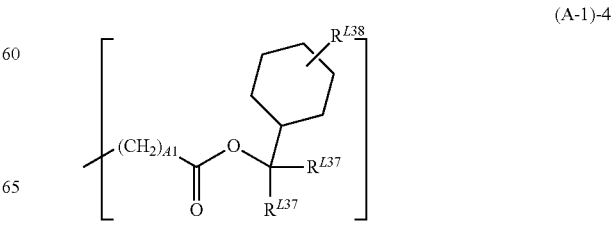 (A-1)-4

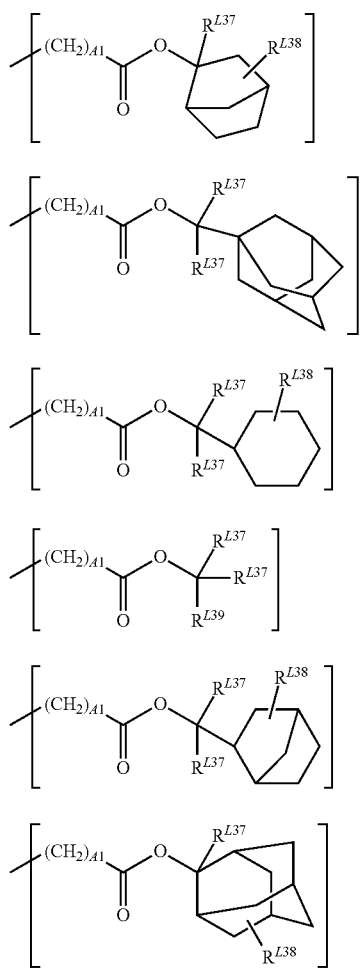

(A-1)-5
(A-1)-6
(A-1)-7
(A-1)-8
(A-1)-9
(A-1)-10

Herein $R^{L37}$ is each independently a straight, branched or cyclic $C_1$-$C_{10}$ alkyl group or $C_6$-$C_{20}$ aryl group, $R^{L38}$ is hydrogen or a straight, branched or cyclic $C_1$-$C_{10}$ alkyl group, $R^{L39}$ is each independently a straight, branched or cyclic $C_2$-$C_{10}$ alkyl group or $C_6$-$C_{20}$ aryl group, and A1 is as defined above.

Of the acid labile groups of formula (A-2), the straight and branched ones are exemplified by the following groups having formulae (A-2)-1 to (A-2)-69.

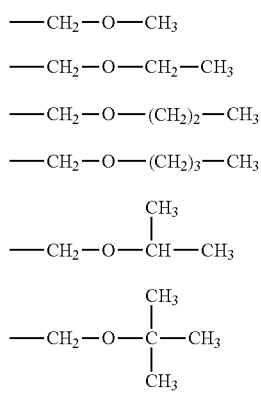

(A-2)-1
(A-2)-2
(A-2)-3
(A-2)-4
(A-2)-5
(A-2)-6

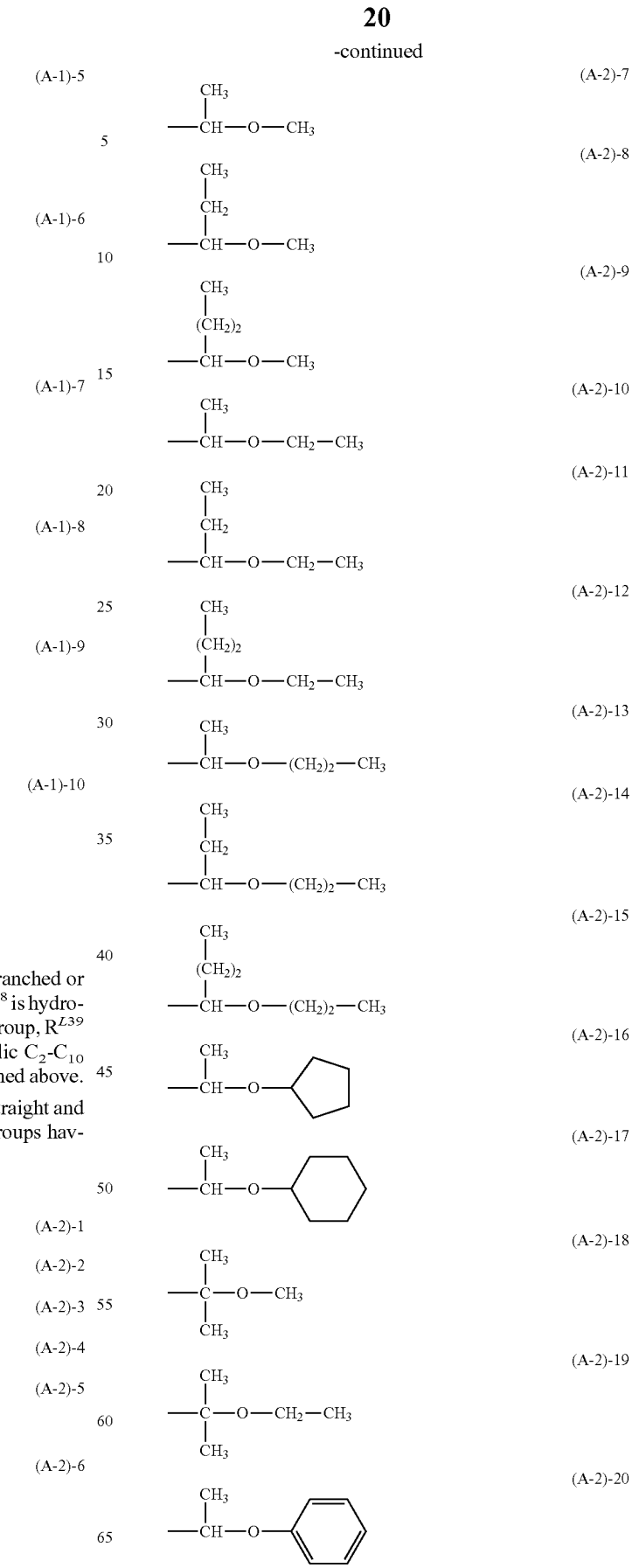

(A-2)-7
(A-2)-8
(A-2)-9
(A-2)-10
(A-2)-11
(A-2)-12
(A-2)-13
(A-2)-14
(A-2)-15
(A-2)-16
(A-2)-17
(A-2)-18
(A-2)-19
(A-2)-20

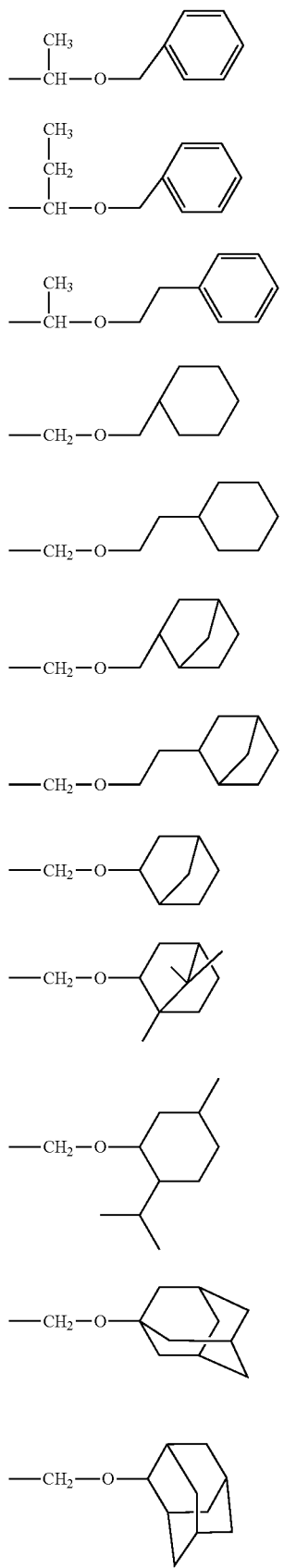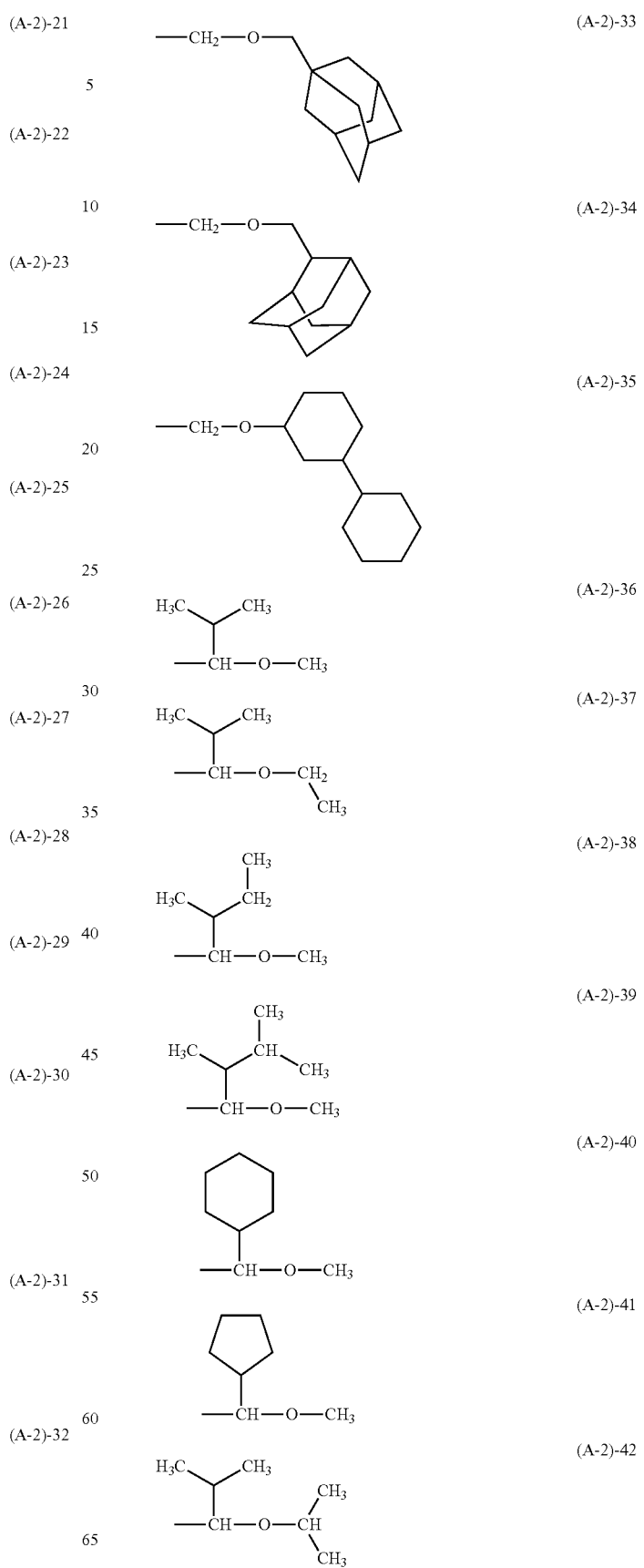

(A-2)-43
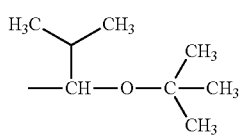
(A-2)-44
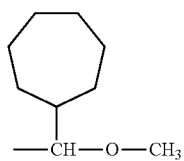
(A-2)-45
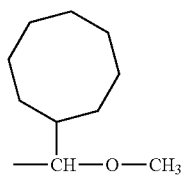
(A-2)-46
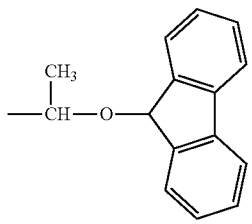
(A-2)-47
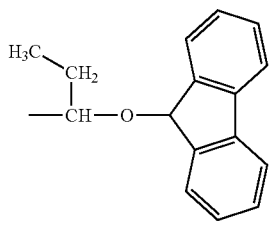
(A-2)-48
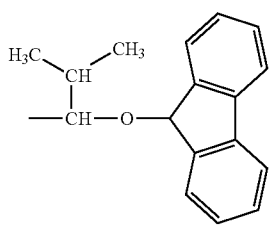
(A-2)-49
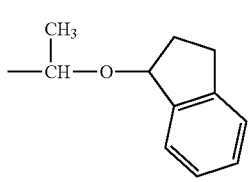
(A-2)-50
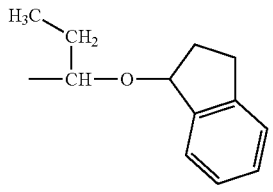
(A-2)-51
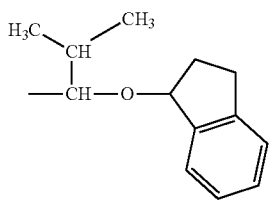
(A-2)-52
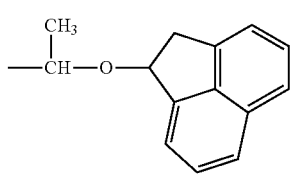
(A-2)-53
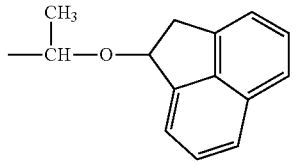
(A-2)-54
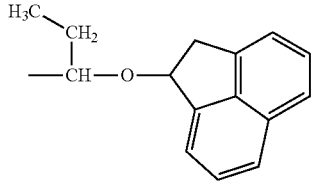
(A-2)-55
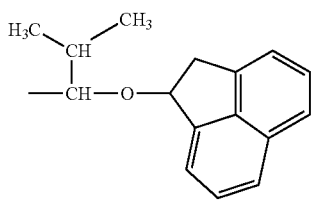
(A-2)-56
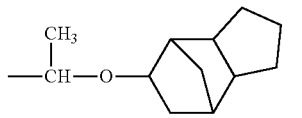
(A-2)-57
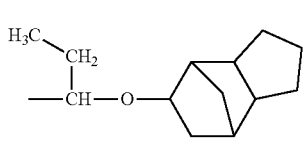
(A-2)-58
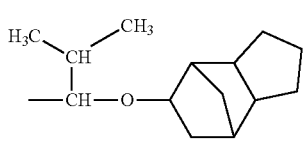
(A-2)-59
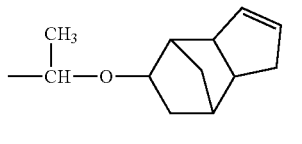
(A-2)-60
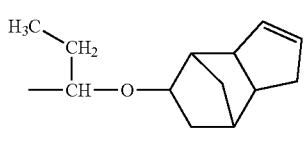

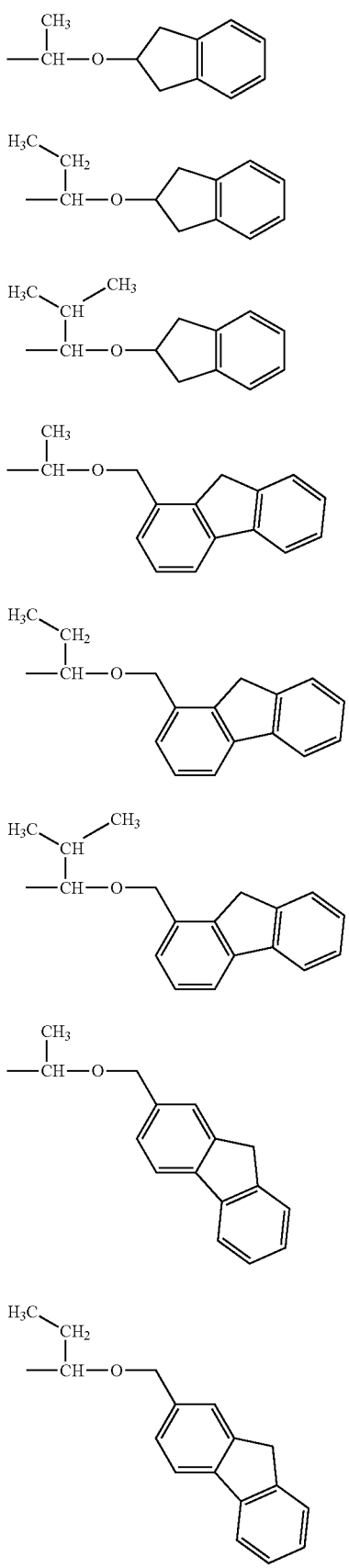

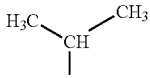
(A-2)-61

(A-2)-62

(A-2)-63

(A-2)-64

(A-2)-65

(A-2)-66

(A-2)-67

(A-2)-68

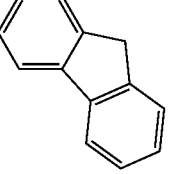
(A-2)-69

Of the acid labile groups of formula (A-2), the cyclic ones are, for example, tetrahydrofuran-2-yl, 2-methyltetrahydrofuran-2-yl, tetrahydropyran-2-yl, and 2-methyltetrahydropyran-2-yl.

Other examples of acid labile groups include those of the following formula (A-2a) or (A-2b) while the polymer may be crosslinked within the molecule or between molecules with these acid labile groups.

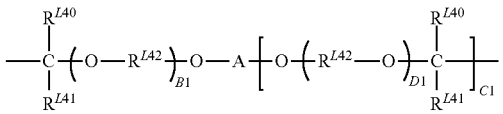
(A-2a)

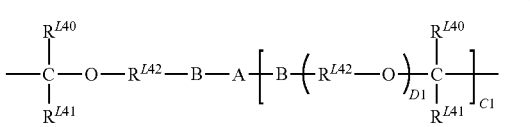
(A-2b)

Herein $R^{L40}$ and $R^{L41}$ each are hydrogen or a straight, branched or cyclic $C_1$-$C_8$ alkyl group, or $R^{L40}$ and $R^{L41}$, taken together, may form a ring with the carbon atom to which they are attached, and $R^{L40}$ and $R^{L41}$ are straight or branched $C_1$-$C_8$ alkylene groups when they form a ring. $R^{L42}$ is a straight, branched or cyclic $C_1$-$C_{10}$ alkylene group. Each of B1 and D1 is 0 or an integer of 1 to 10, preferably 0 or an integer of 1 to 5, and C1 is an integer of 1 to 7. "A" is a (C1+1)-valent aliphatic or alicyclic saturated hydrocarbon group, aromatic hydrocarbon group or heterocyclic group having 1 to 50 carbon atoms, which may be separated by a heteroatom or in which some of the hydrogen atoms attached to carbon atoms may be substituted by hydroxyl, carboxyl, carbonyl groups or fluorine atoms. "B" is —CO—O—, —NHCO—O— or —NHCONH—.

Preferably, "A" is selected from divalent to tetravalent, straight, branched or cyclic $C_1$-$C_{20}$ alkylene, alkyltriyl and alkyltetrayl groups, and $C_6$-$C_{30}$ arylene groups, which may be separated by a heteroatom or in which some of the hydrogen atoms attached to carbon atoms may be substituted by hydroxyl, carboxyl, acyl groups or halogen atoms. The subscript C1 is preferably an integer of 1 to 3.

The crosslinking acetal groups of formulae (A-2a) and (A-2b) are exemplified by the following formulae (A-2)-70 through (A-2)-77.

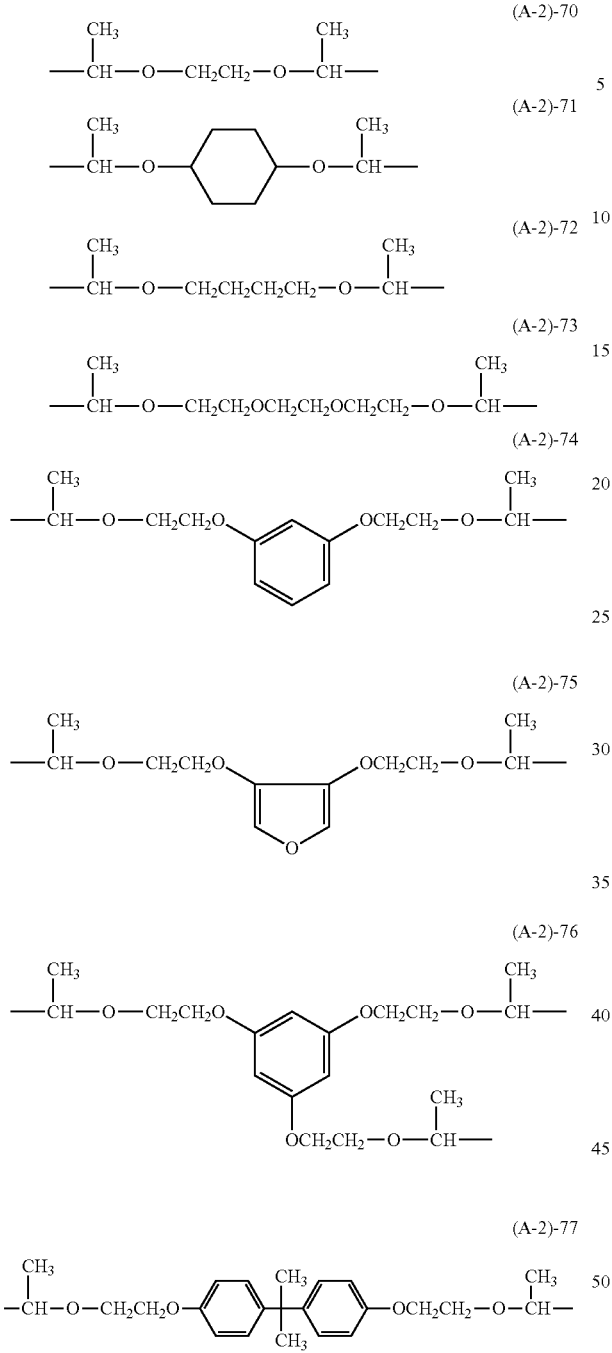

Other exemplary tertiary alkyl groups include those of the following formulae (A-3)-1 to (A-3)-18.

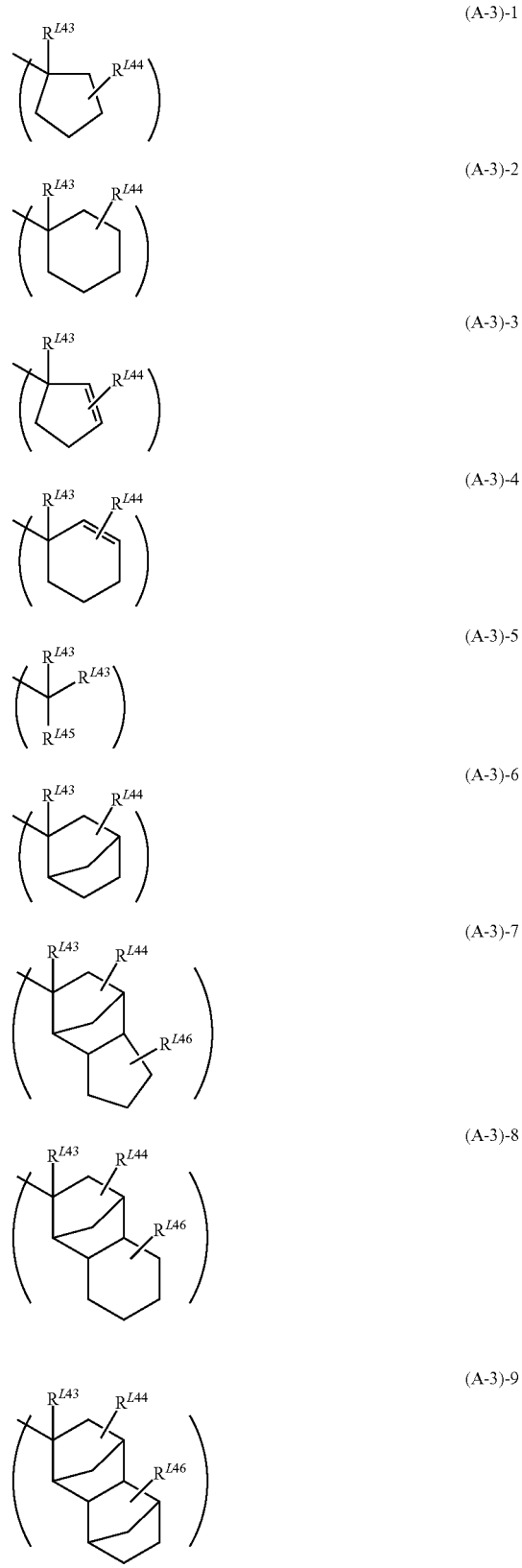

In formula (A-3), $R^{L34}$, $R^{L35}$ and $R^{L36}$ each are a monovalent hydrocarbon group, typically a straight, branched or cyclic $C_1$-$C_{20}$ alkyl group or straight, branched or cyclic $C_2$-$C_{20}$ alkenyl group, which may contain a heteroatom such as oxygen, sulfur, nitrogen or fluorine. A pair of $R^{L34}$ and $R^{L35}$, $R^{L34}$ and $R^{L36}$, or $R^{L35}$ and $R^{L36}$ may bond together to form a $C_3$-$C_{20}$ aliphatic ring with the carbon atom to which they are attached.

Exemplary tertiary alkyl groups of formula (A-3) include tert-butyl, triethylcarbyl, 1-ethylnorbornyl, 1-methylcyclohexyl, 1-ethylcyclopentyl, 2-(2-methyl)adamantyl, 2-(2-ethyl)adamantyl, and tert-amyl.

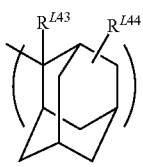
(A-3)-10

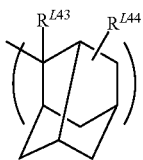
(A-3)-11

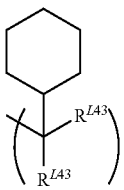
(A-3)-12

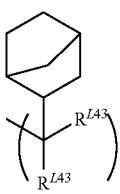
(A-3)-13

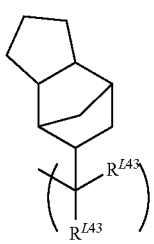
(A-3)-14

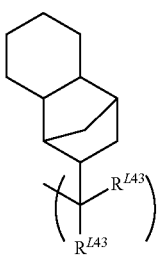
(A-3)-15

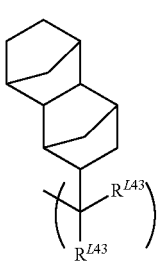
(A-3)-16

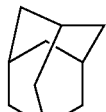
(A-3)-17

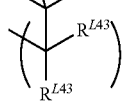

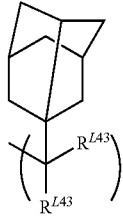
(A-3)-18

Herein $R^{L43}$ is each independently a straight, branched or cyclic $C_1$-$C_8$ alkyl group or $C_6$-$C_{20}$ aryl group, typically phenyl, $R^{L44}$ and $R^{L46}$ each are hydrogen or a straight, branched or cyclic $C_1$-$C_{20}$ alkyl group, and $R^{L45}$ is a $C_6$-$C_{20}$ aryl group, typically phenyl.

The polymer may be crosslinked within the molecule or between molecules with groups having $R^{L47}$ which is a di- or multi-valent alkylene or arylene group, as shown by the following formulae (A-3)-19 and (A-3)-20.

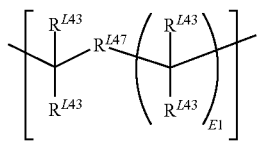
(A-3)-19

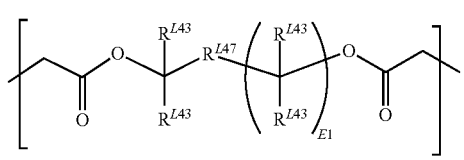
(A-3)-20

Herein $R^{L43}$ is as defined above, $R^{L47}$ is a straight, branched or cyclic $C_1$-$C_{20}$ alkylene group or arylene group, typically phenylene, which may contain a heteroatom such as oxygen, sulfur or nitrogen, and E1 is an integer of 1 to 3.

Of recurring units having acid labile groups of formula (A-3), recurring units of (meth)acrylate having an exo-form structure represented by the formula (A-3)-21 are preferred.

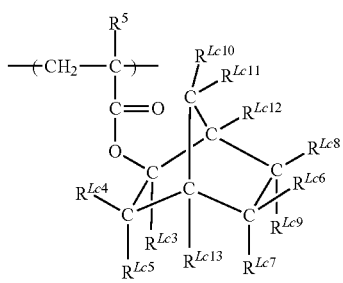
(A-3)-21

Herein, $R^5$ is hydrogen or methyl; $R^{Lc3}$ is a straight, branched or cyclic $C_1$-$C_8$ alkyl group or an optionally substituted $C_6$-$C_{20}$ aryl group; $R^{Lc4}$ to $R^{Lc9}$, $R^{Lc12}$ and $R^{Lc13}$ are each independently hydrogen or a monovalent $C_1$-$C_{15}$ hydrocarbon group which may contain a heteroatom; and $R^{Lc10}$ and $R^{Lc11}$ are hydrogen or a monovalent $C_1$-$C_{15}$ hydrocarbon group which may contain a heteroatom. Alternatively, a pair of $R^{Lc4}$ and $R^{Lc5}$, $R^{Lc6}$ and $R^{Lc8}$, $R^{Lc6}$ and $R^{Lc9}$, $R^{Lc7}$ and $R^{Lc9}$, $R^{Lc7}$ and $R^{Lc13}$, $R^{Lc8}$ and $R^{Lc12}$, $R^{Lc10}$ and $R^{Lc11}$, or $R^{Lc11}$ and $R^{Lc12}$, taken together, may form a ring, and in that event, each ring-forming R is a divalent $C_1$-$C_{15}$ hydrocarbon group which may contain a heteroatom. Also, a pair of $R^{Lc4}$ and $R^{Lc13}$, $R^{Lc10}$ and $R^{Lc13}$, or $R^{Lc6}$ and $R^{Lc8}$ which are attached to vicinal carbon atoms may bond together directly to form a double bond. The formula also represents an enantiomer.

The ester form monomers from which recurring units having an exo-form structure represented by formula (A-3)-21 are derived are described in U.S. Pat. No. 6,448,420 (JP-A 2000-327633). Illustrative non-limiting examples of suitable monomers are given below.

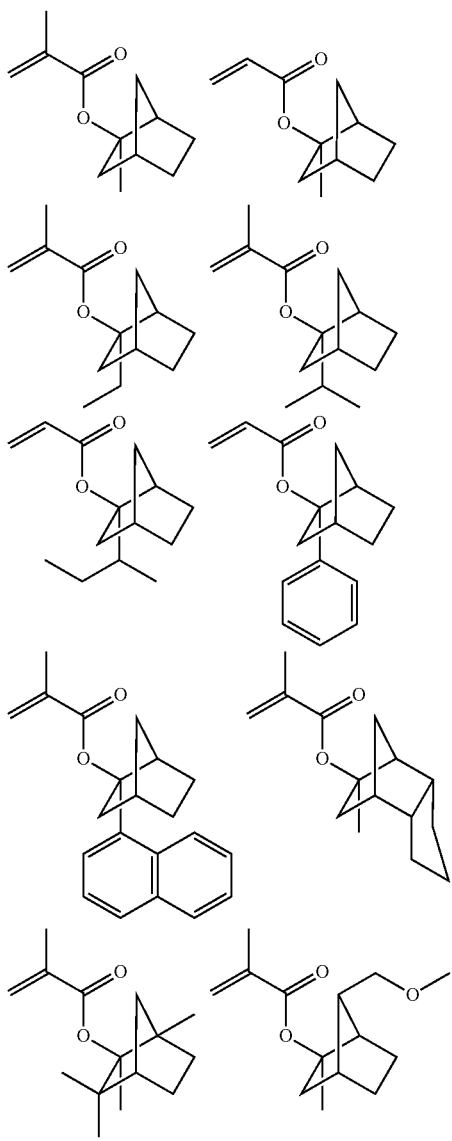

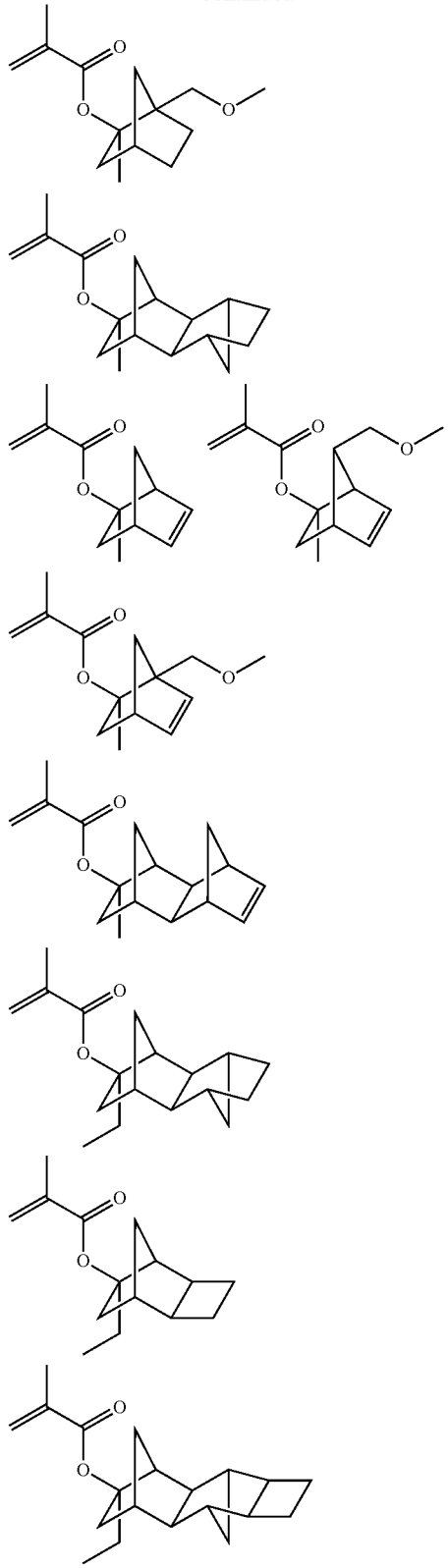

Also included in the acid labile groups of formula (A-3) are acid labile groups of (meth)acrylate having furandiyl, tetrahydrofurandiyl or oxanorbornanediyl as represented by the following formula (A-3)-22.

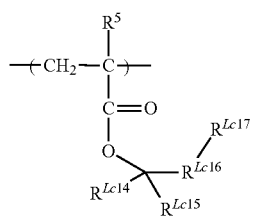
(A-3)-22

Herein, $R^5$ is as defined above; $R^{Lc14}$ and $R^{Lc15}$ are each independently a monovalent, straight, branched or cyclic $C_1$-$C_{10}$ hydrocarbon group, or $R^{Lc14}$ and $R^{Lc15}$, taken together, may form an aliphatic hydrocarbon ring with the carbon atom to which they are attached. $R^{Lc16}$ is a divalent group selected from furandiyl, tetrahydrofurandiyl and oxanorbornanediyl. $R^{Lc17}$ is hydrogen or a monovalent, straight, branched or cyclic $C_1$-$C_{10}$ hydrocarbon group which may contain a heteroatom.

Examples of the monomers from which the recurring units substituted with acid labile groups having furandiyl, tetrahydrofurandiyl and oxanorbornanediyl are derived are shown below. Note that Me is methyl and Ac is acetyl.

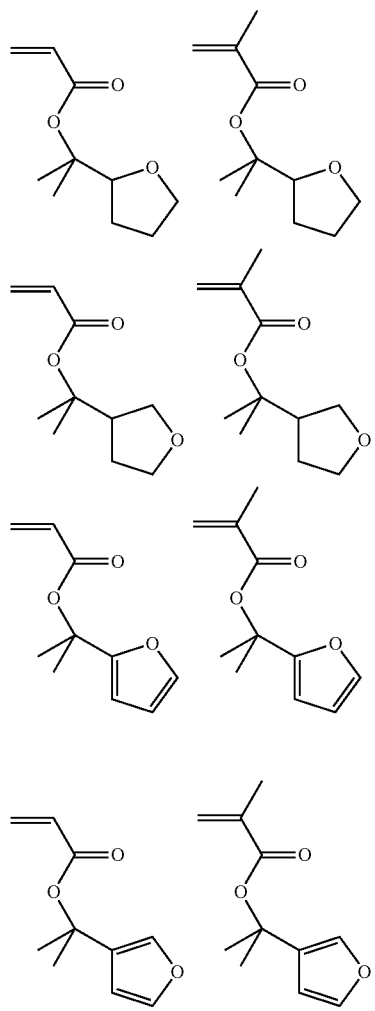

-continued

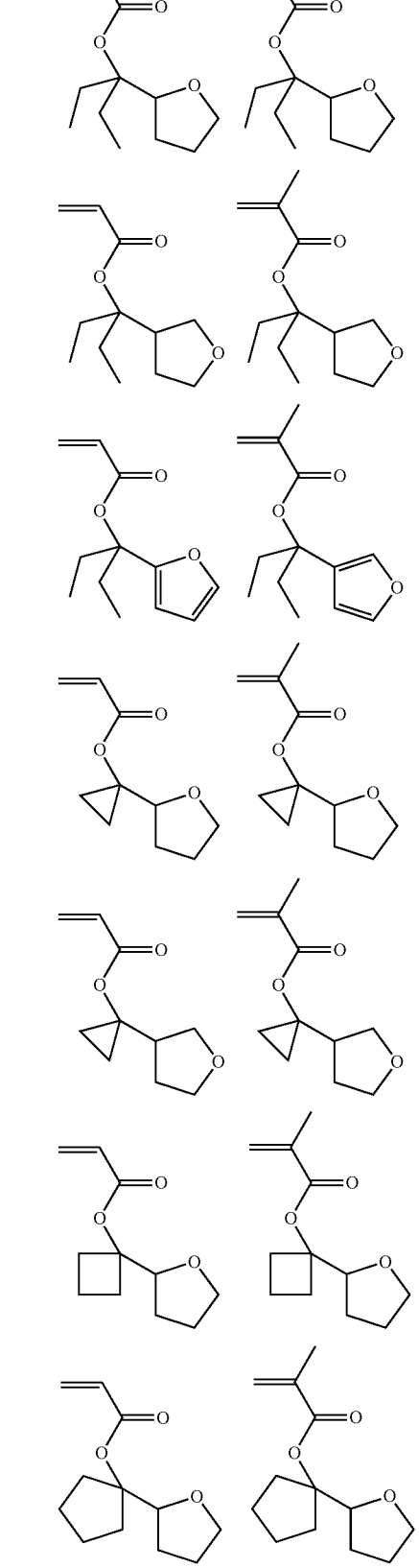

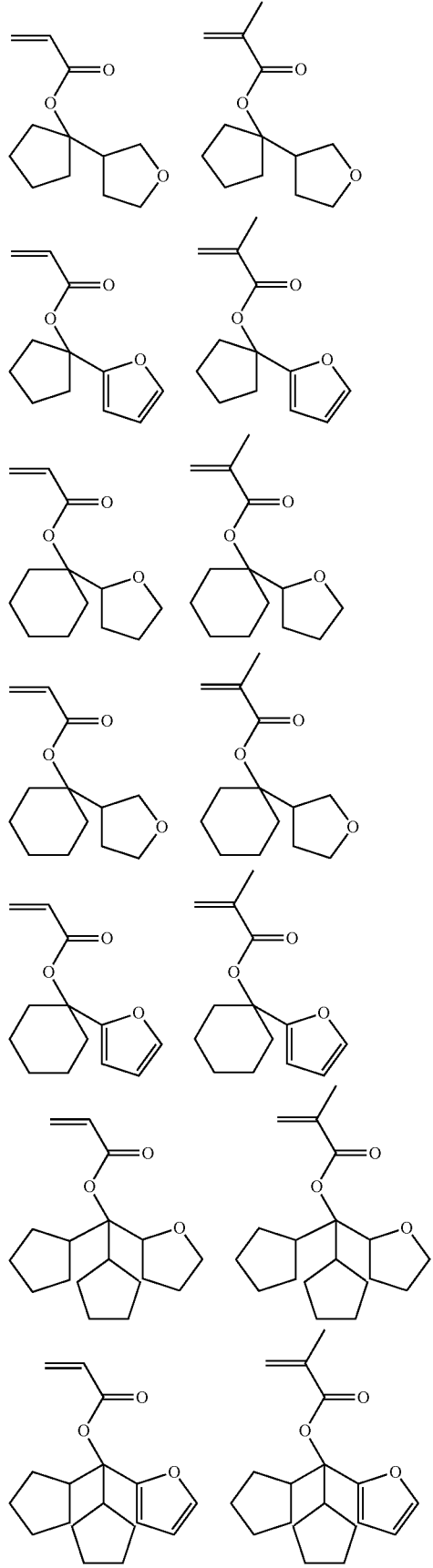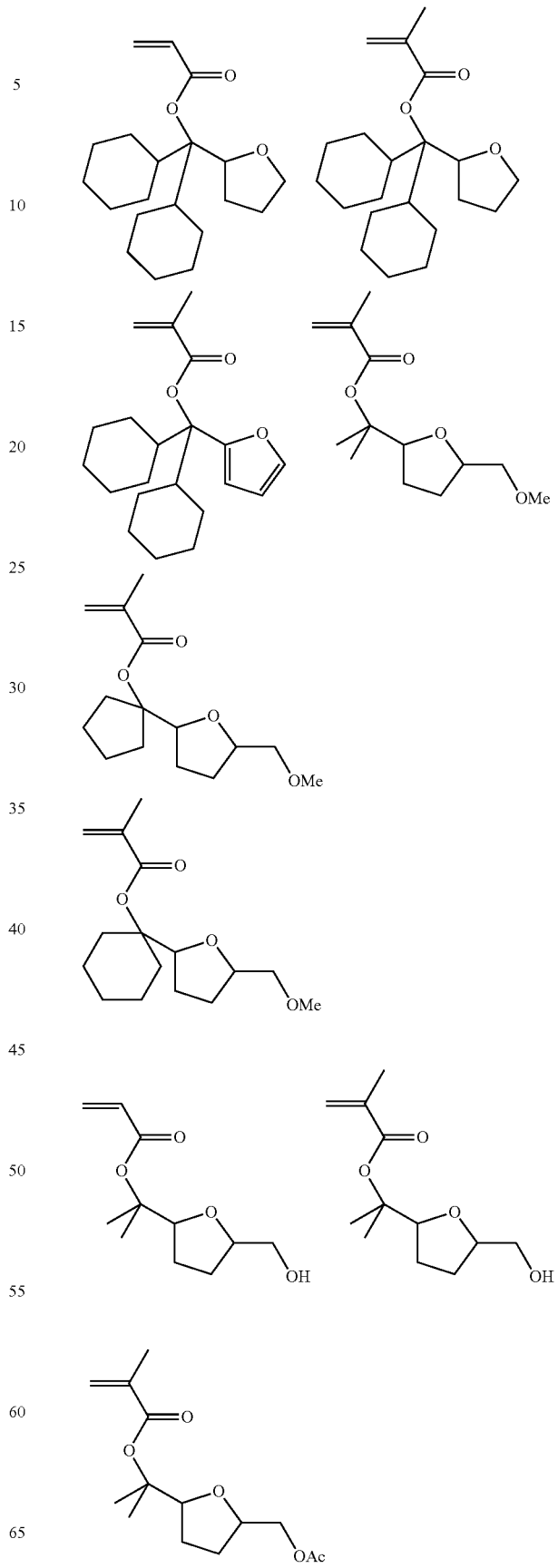

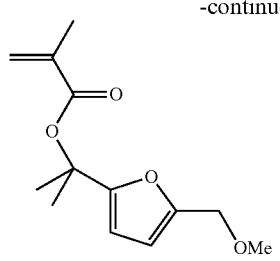
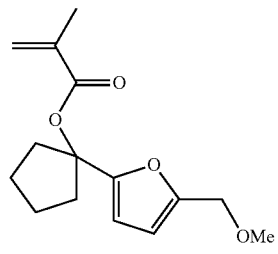
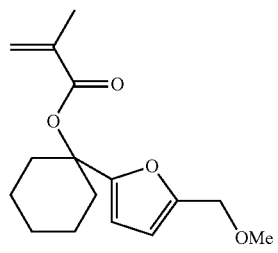
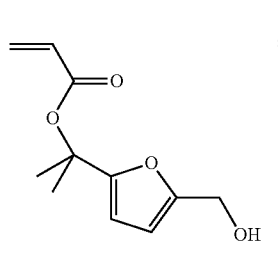
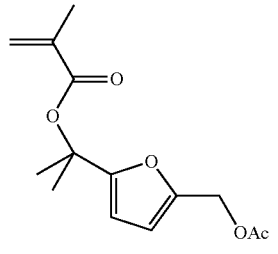
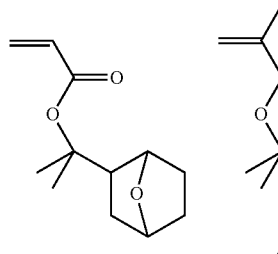
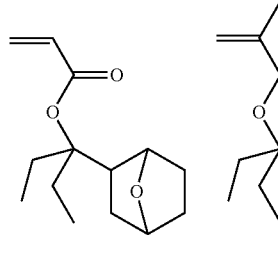
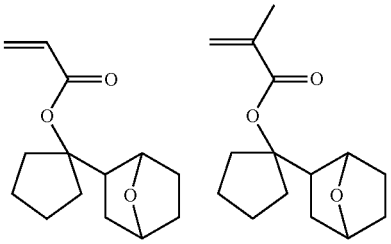
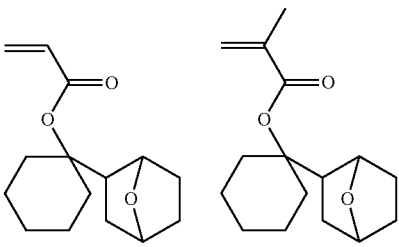
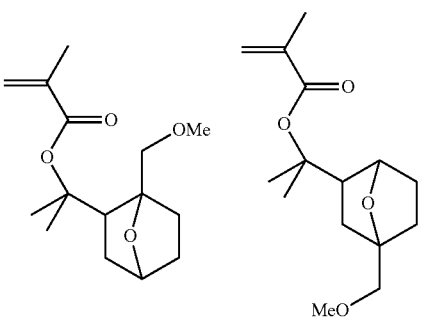
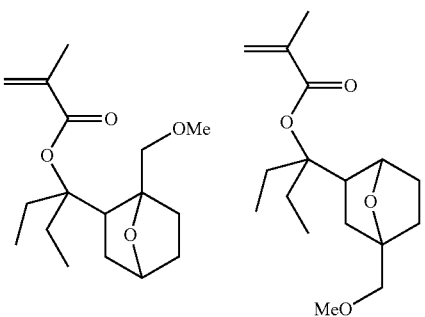
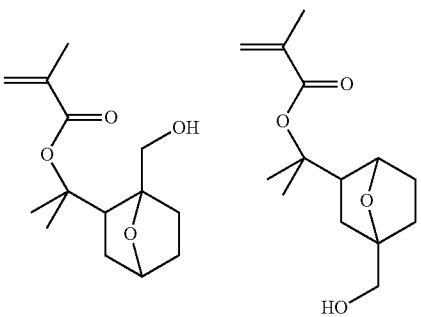

-continued

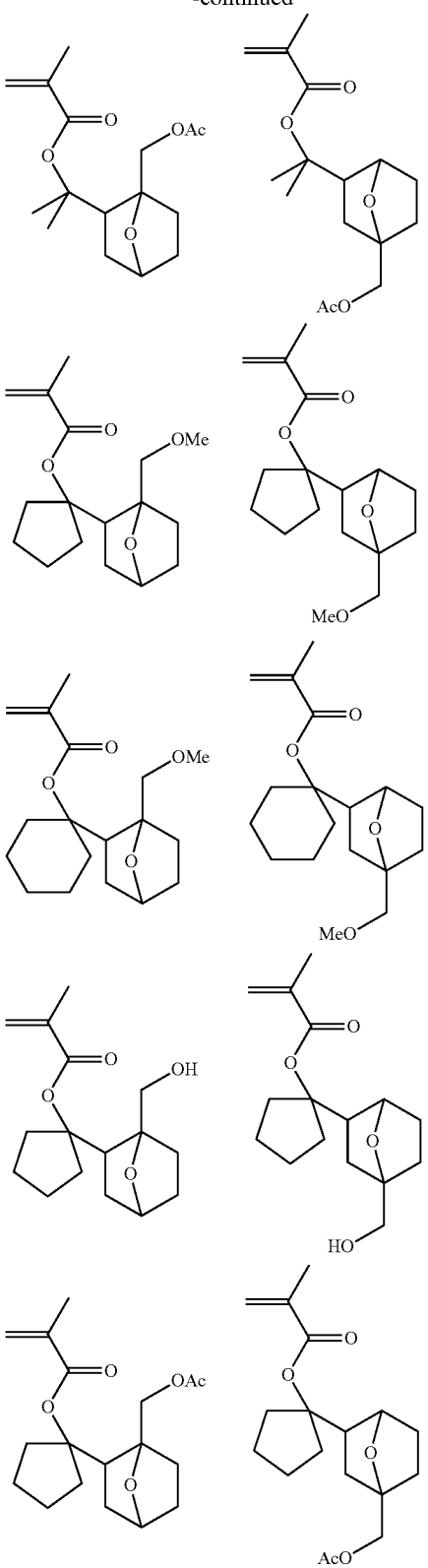

In the recurring unit B1, the hydrogen atom of the carboxyl group may be substituted by an acid labile group having the general formula (A-3)-23.

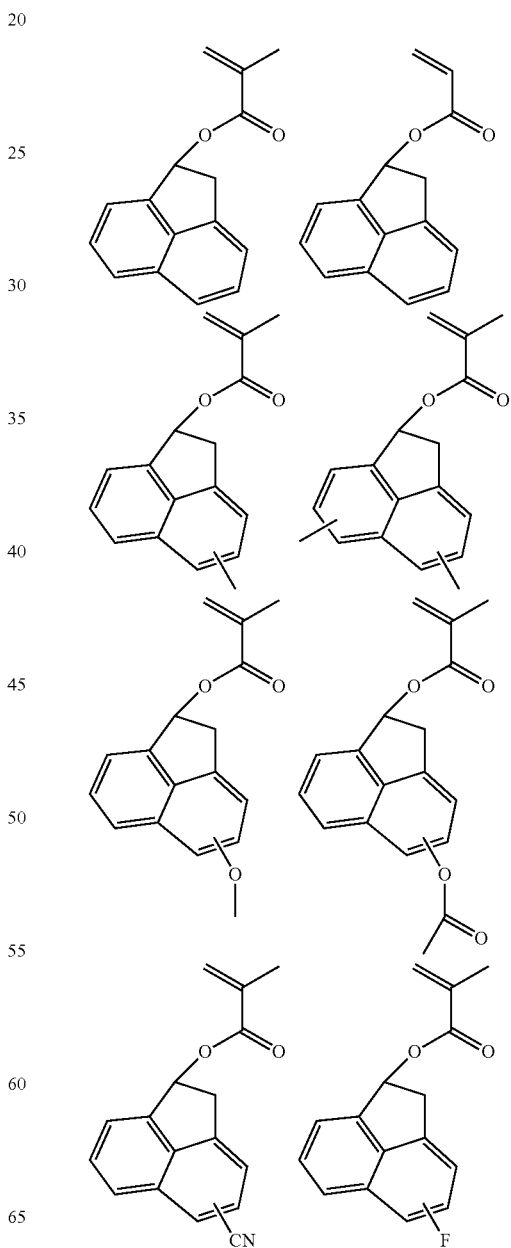

Herein $R^{23-1}$ is hydrogen, $C_1$-$C_4$ alkyl, alkoxy, alkanoyl, alkoxycarbonyl, $C_6$-$C_{10}$ aryl, halogen, or cyano group, and m23 is an integer of 1 to 4.

Examples of the monomer having a carboxyl group substituted with an acid labile group of formula (A-3)-23 are given below.

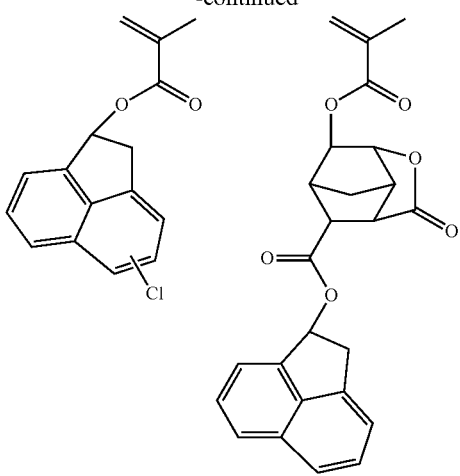
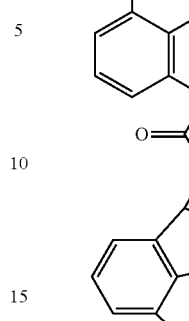
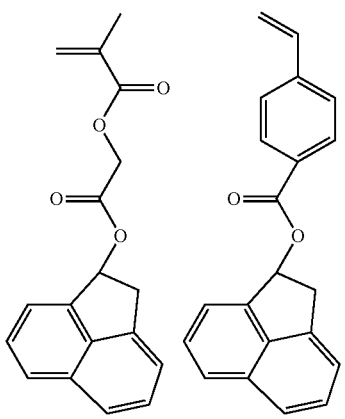
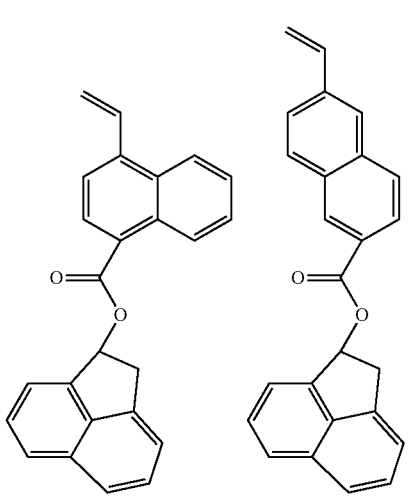

In the recurring unit B1, the hydrogen atom of the carboxyl group may be substituted by an acid labile group having the general formula (A-3)-24.

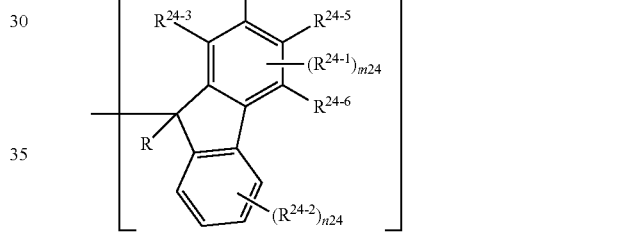

(A-3)-24

Herein $R^{24-1}$ and $R^{24-2}$ each are hydrogen, $C_1$-$C_4$ alkyl, alkoxy, alkanoyl, alkoxycarbonyl, hydroxyl, $C_6$-$C_{10}$ aryl, halogen, or cyano group; R is hydrogen, a straight, branched or cyclic $C_1$-$C_{12}$ alkyl group which may contain an oxygen or sulfur atom, $C_2$-$C_{12}$ alkenyl, $C_2$-$C_{12}$ alkynyl, or $C_6$-$C_{10}$ aryl group; $R^{24-3}$, $R^{24-4}$, $R^{24-5}$, and $R^{24-6}$ each are hydrogen, or a pair of $R^{24-3}$ and $R^{24-4}$, $R^{24-4}$ and $R^{24-5}$, or $R^{24-5}$ and $R^{24-6}$ may bond together to form a benzene ring; m24 and n24 each are an integer of 1 to 4.

Examples of the monomer having a carboxyl group substituted with an acid labile group of formula (A-3)-24 are given below.

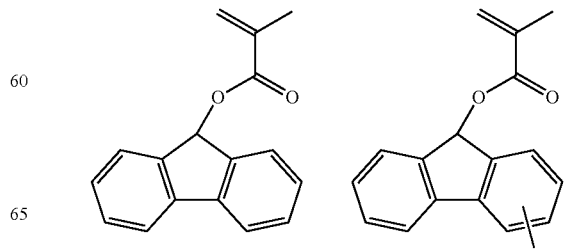

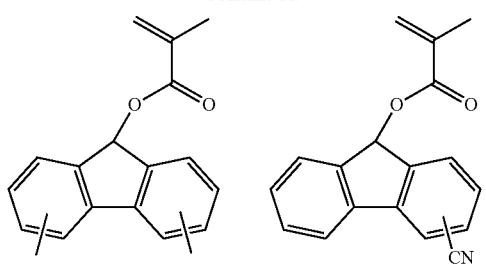
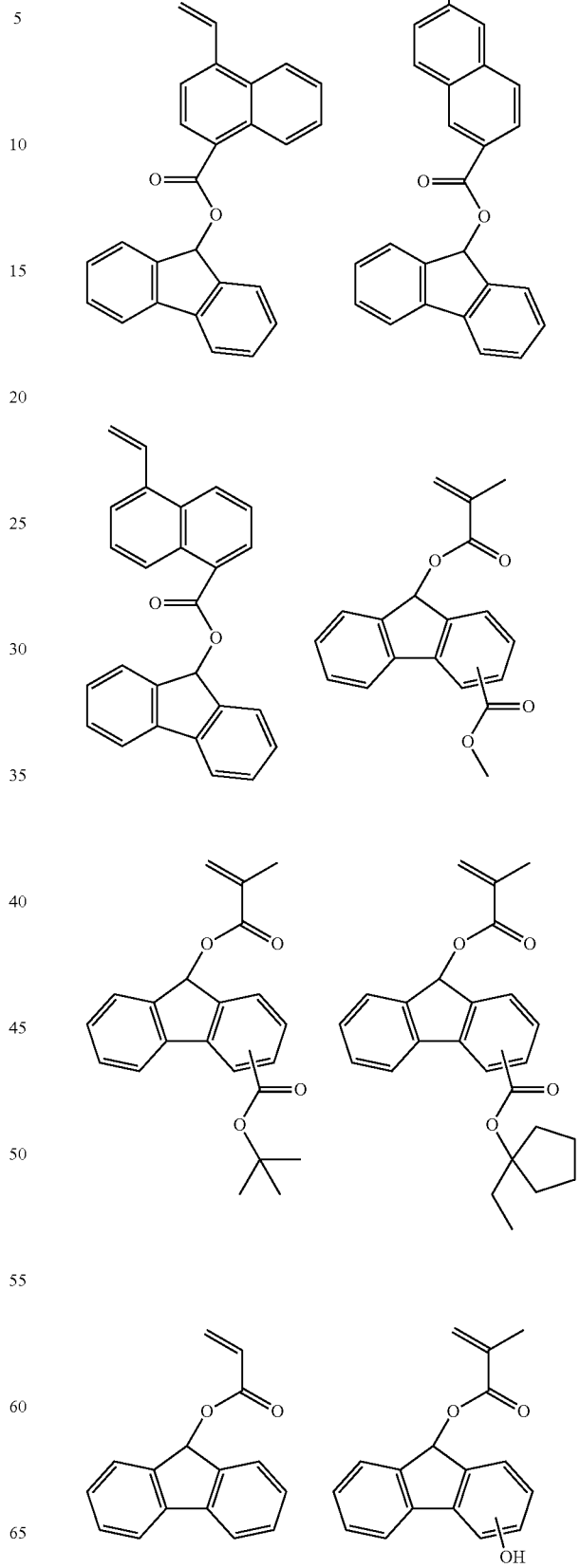

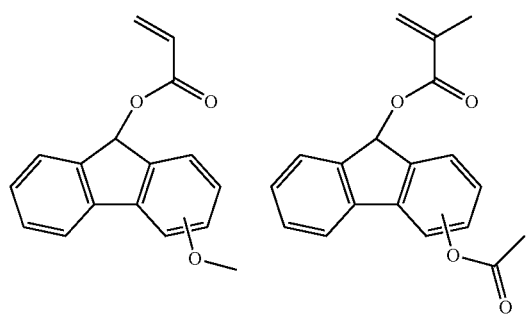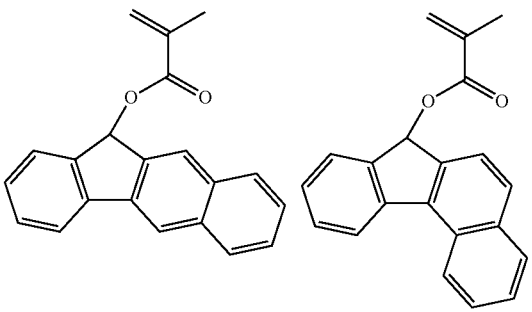

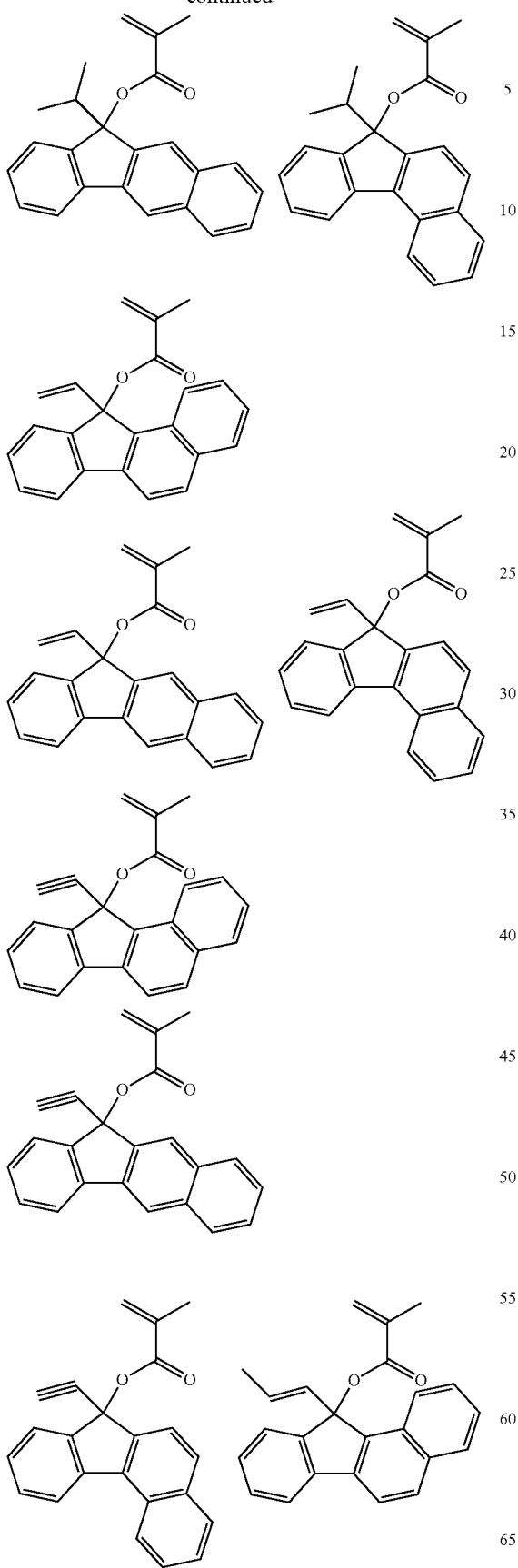
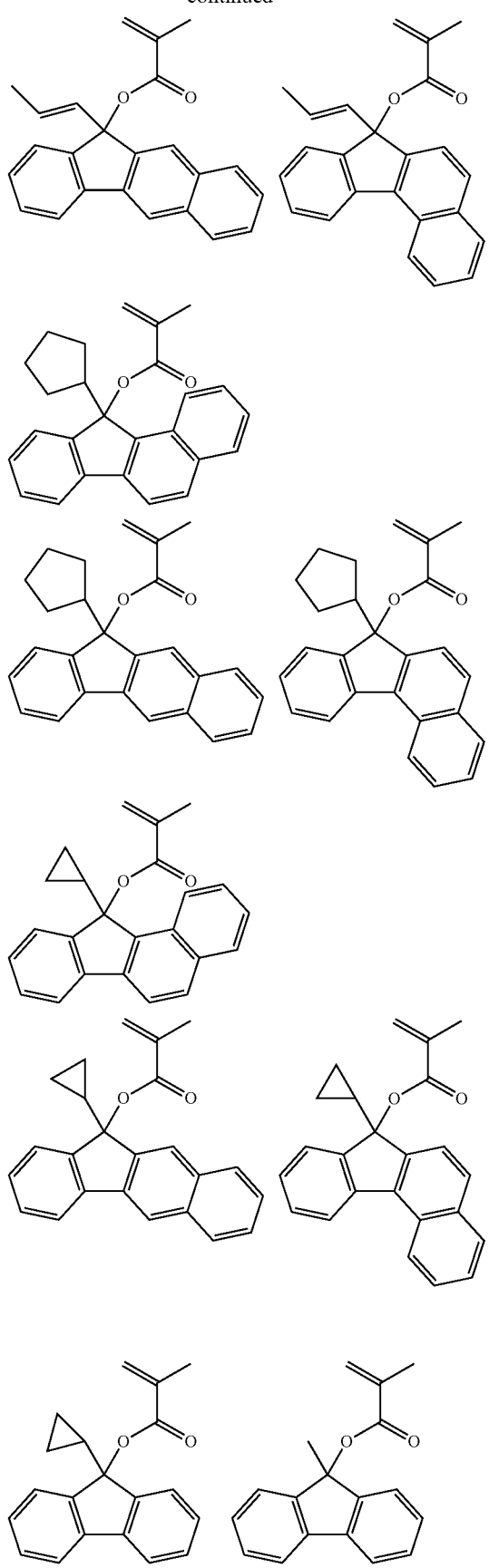

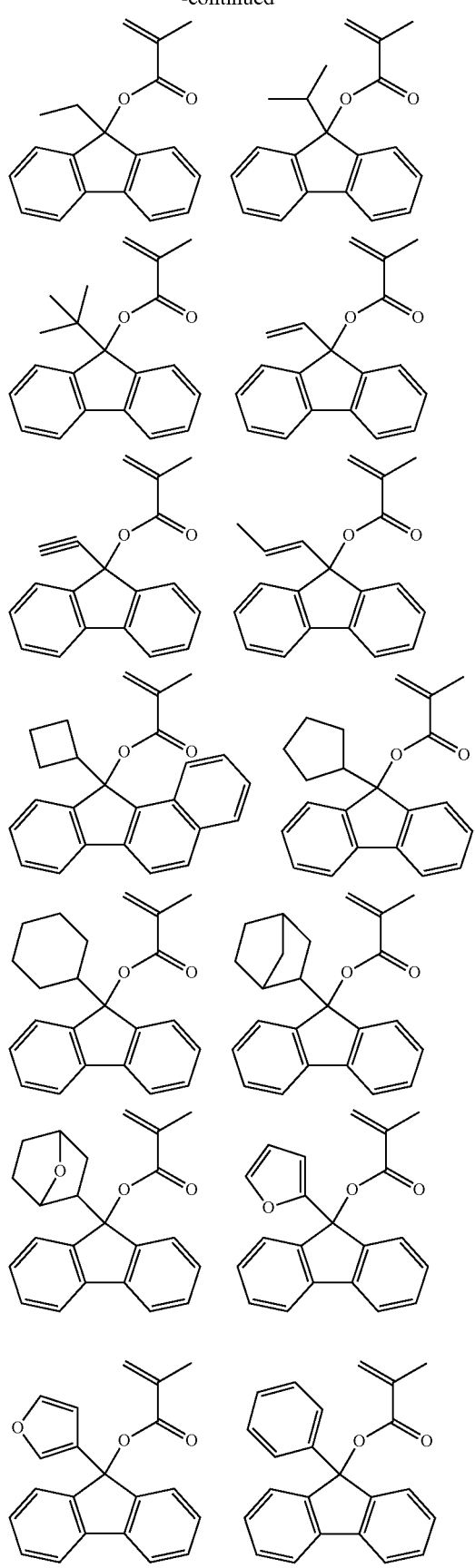
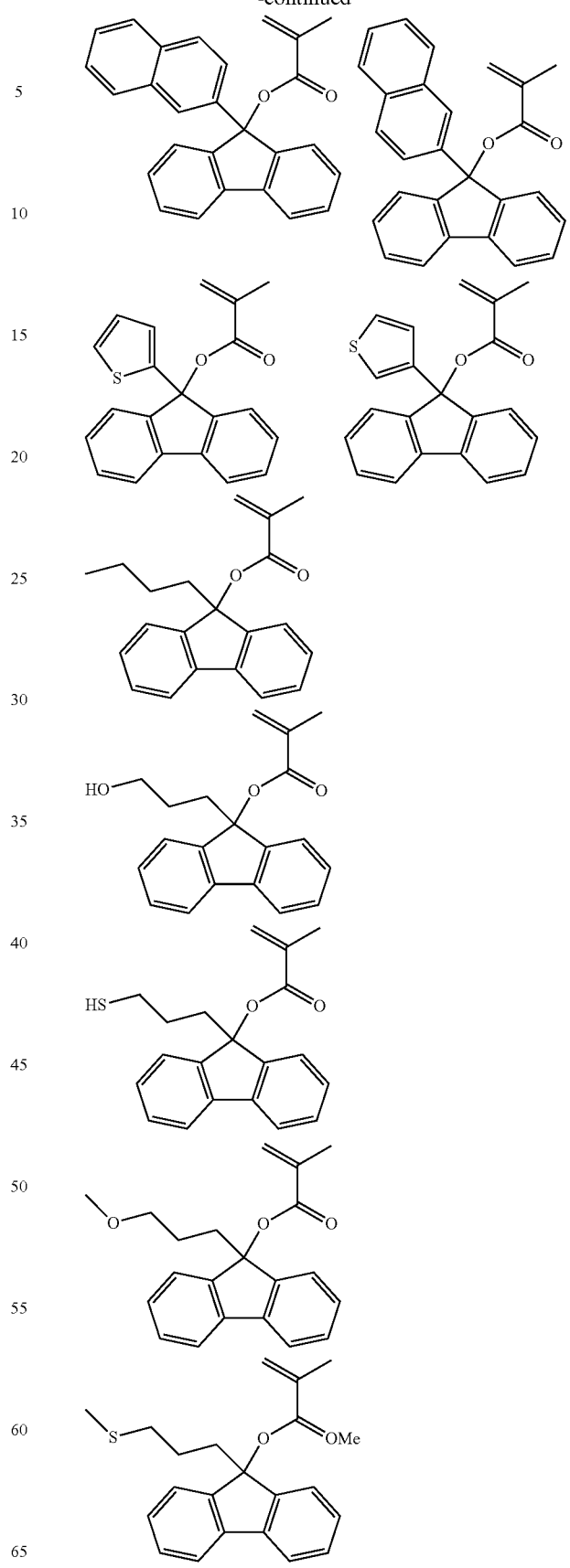

In the recurring unit B1, the hydrogen atom of the carboxyl group may be substituted by an acid labile group having the general formula (A-3)-25.

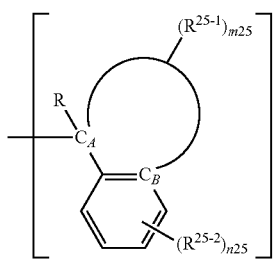

(A-3)-25

Herein $R^{25-1}$ is each independently hydrogen or a straight, branched or cyclic $C_1$-$C_6$ alkyl group, and in case m25 is 2 or more, $R^{25-1}$ may bond together to form a non-aromatic ring of 2 to 8 carbon atoms; the circle denotes a link between carbons $C_A$ and $C_B$, selected from among ethylene, propylene, butylene and pentylene; $R^{25-1}$ is not hydrogen when the circle denotes ethylene or propylene; $R^{25-2}$ is $C_1$-$C_4$ alkyl, alkoxy, alkanoyl, alkoxycarbonyl, hydroxyl, nitro, $C_6$-$C_{10}$ aryl, halogen, or cyano group; R is as defined above; m25 and n25 each are an integer of 1 to 4.

Examples of the monomer having a carboxyl group substituted with an acid labile group of formula (A-3)-25 are given below.

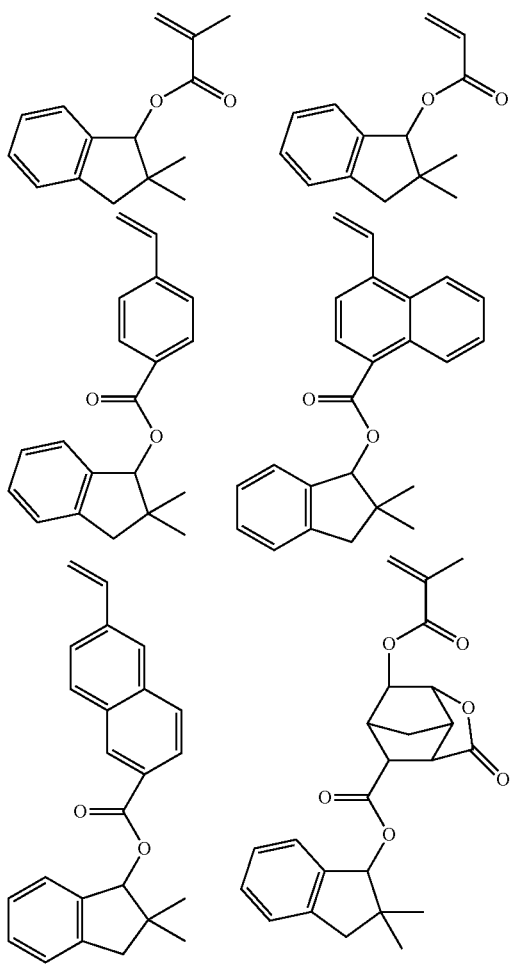

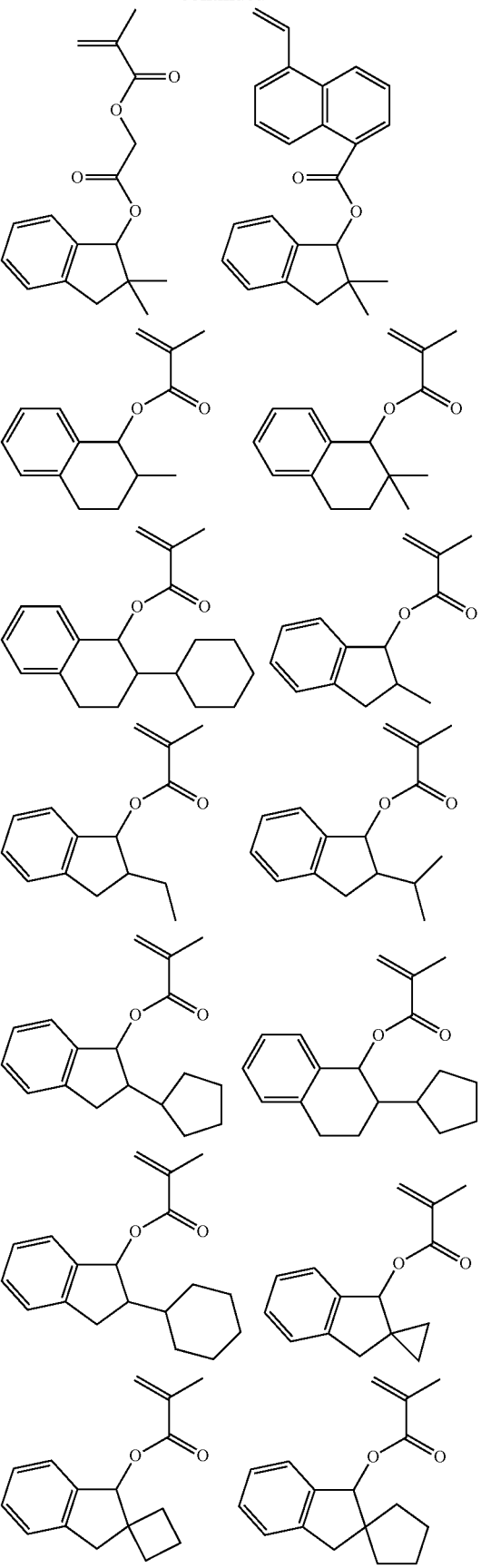

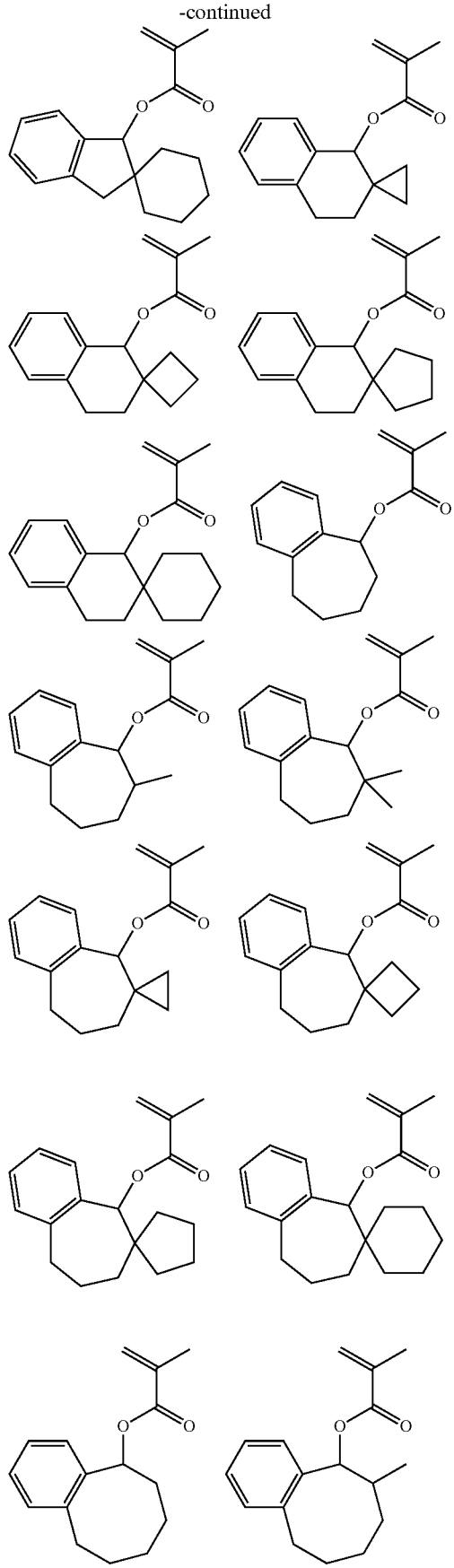
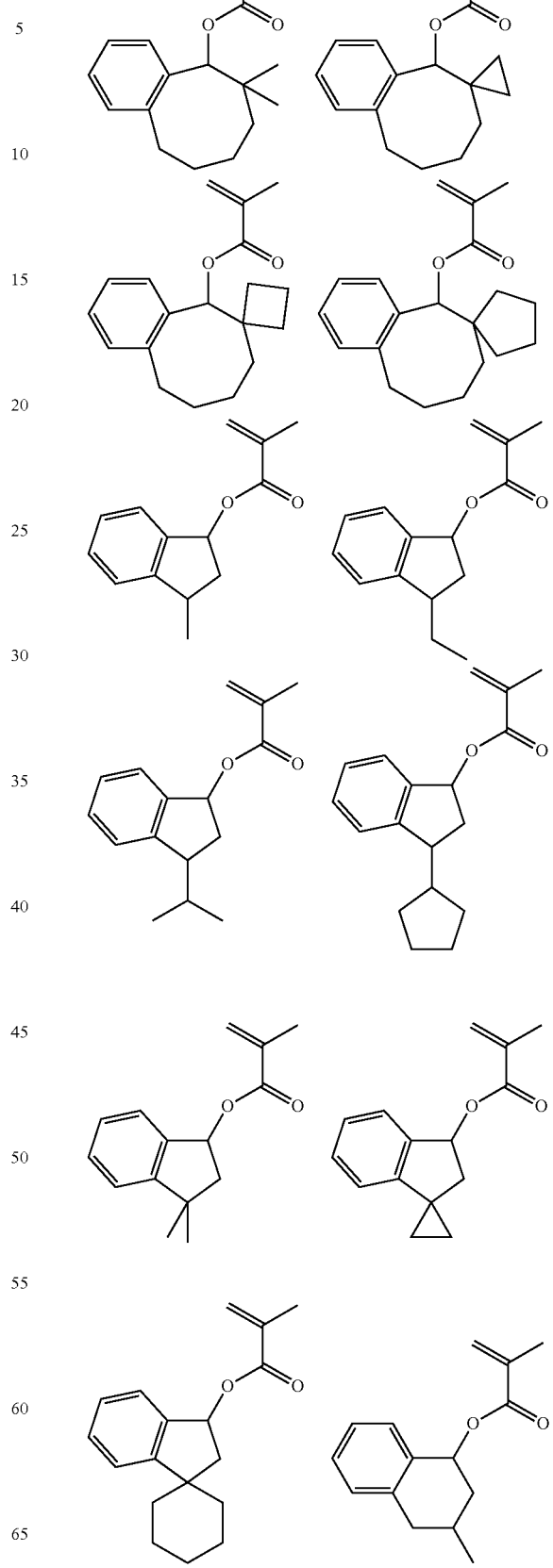

55
-continued
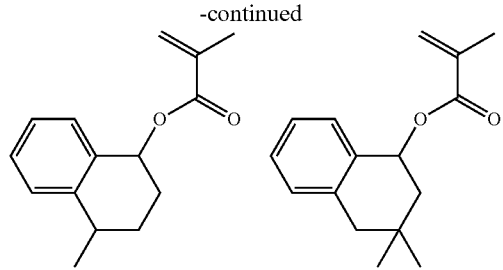
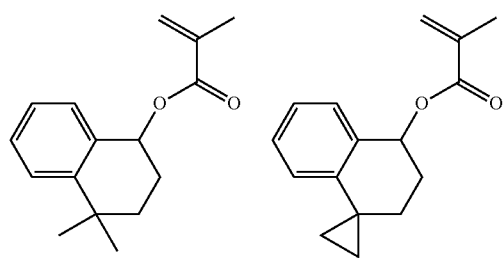
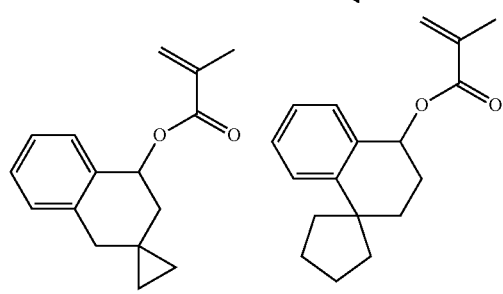
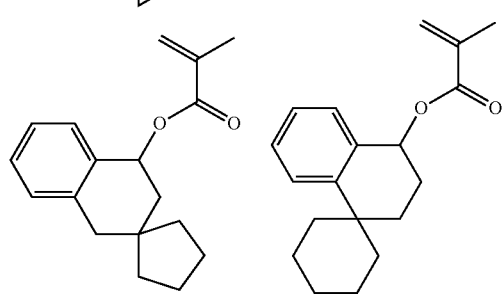
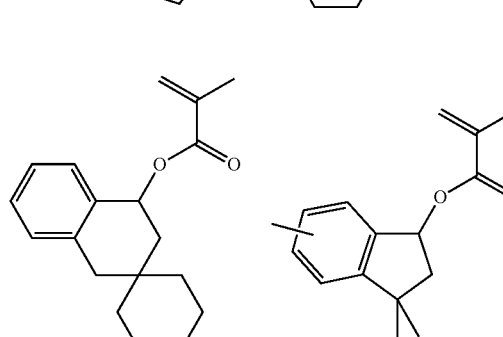
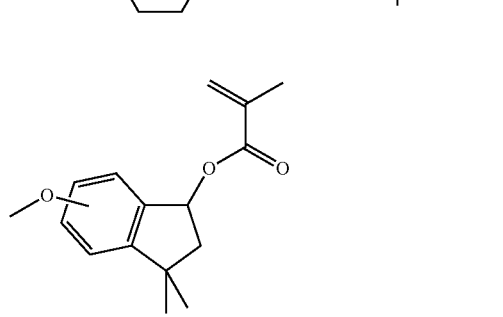
56
-continued
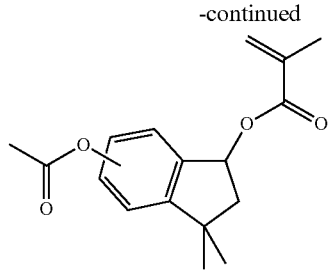
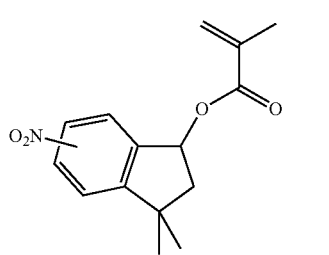
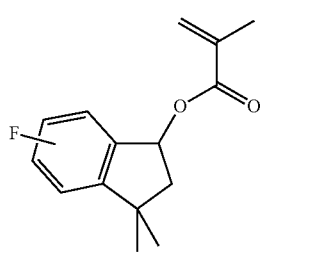
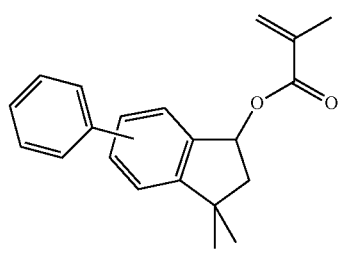
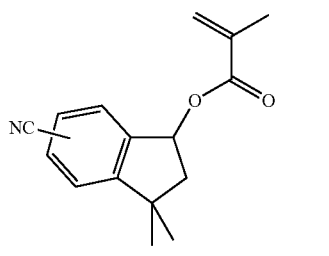
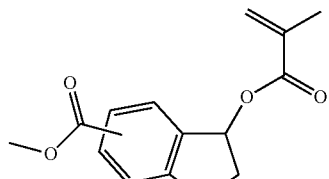
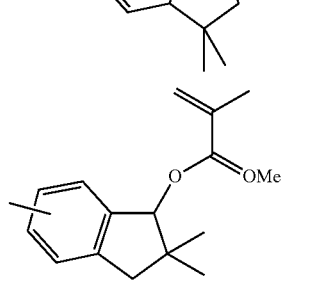

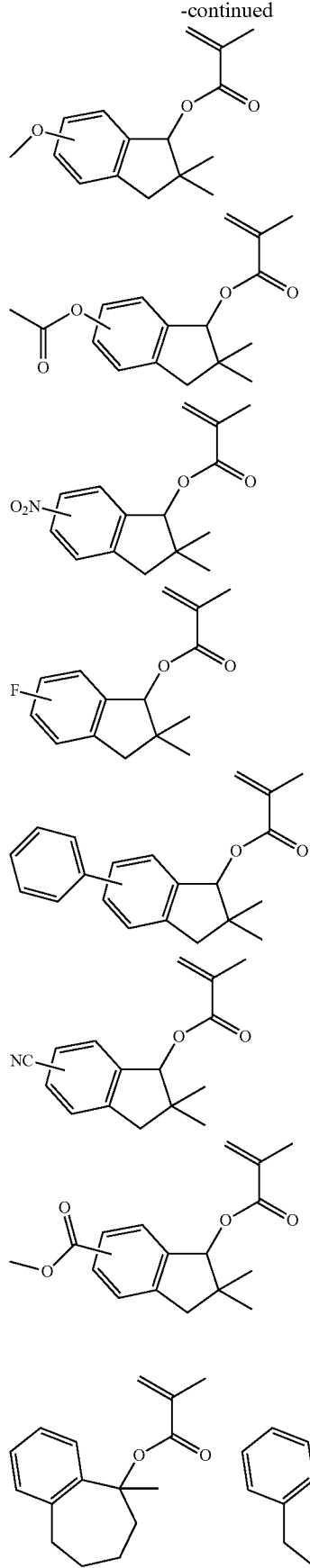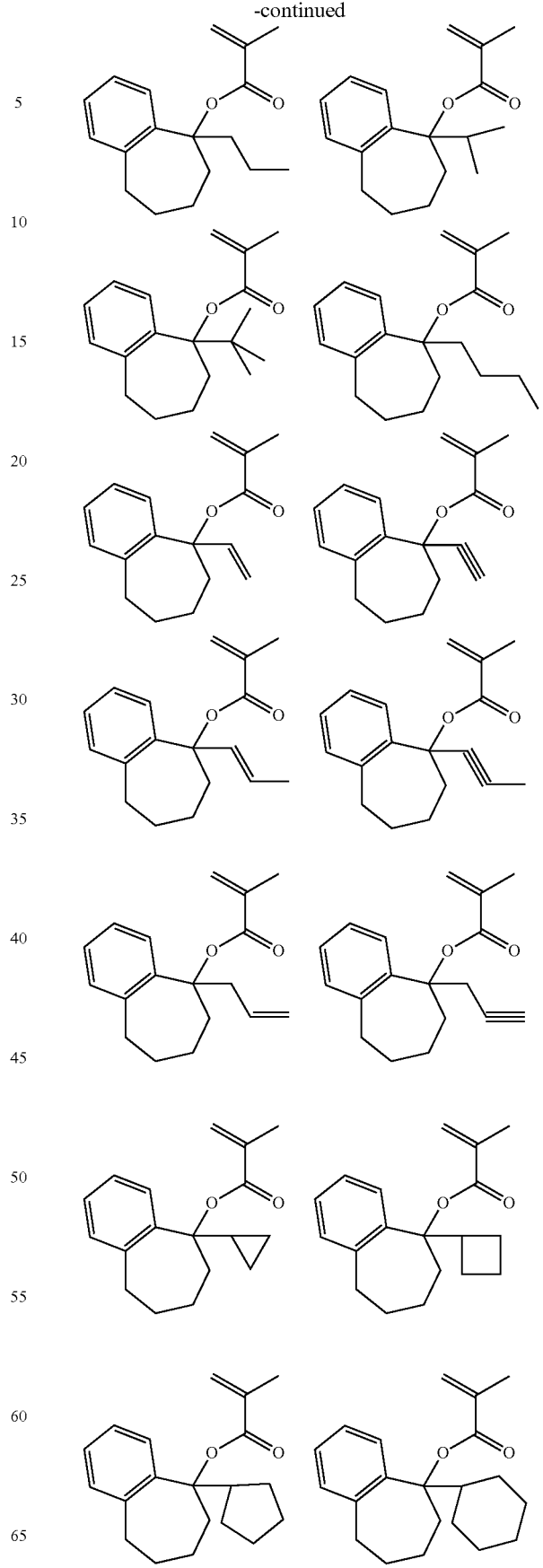

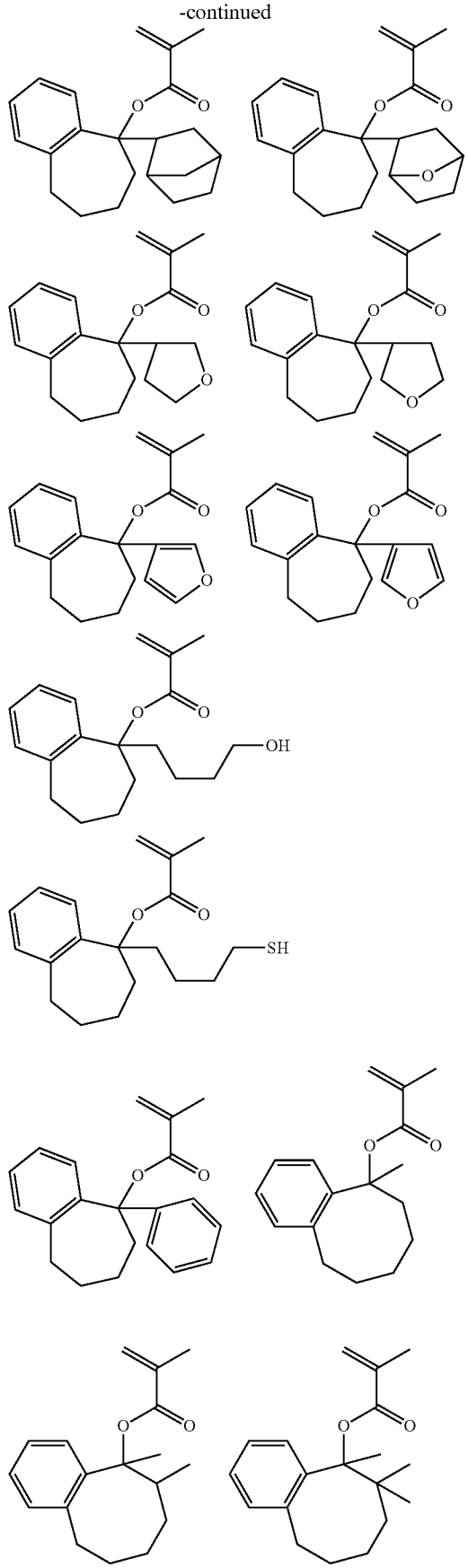
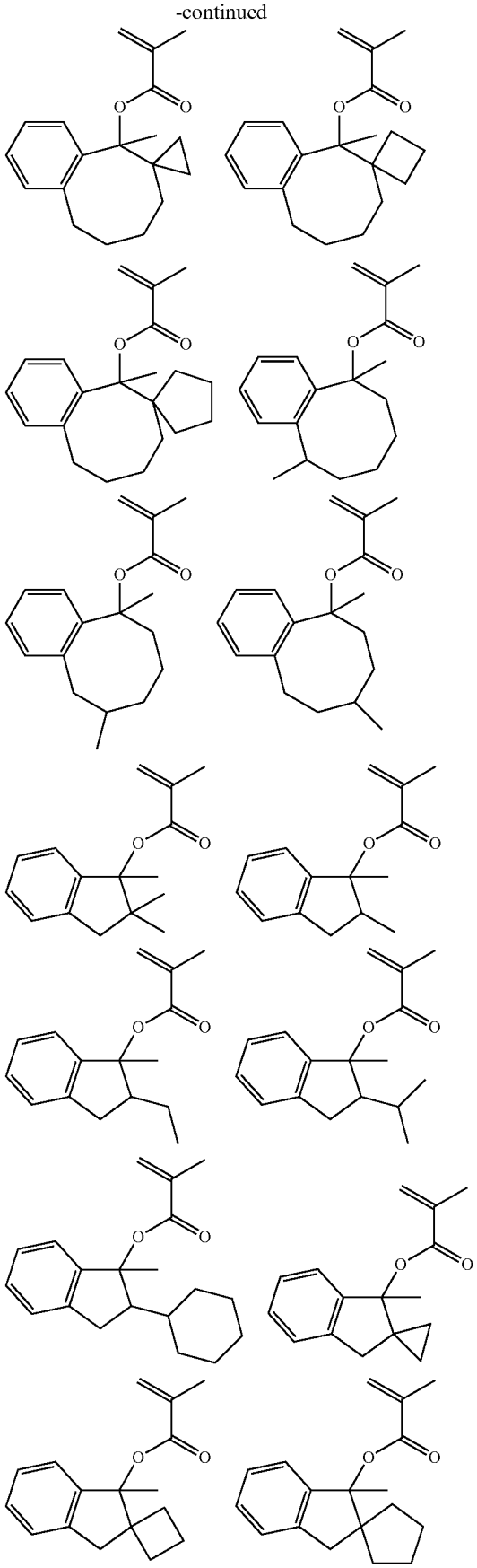

61
-continued
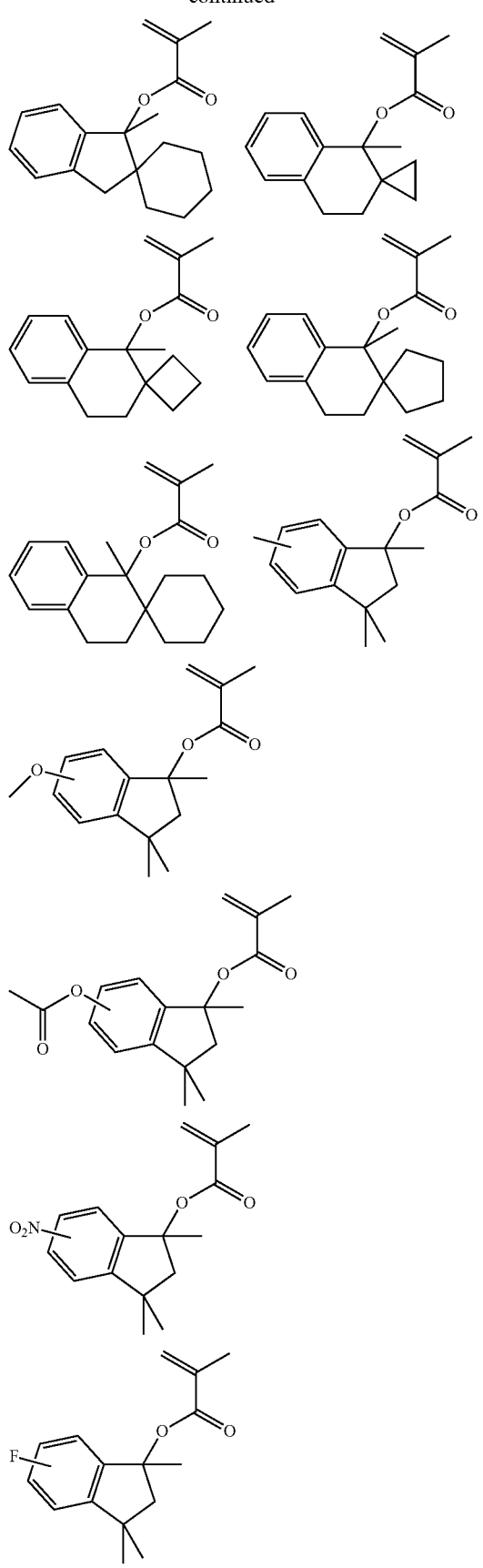
62
-continued
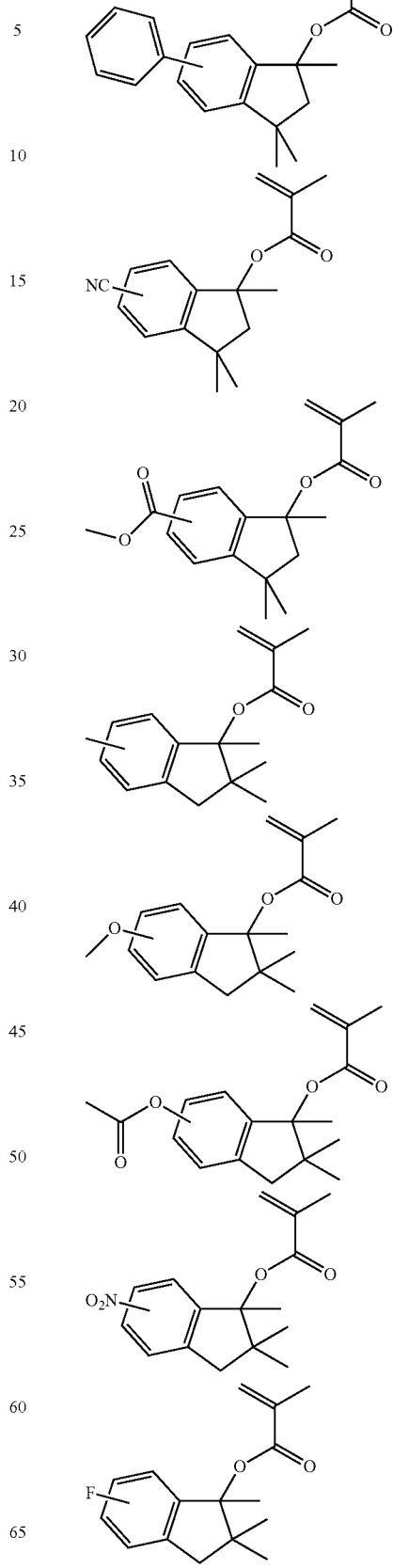

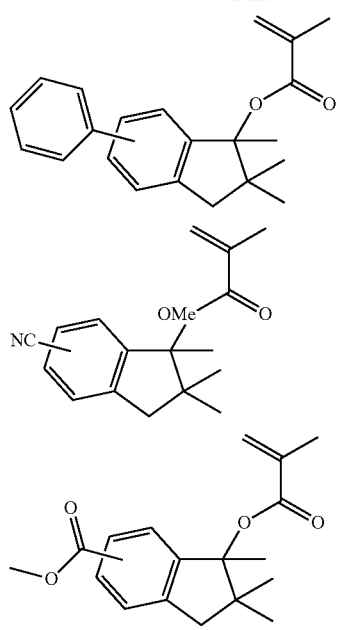

In the recurring unit B1, the hydrogen atom of the carboxyl group may be substituted by an acid labile group having the general formula (A-3)-26.

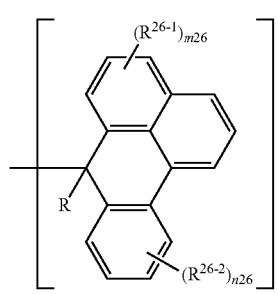

(A-3)-26

Herein $R^{26-1}$ and $R^{26-2}$ each are hydrogen, $C_1$-$C_4$ alkyl, alkoxy, alkanoyl, alkoxycarbonyl, hydroxyl, nitro, $C_6$-$C_{10}$ aryl, halogen, or cyano group; R is as defined above; and m26 and n26 each are an integer of 1 to 4.

Examples of the monomer having a carboxyl group substituted with an acid labile group of formula (A-3)-26 are given below.

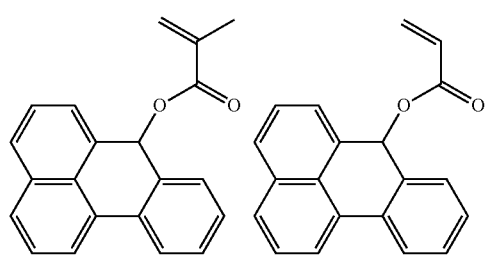

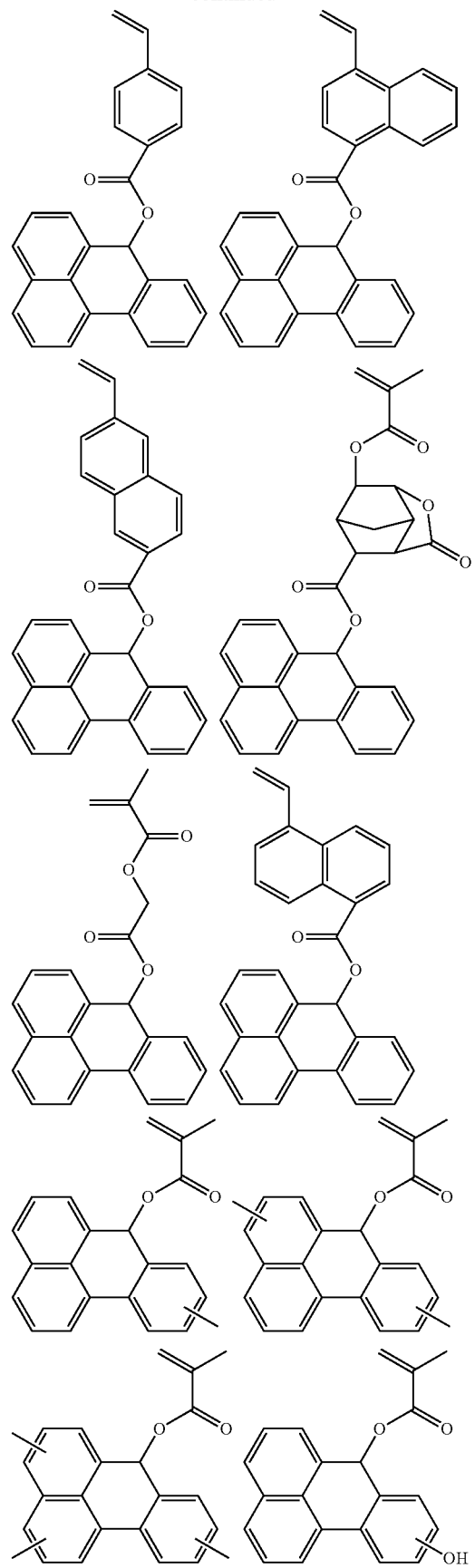

-continued
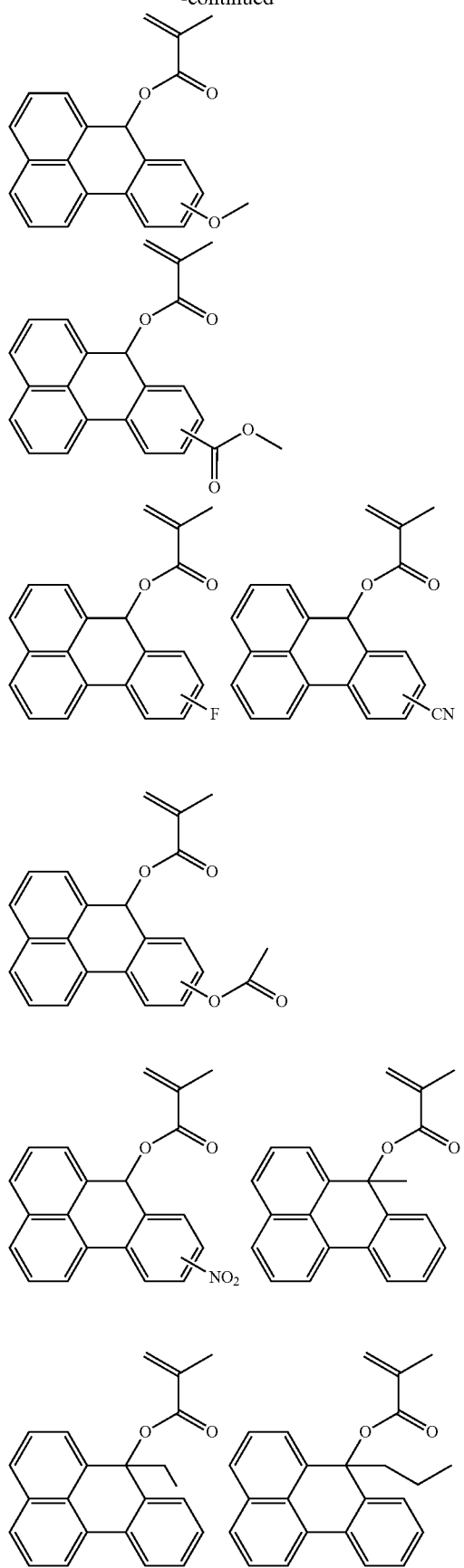
-continued
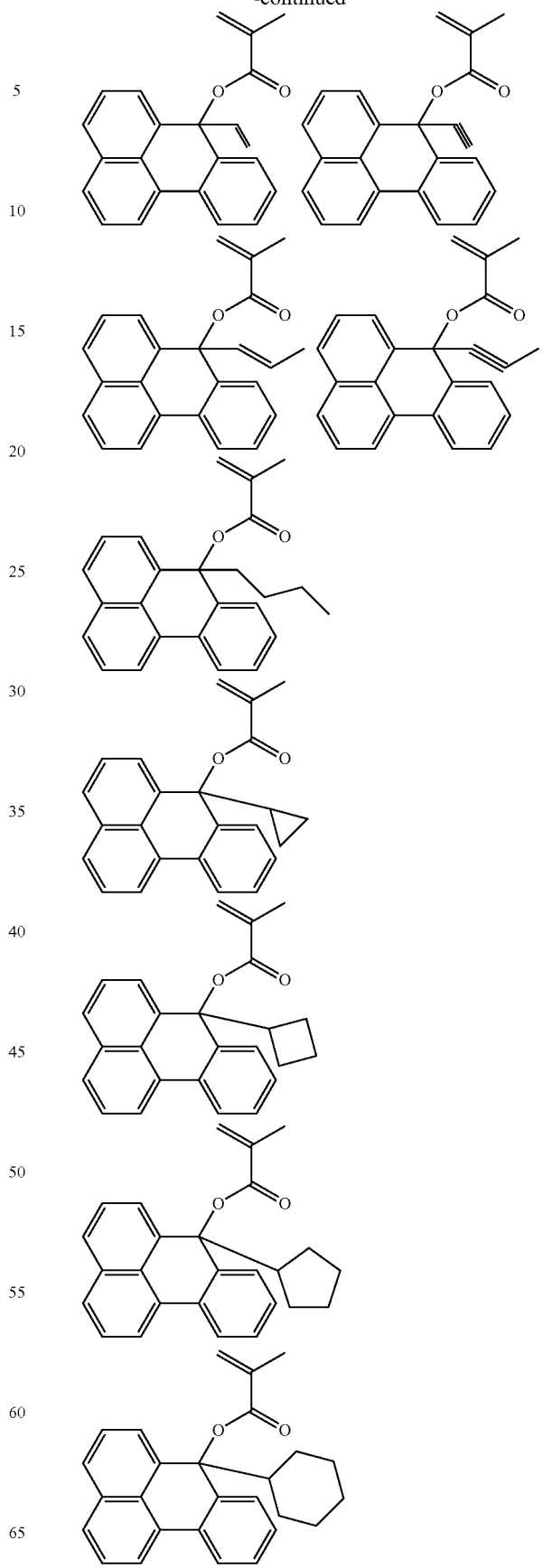

67
-continued
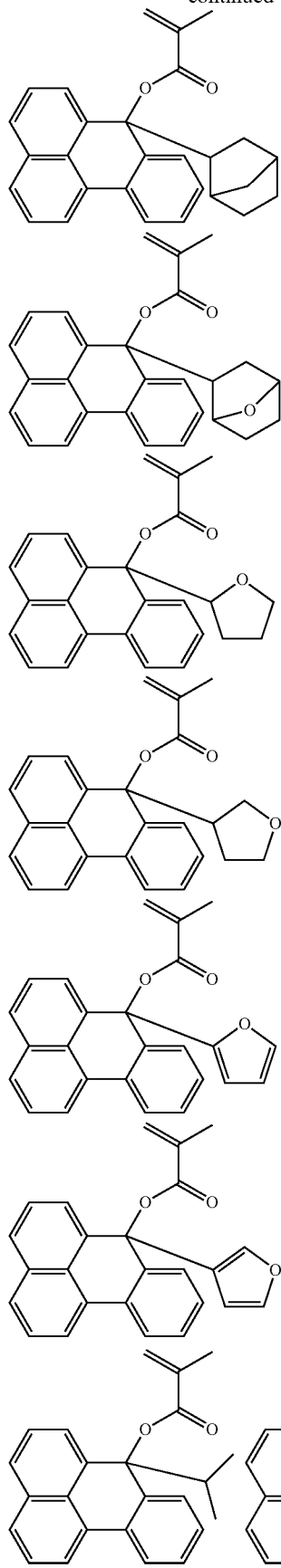
68
-continued
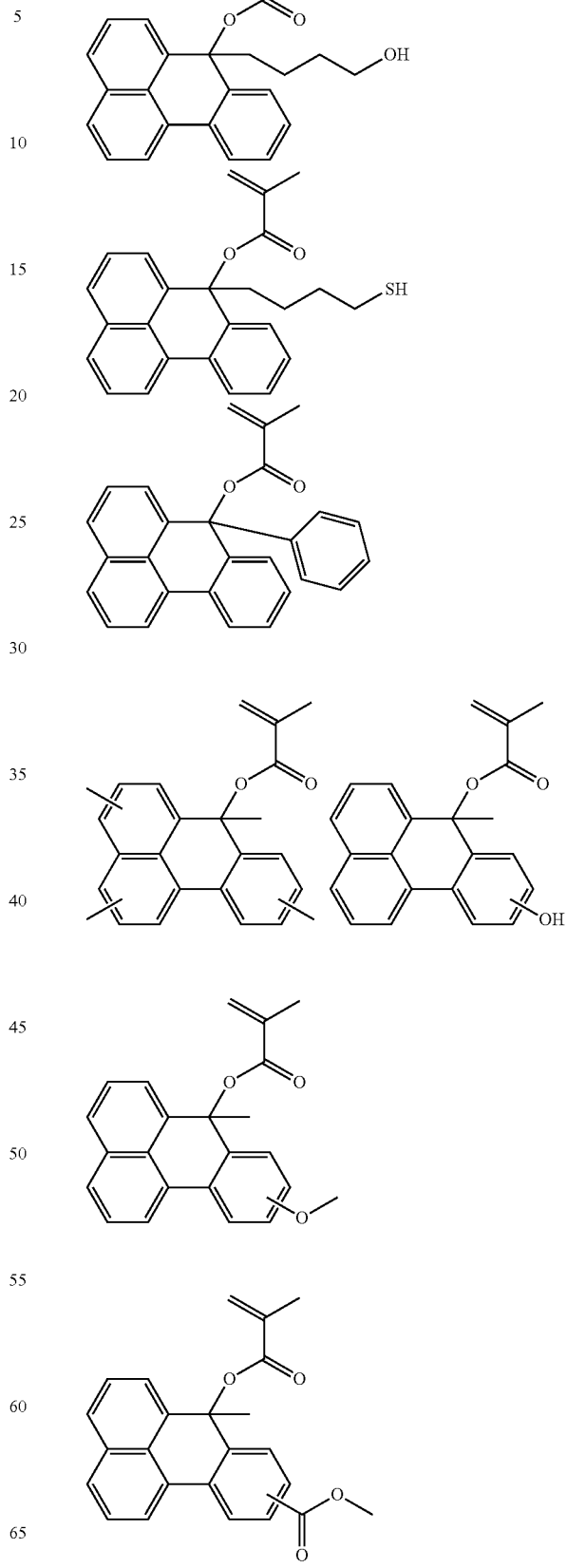

-continued

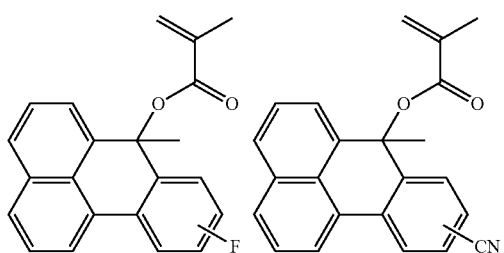

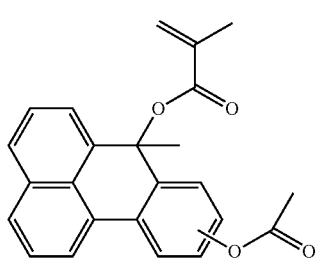

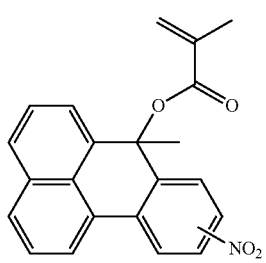

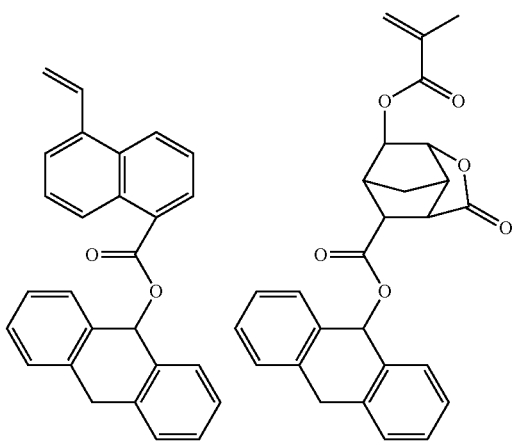

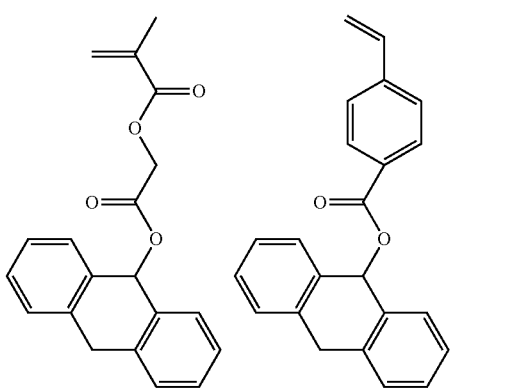

In the recurring unit B1, the hydrogen atom of the carboxyl group may be substituted by an acid labile group having the general formula (A-3)-27.

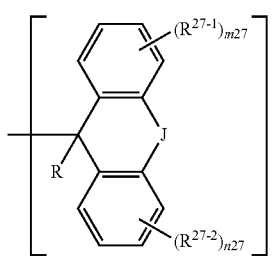

(A-3)-27

Herein $R^{27-1}$ and $R^{27-2}$ each are hydrogen, $C_1$-$C_4$ alkyl, alkoxy, alkanoyl, alkoxycarbonyl, hydroxyl, $C_6$-$C_{10}$ aryl, halogen, or cyano group; R is as defined above; J is methylene, ethylene, vinylene or —$CH_2$—S—; and m27 and n27 each are an integer of 1 to 4.

Examples of the monomer having a carboxyl group substituted with an acid labile group of formula (A-3)-27 are given below.

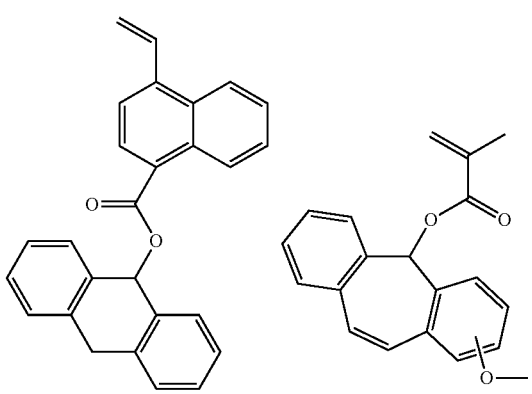

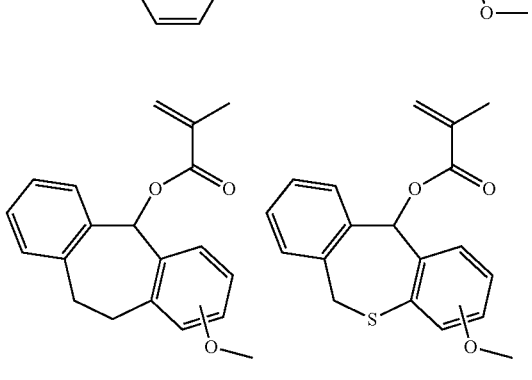

-continued
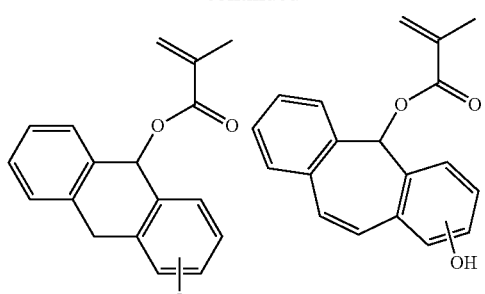
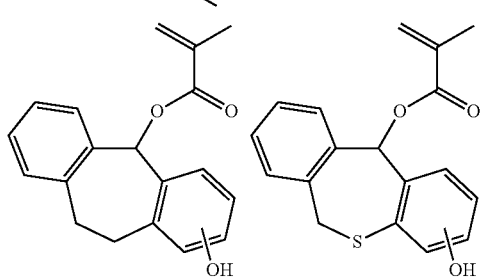
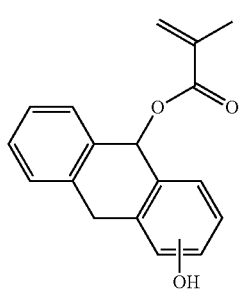
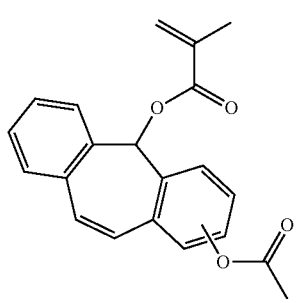
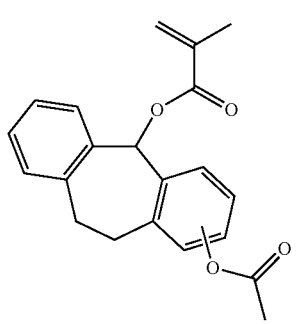
-continued
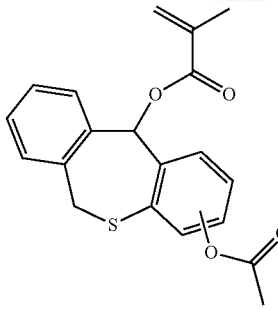
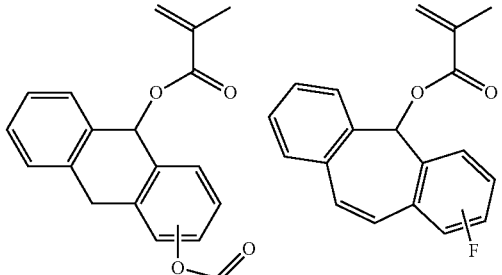
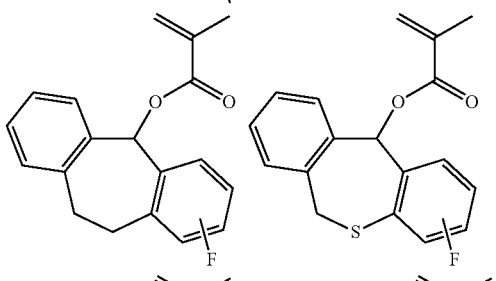
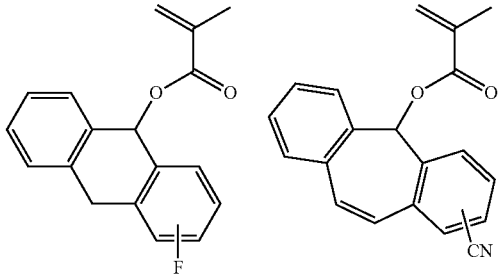
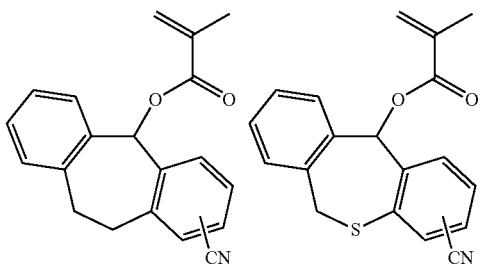
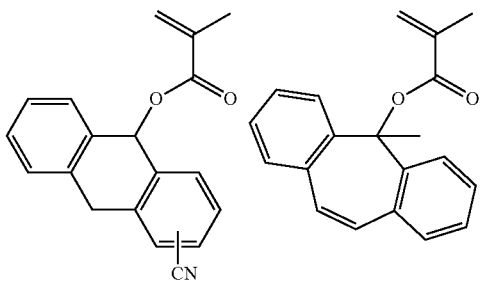

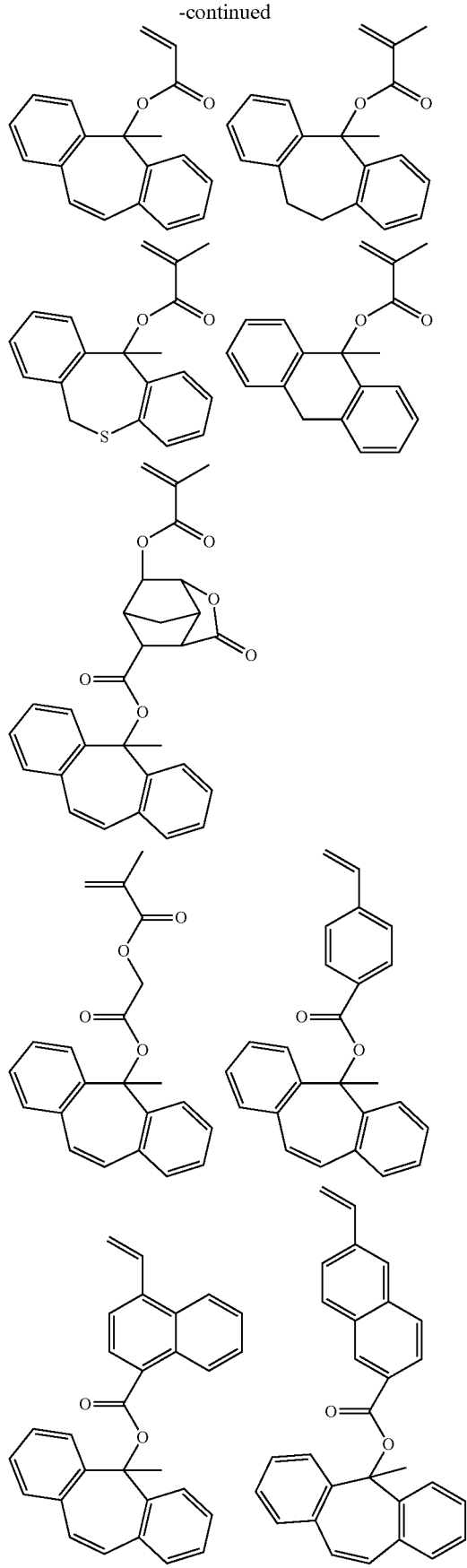
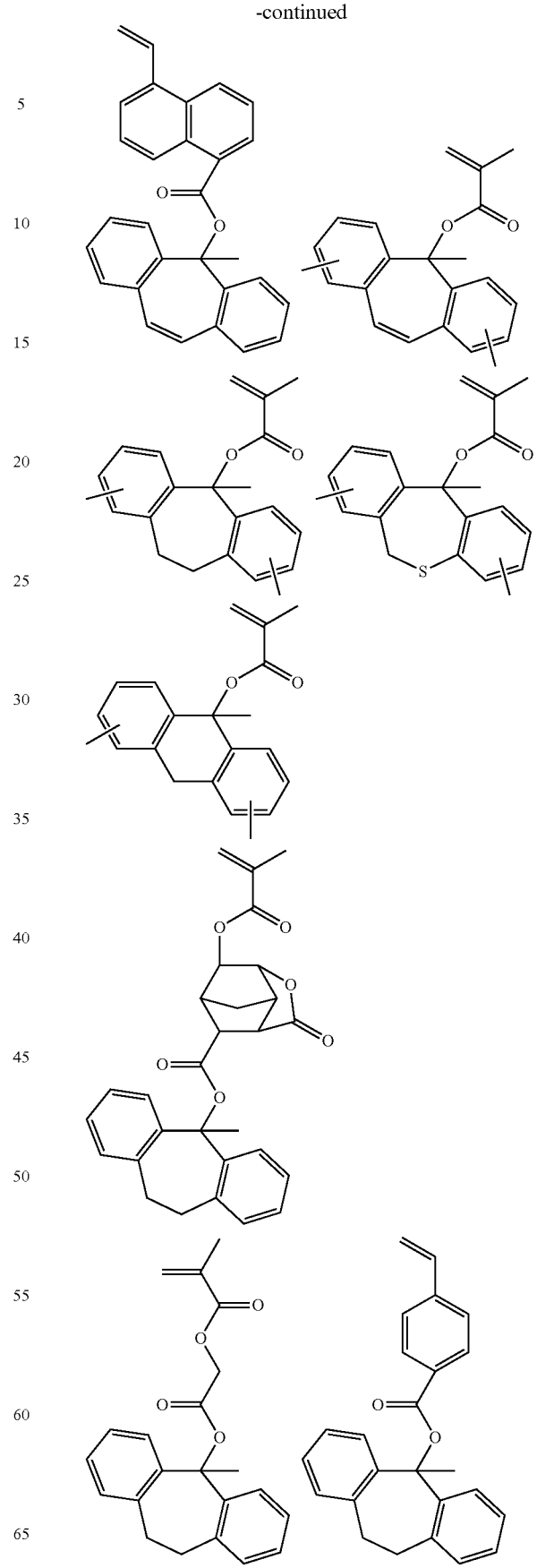

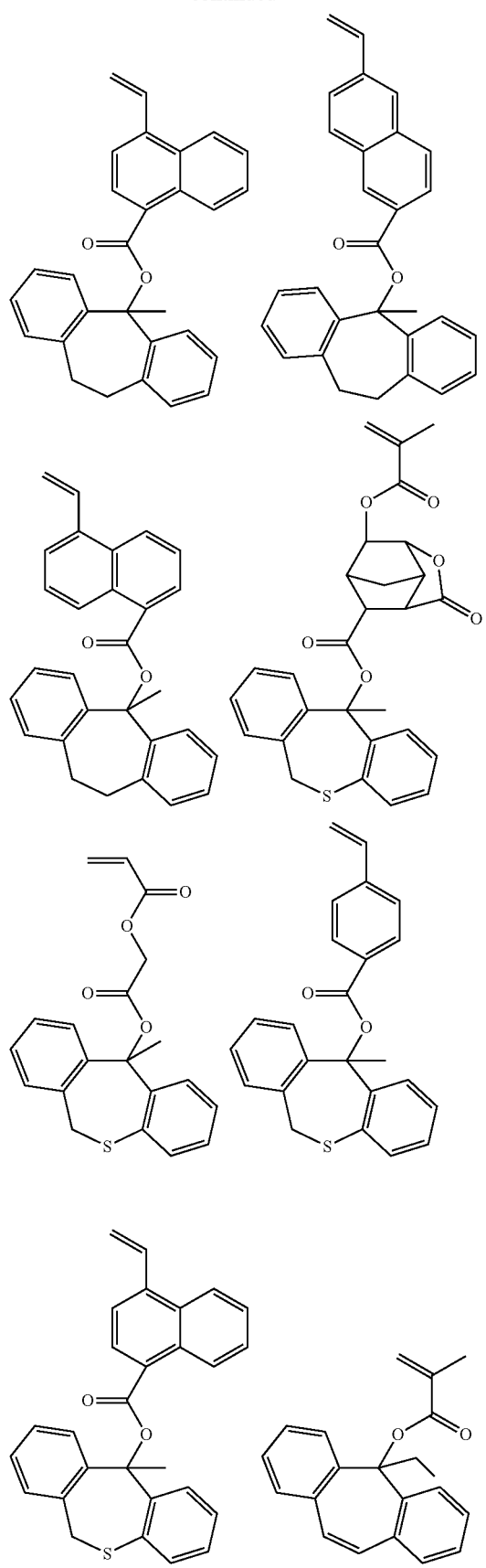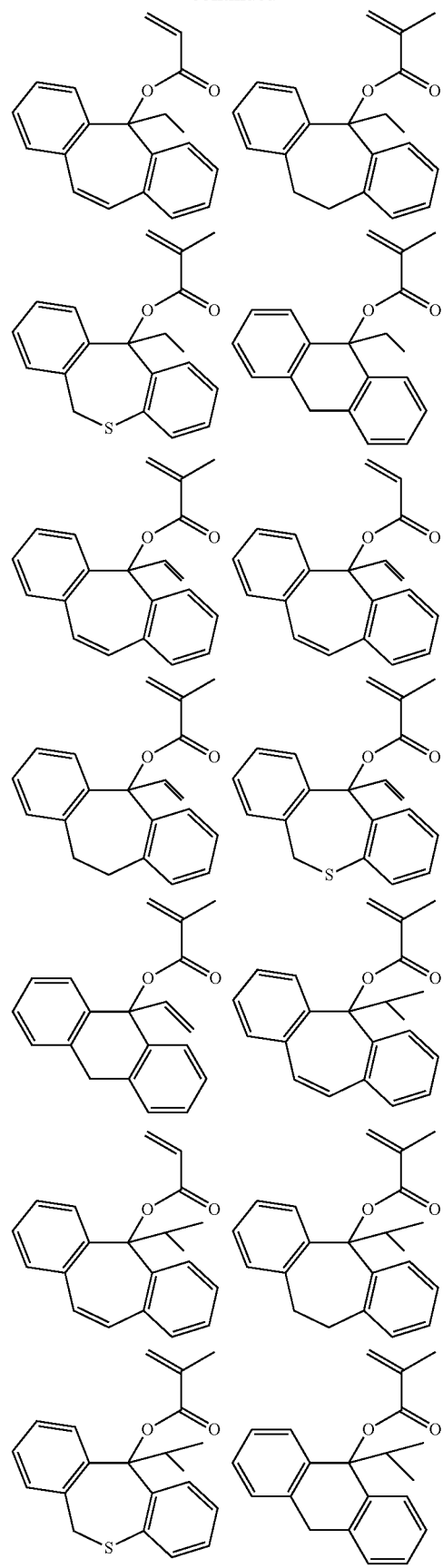

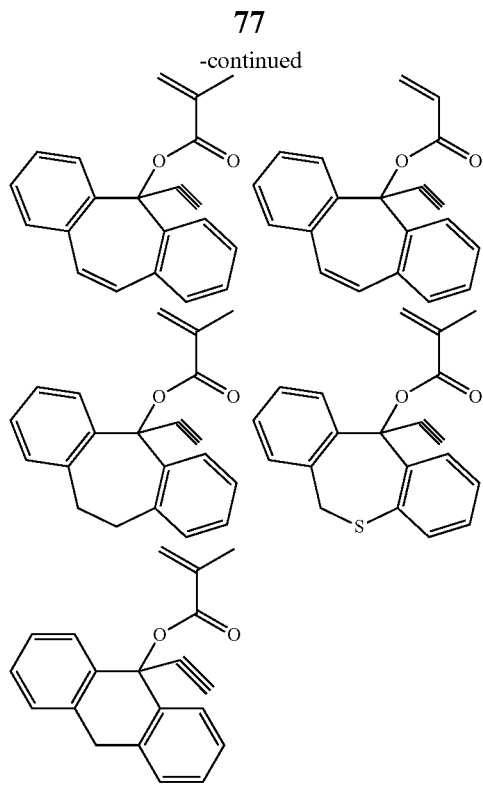

In the recurring unit B1, the hydrogen atom of the carboxyl group may be substituted by an acid labile group having the general formula (A-3)-28.

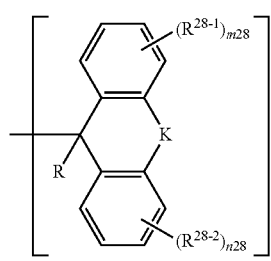

(A-3)-28

Herein $R^{28-1}$ and $R^{28-2}$ each are hydrogen, $C_1$-$C_4$ alkyl, alkoxy, alkanoyl, alkoxycarbonyl, hydroxyl, $C_6$-$C_{10}$ aryl, halogen, or cyano group; R is as defined above; K is carbonyl, ether, sulfide, —S(=O)— or —S(=O)$_2$—; and m28 and n28 each are an integer of 1 to 4.

Examples of the monomer having a carboxyl group substituted with an acid labile group of formula (A-3)-28 are given below.

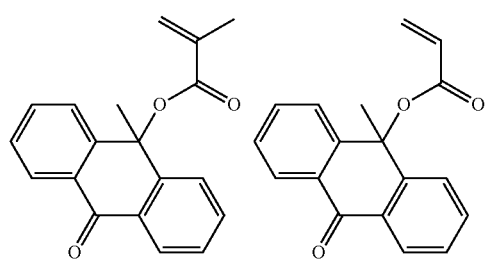

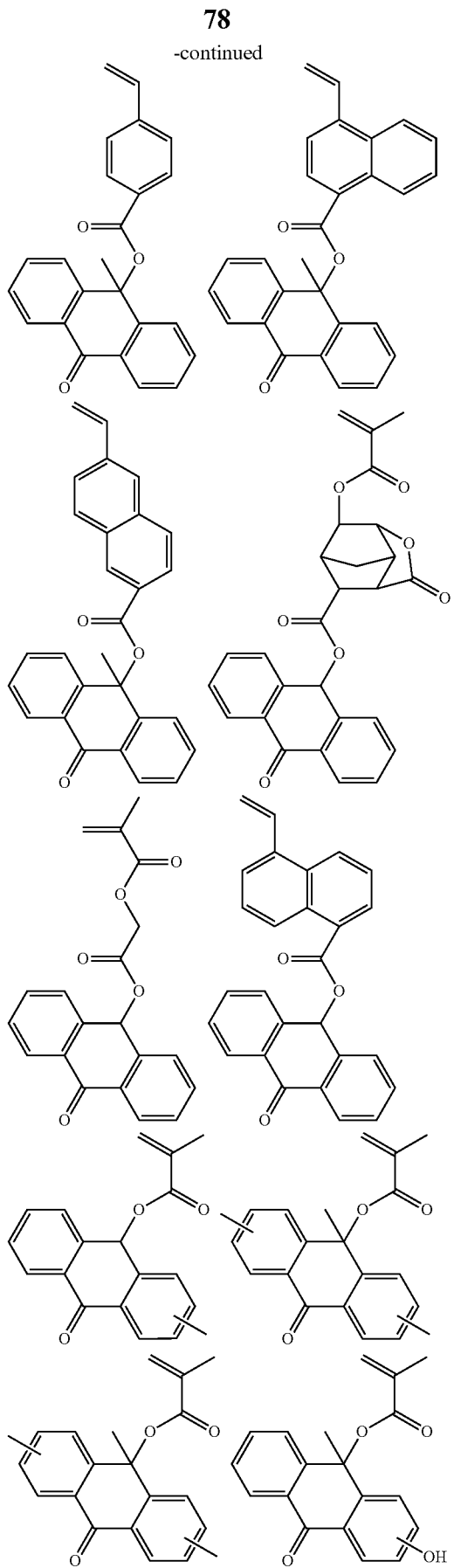

-continued
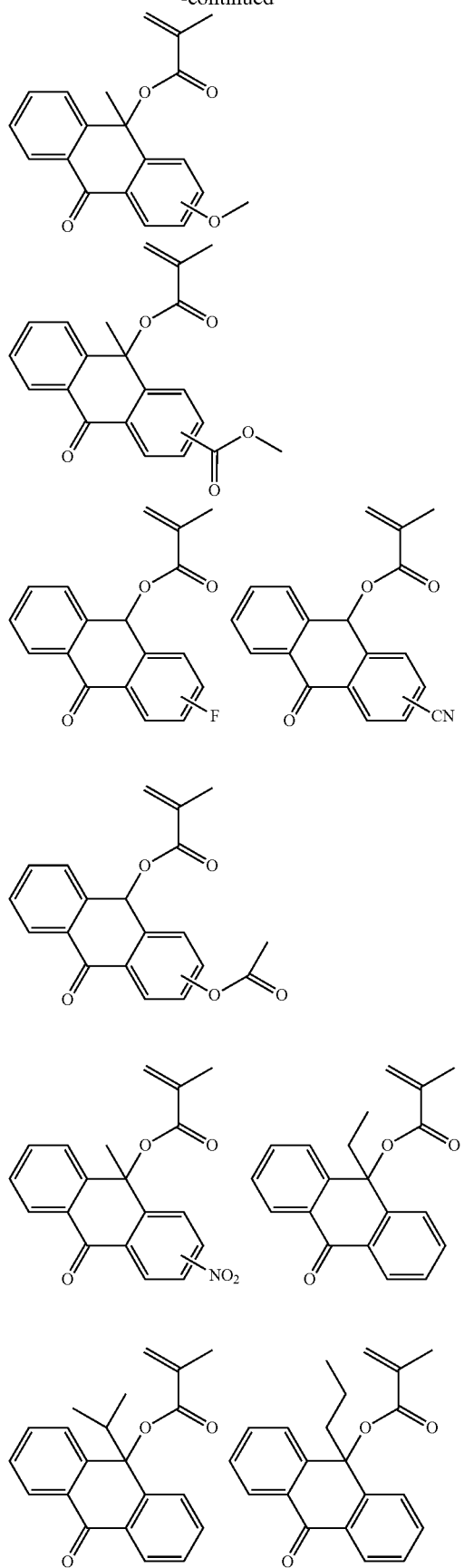
-continued
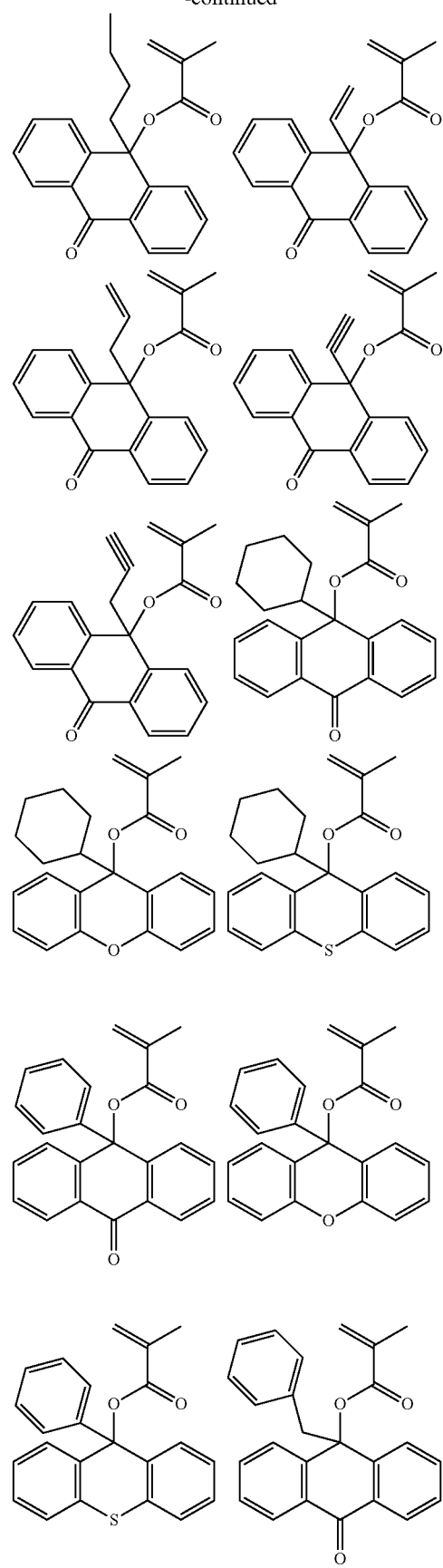

81
-continued
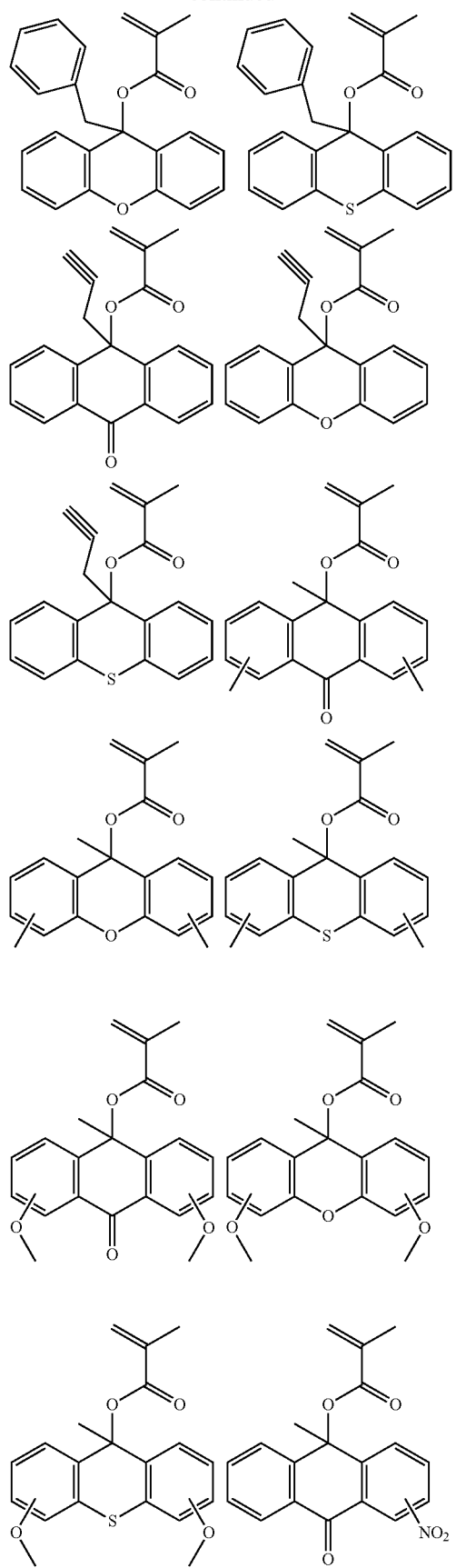
82
-continued
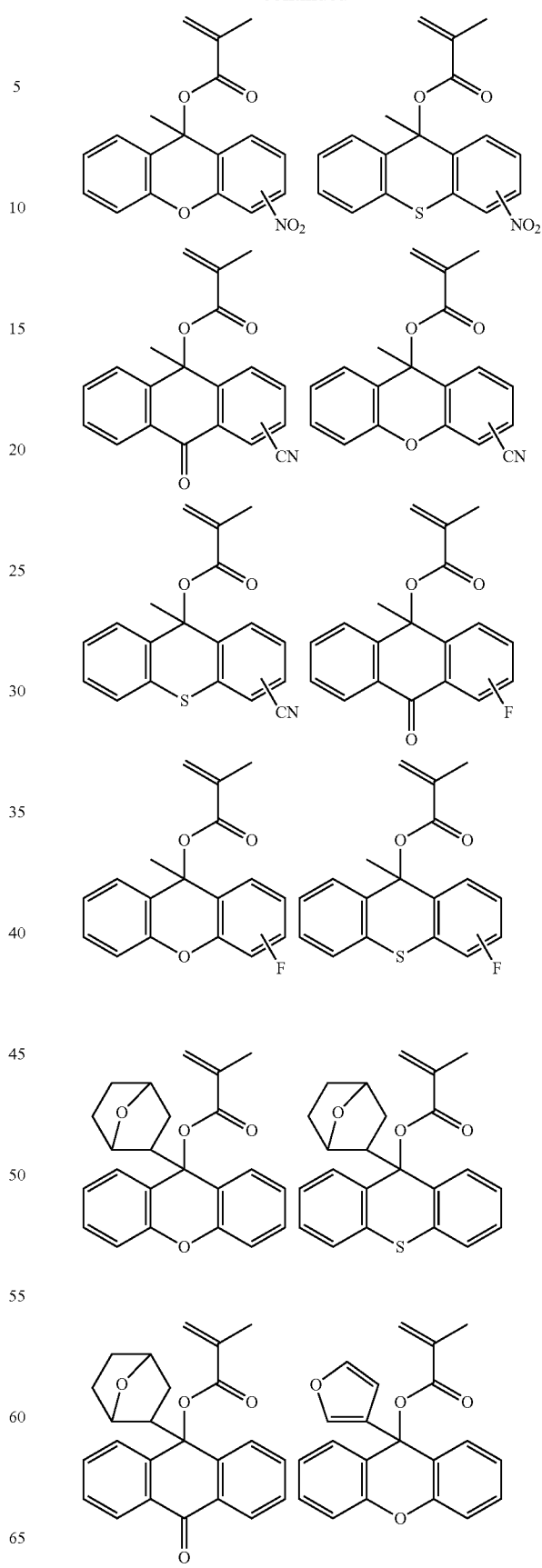

-continued
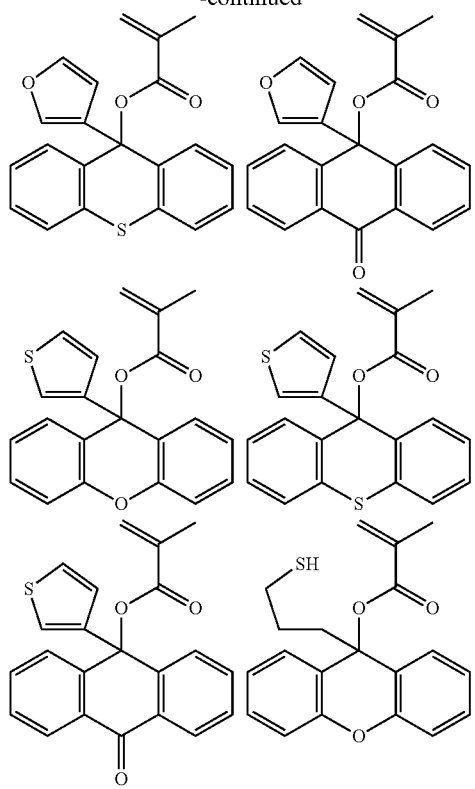
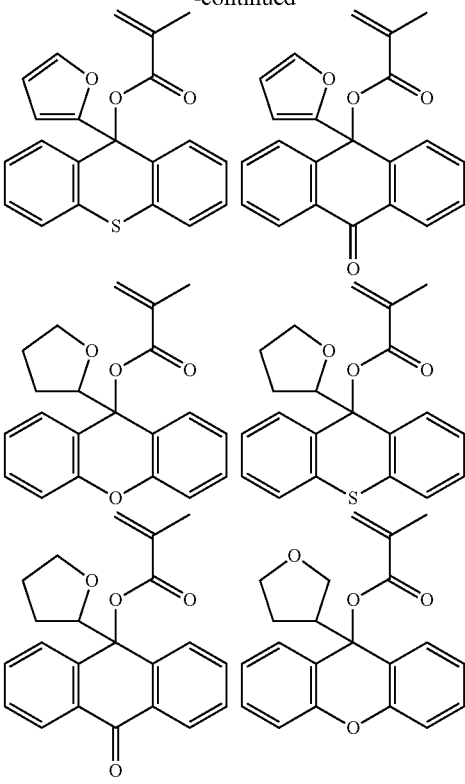

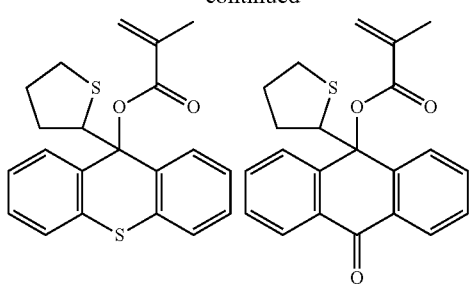
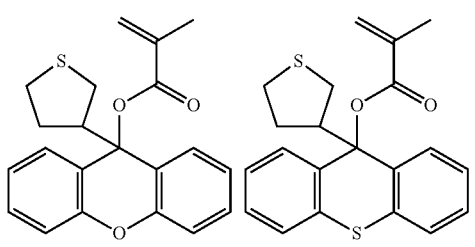
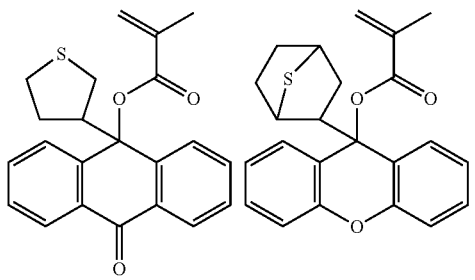
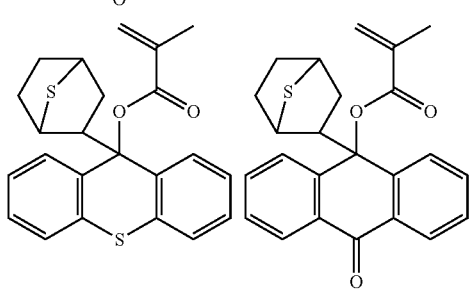
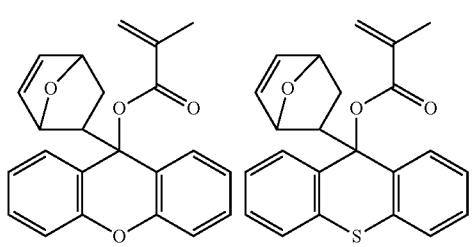
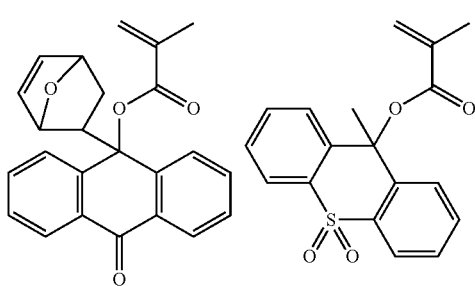
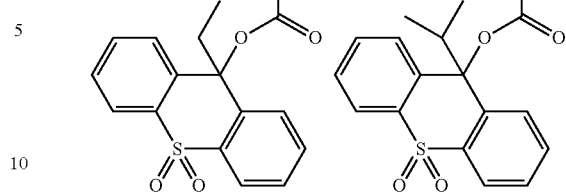
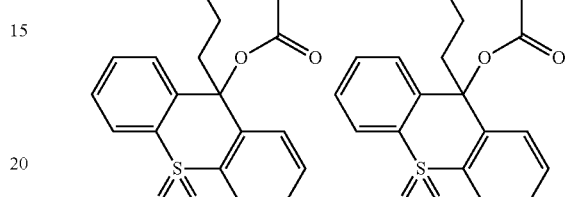
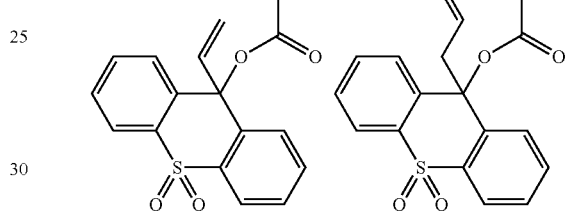
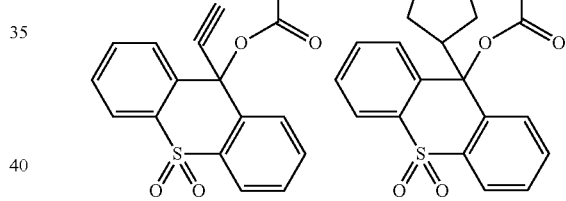
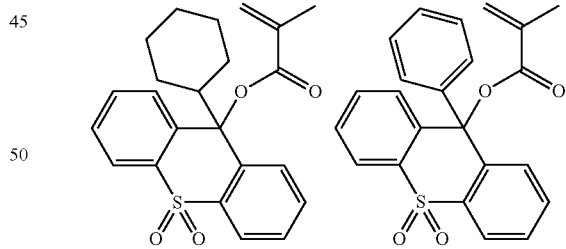
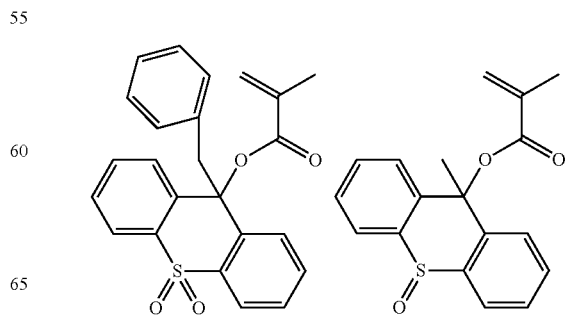

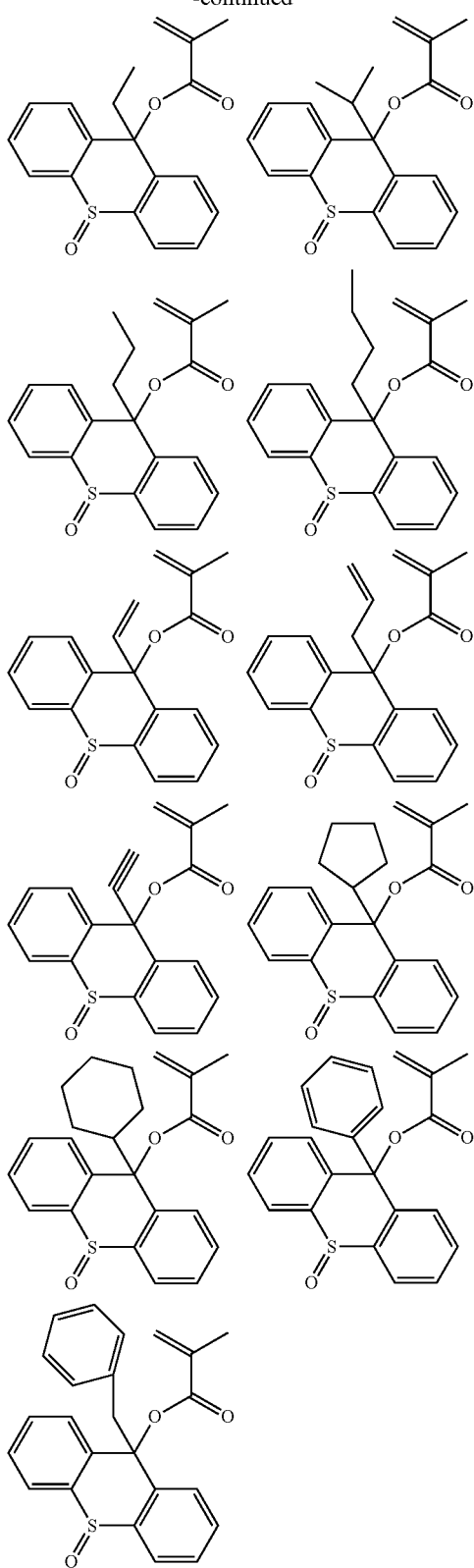

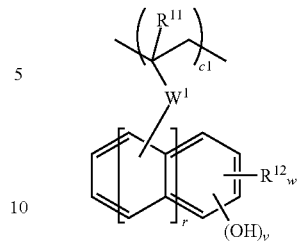

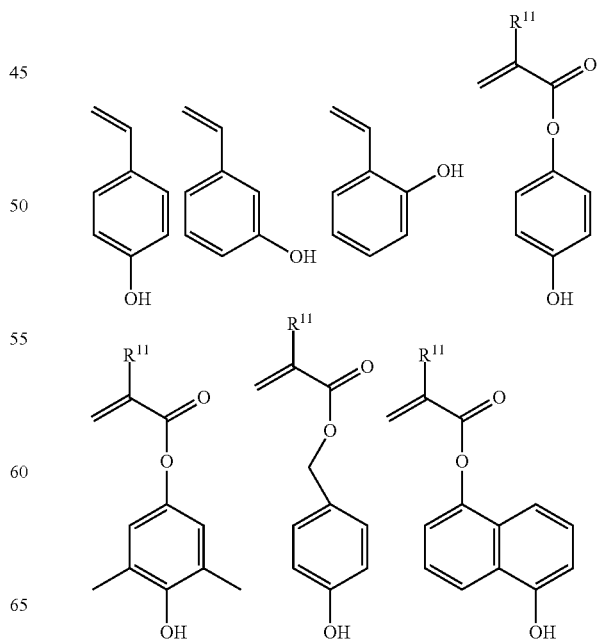

Herein $R^{11}$ and $R^{13}$ are each independently hydrogen or methyl. $W^1$ and $W^2$ are each independently a single bond, phenylene group, —$R^{15}$—C(=O)—O—$R^{16}$—, —$R^{15}$—O—$R^{16}$—, or —$R^{15}$—C(=O)—NH—$R^{16}$—, wherein $R^{15}$ is a single bond or a $C_6$-$C_{10}$ arylene group, and $R^{16}$ is a single bond or a $C_1$-$C_{10}$ straight, branched, cyclic or bridged alkylene group, $C_6$-$C_{10}$ arylene group, or $C_2$-$C_{10}$ alkenylene group, which may contain an ether radical, ester radical or fluorine. $R^{12}$ is hydrogen, fluorine, trifluoromethyl, cyano, $C_1$-$C_6$ straight, branched or cyclic alkyl, alkoxy, acyl, acyloxy, or alkoxycarbonyl group. $R^{14}$ is hydrogen, fluorine, methyl, trifluoromethyl, or difluoromethyl. $R^{14}$ and $W^2$ may bond together to form a $C_3$-$C_6$ ring which may be substituted with fluorine or have an ether radical within the ring. The subscript r is 0 or 1, s is 1 or 2, v is 1 or 2, and w is an integer of 0 to 4.

Non-limiting examples of suitable monomers from which recurring units C1 are derived are given below.

As shown in formula (1), the polymer further comprises recurring units C1 having a hydroxy-aromatic group and/or recurring units C2 having an adhesive group in the form of 2,2,2-trifluoro-1-hydroxyethyl, which are represented below.

89
-continued
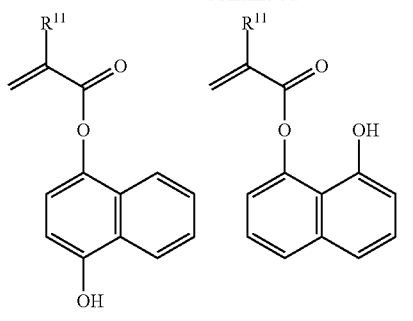
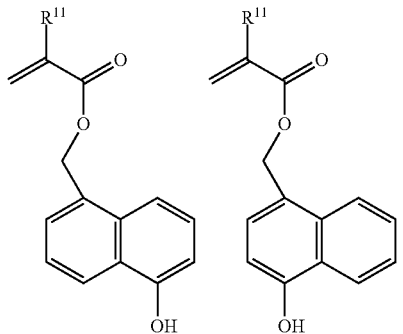
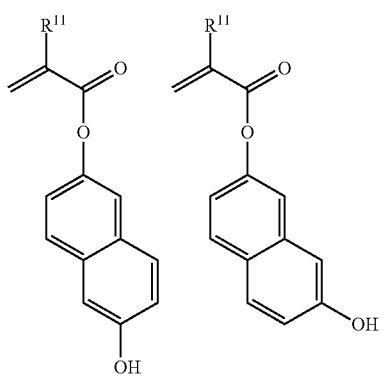
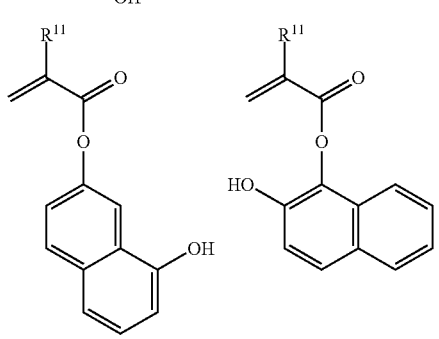
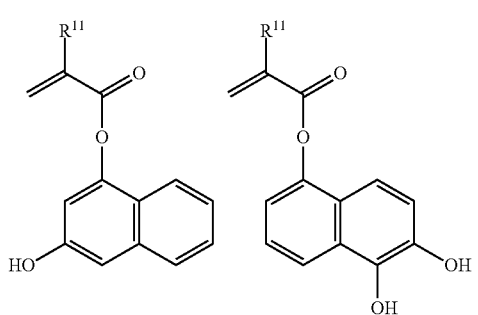
90
-continued
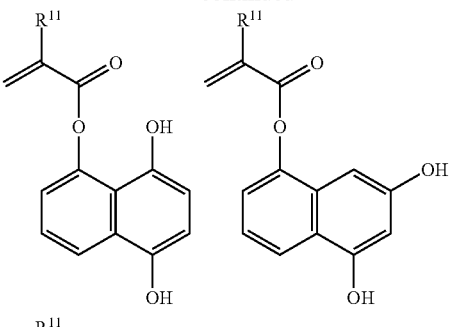
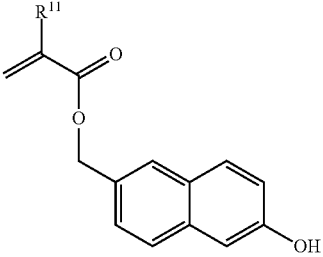
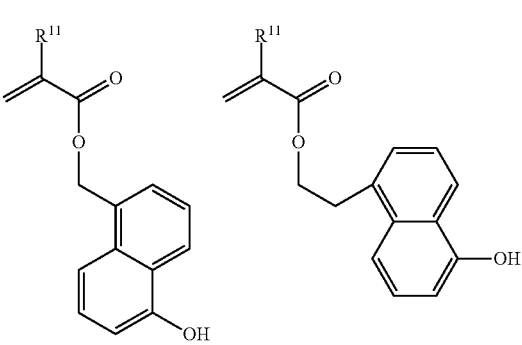
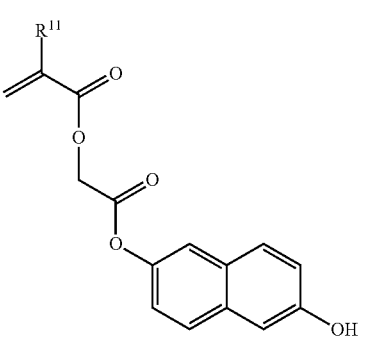
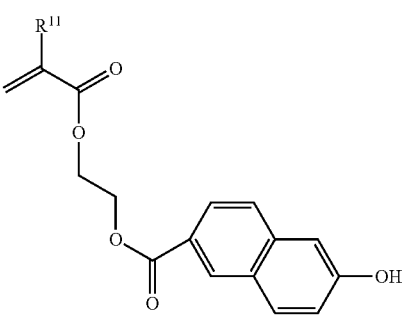

91
-continued
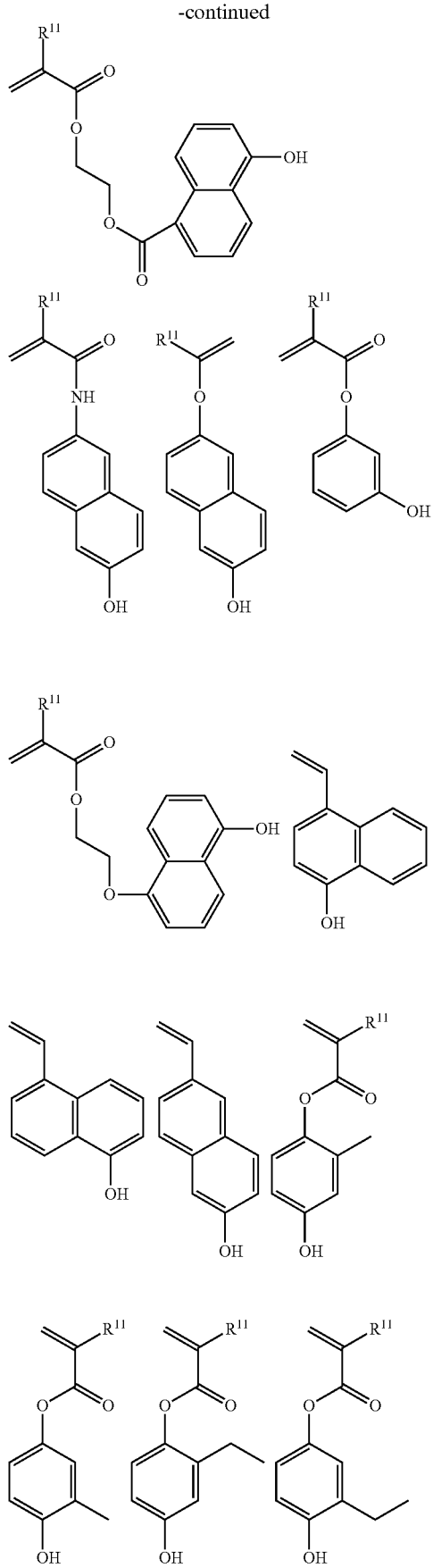
92
-continued
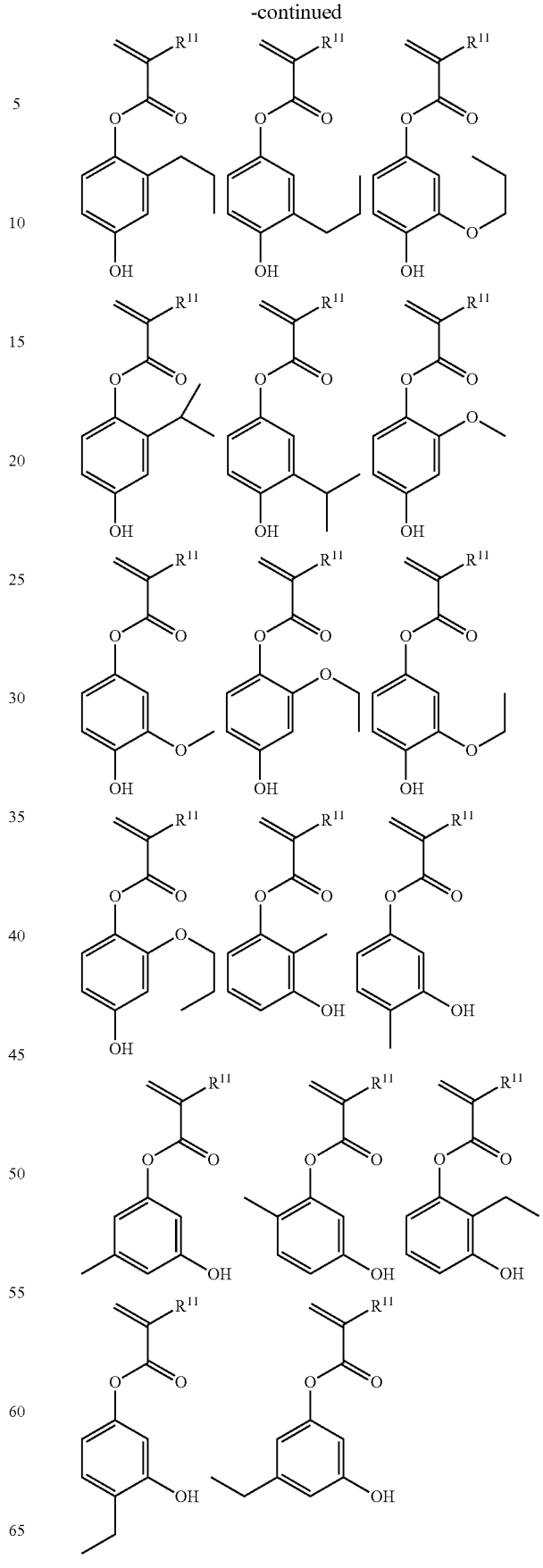

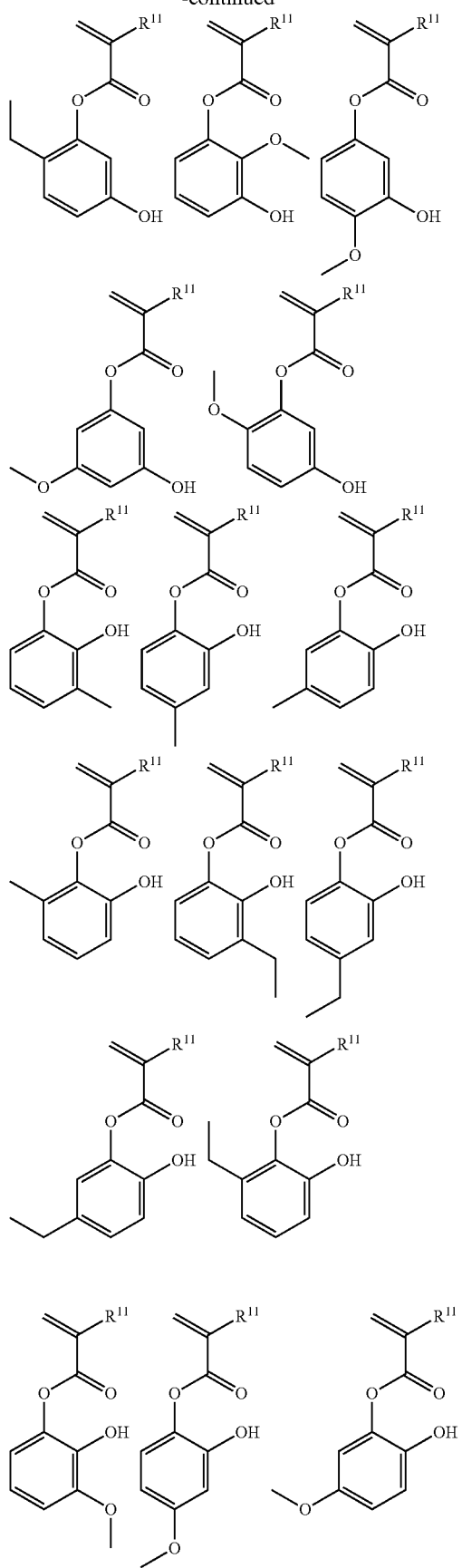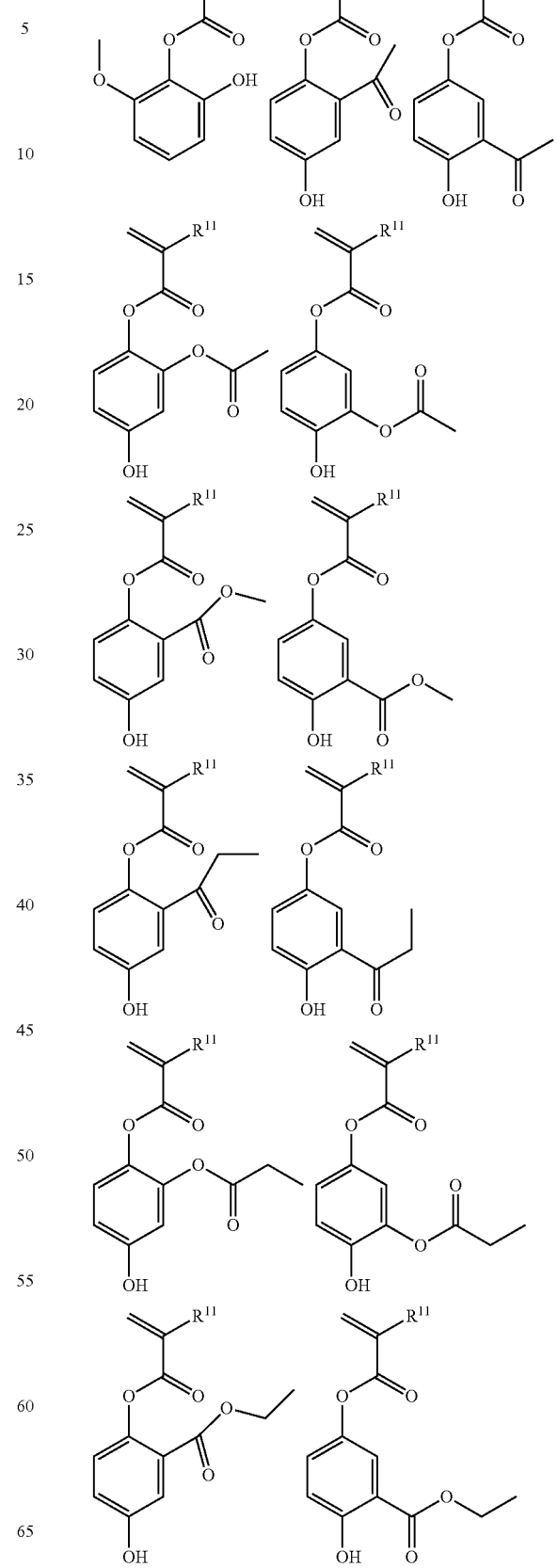

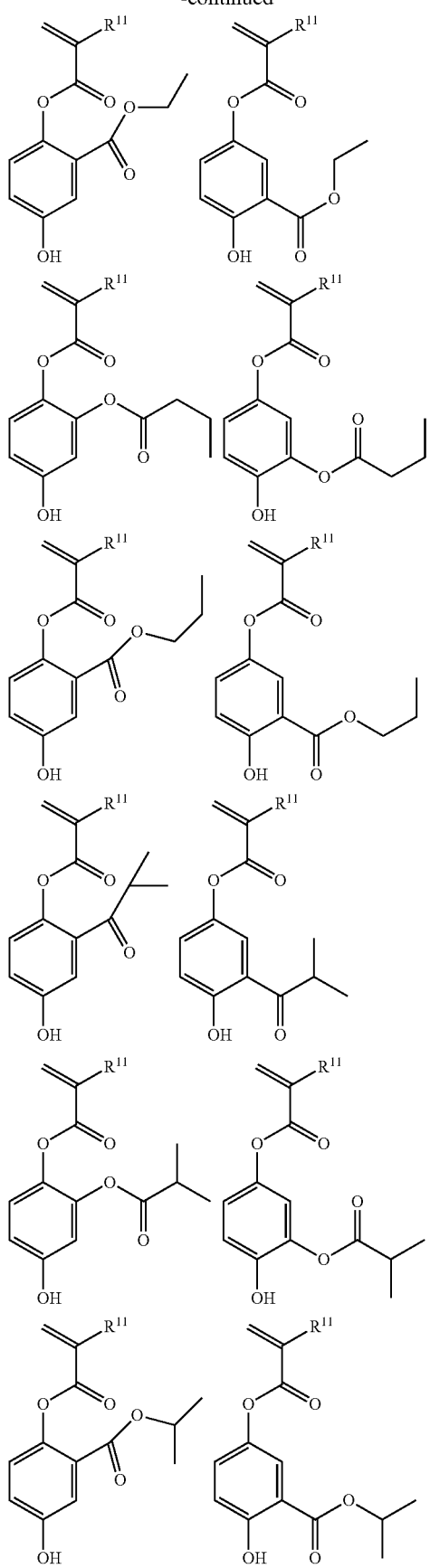
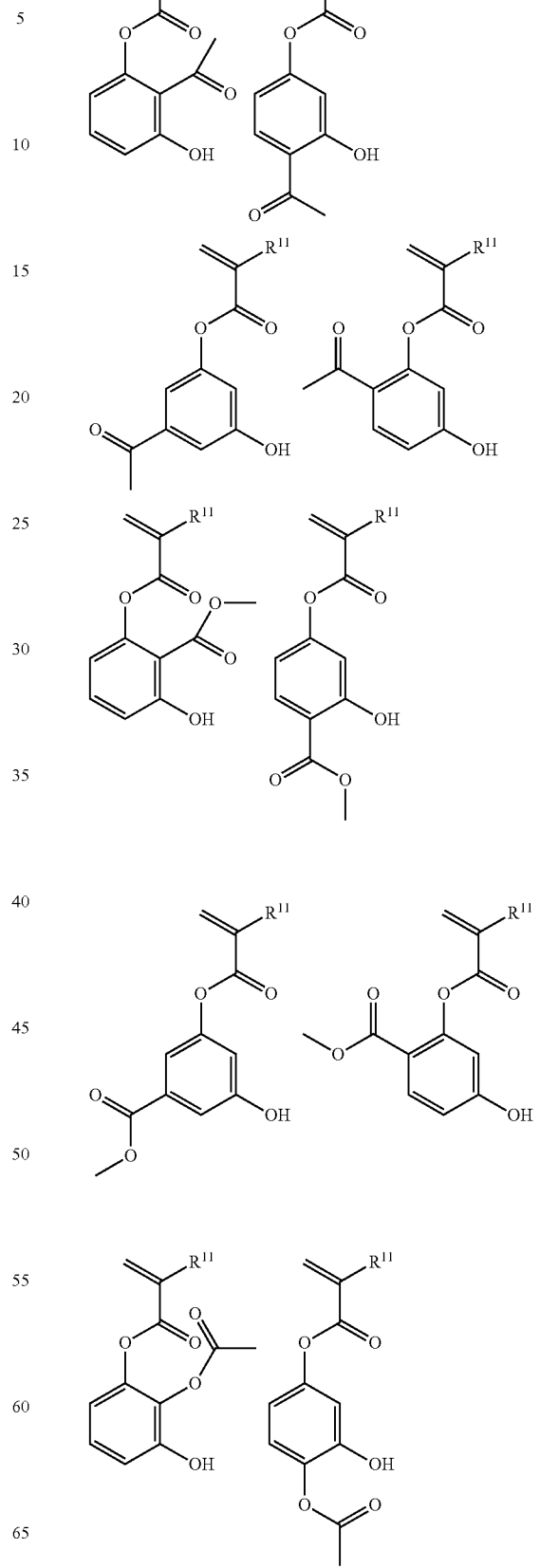

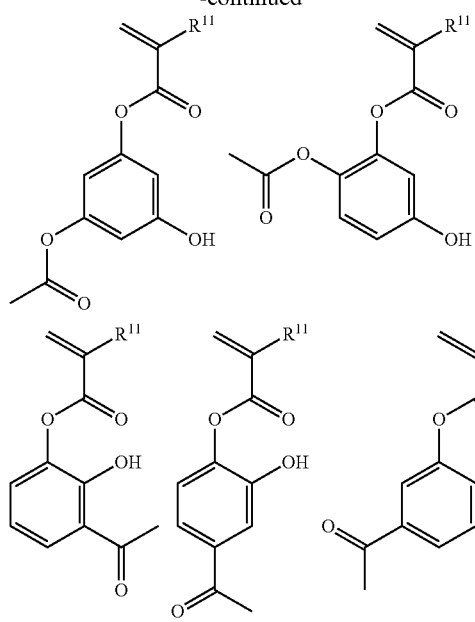
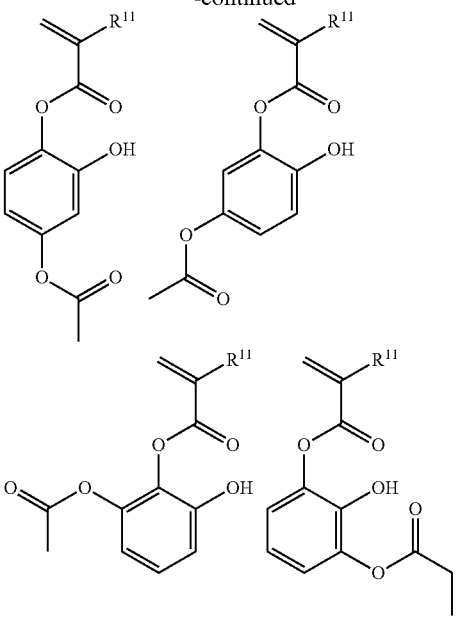
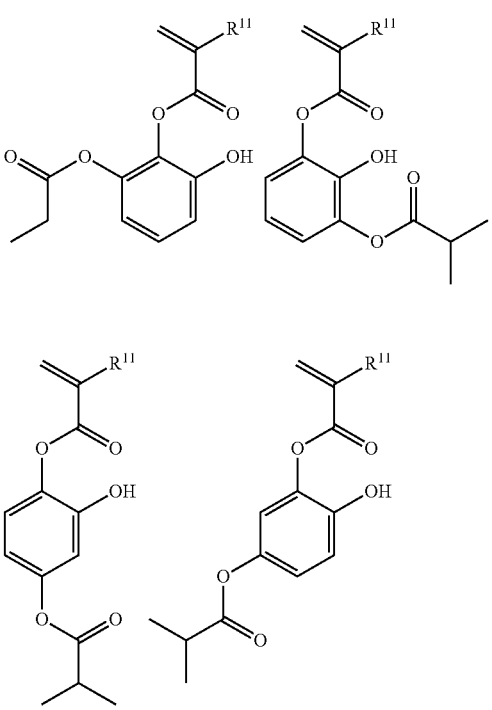

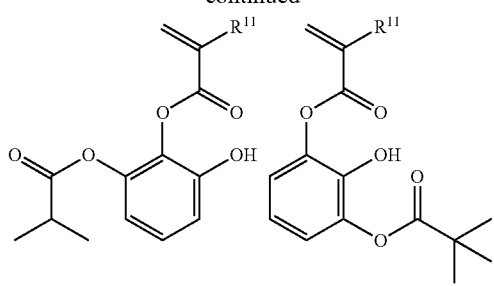
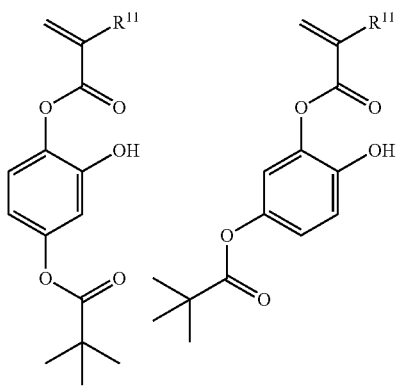
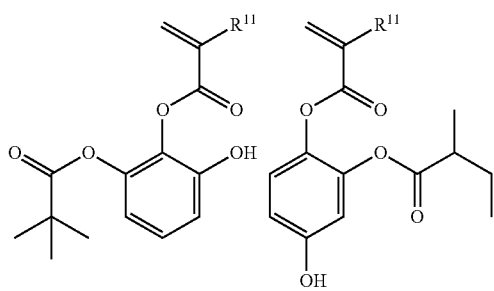
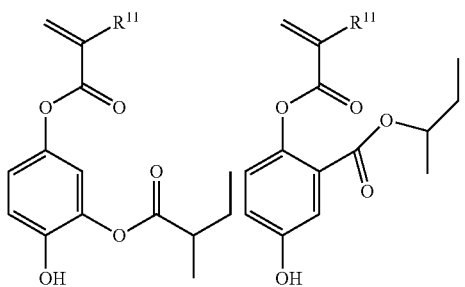
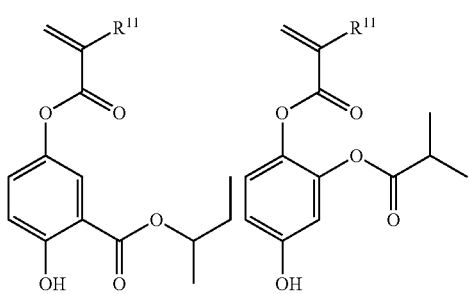
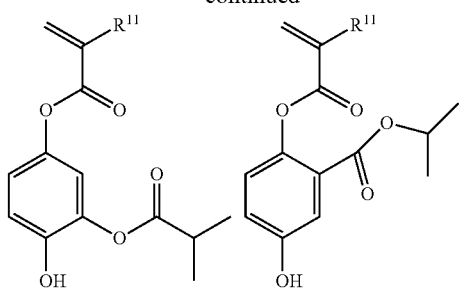
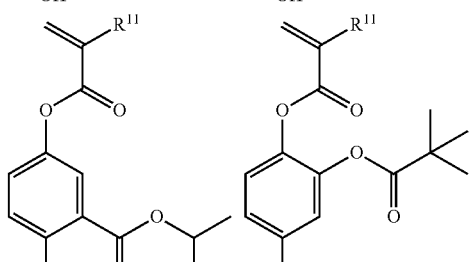
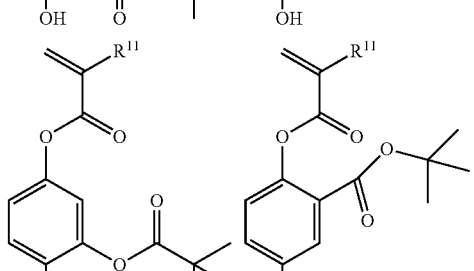
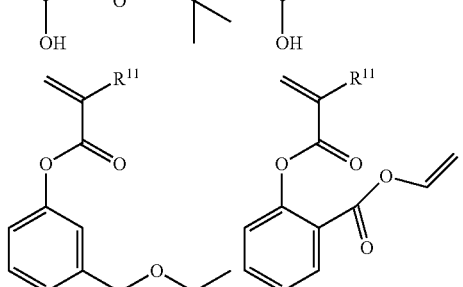
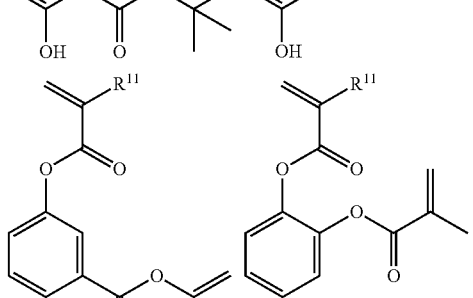
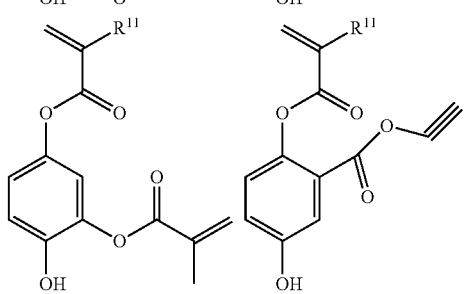

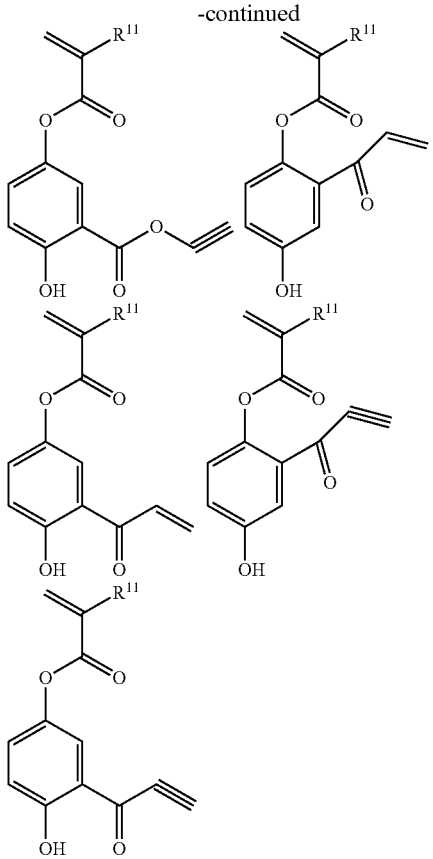
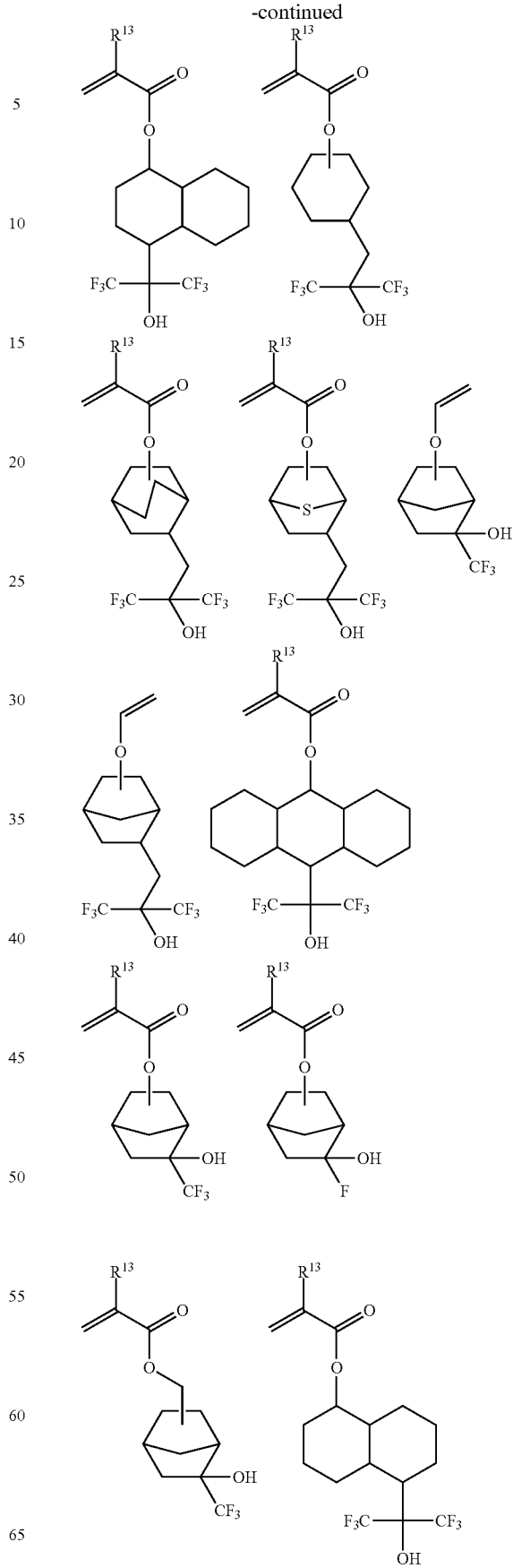
Notably $R^{11}$ is as defined above.
Non-limiting examples of suitable monomers from which recurring units C2 are derived are given below.
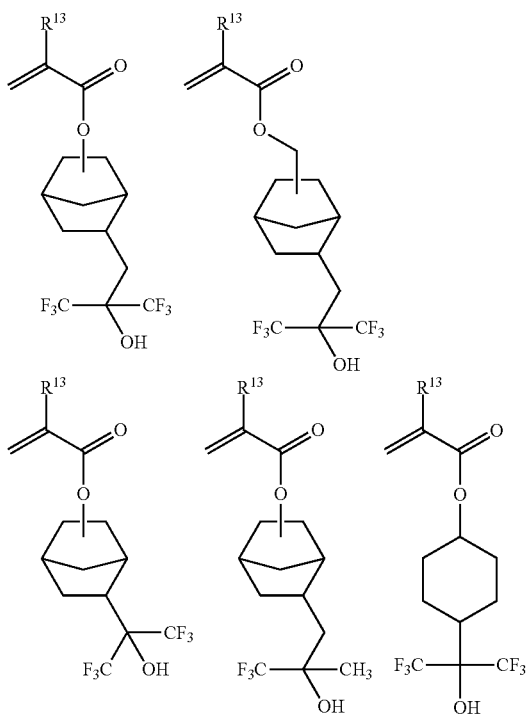

-continued
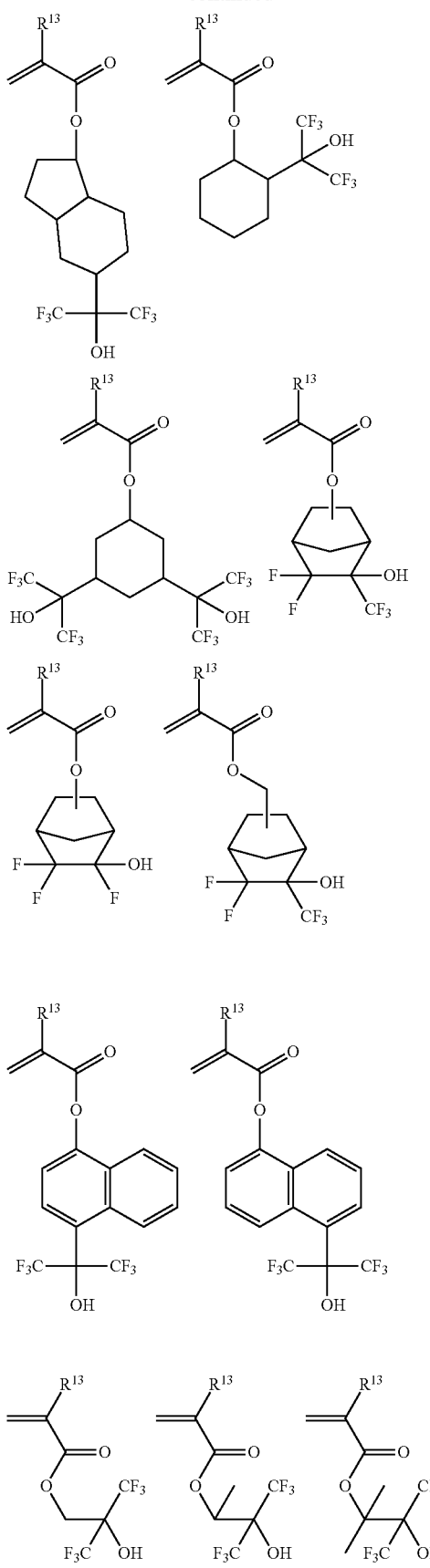
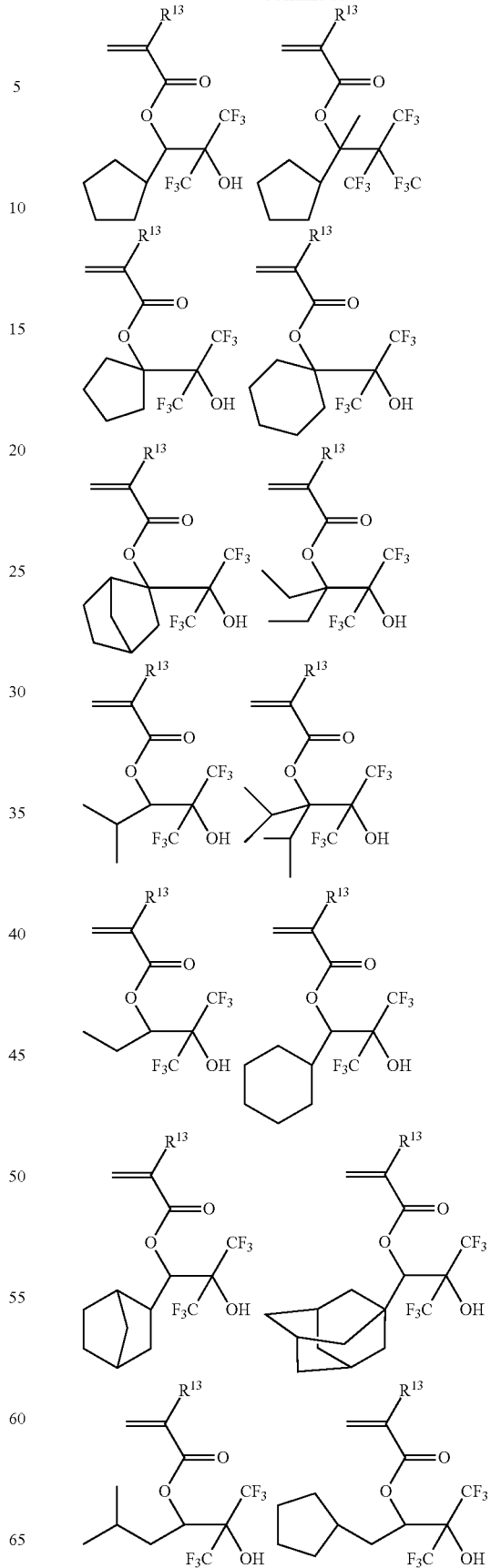

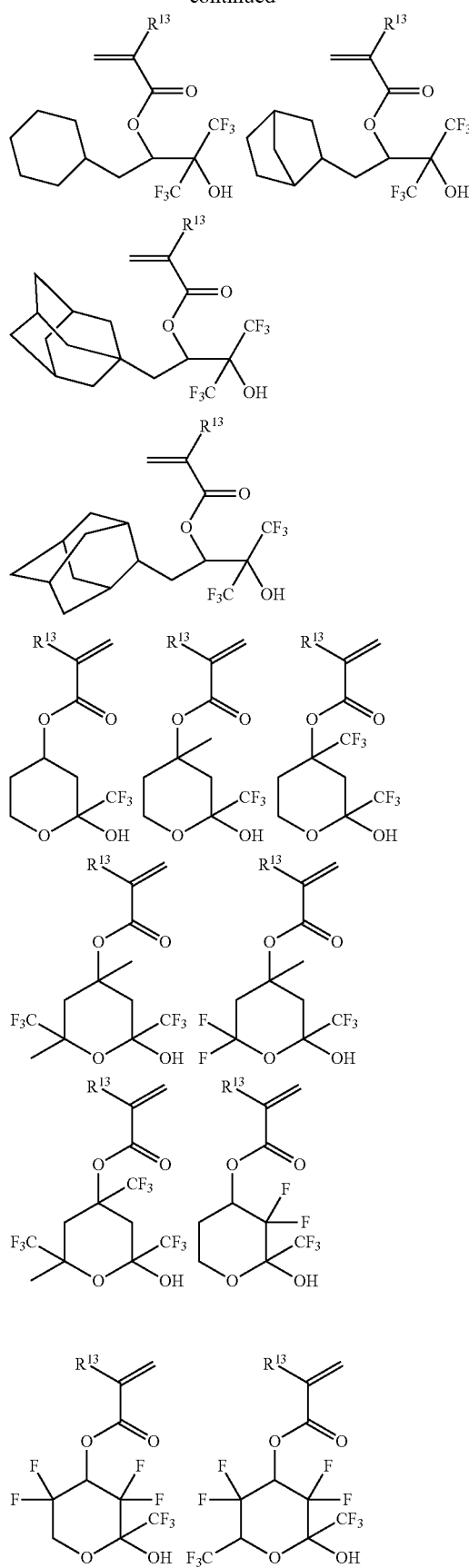
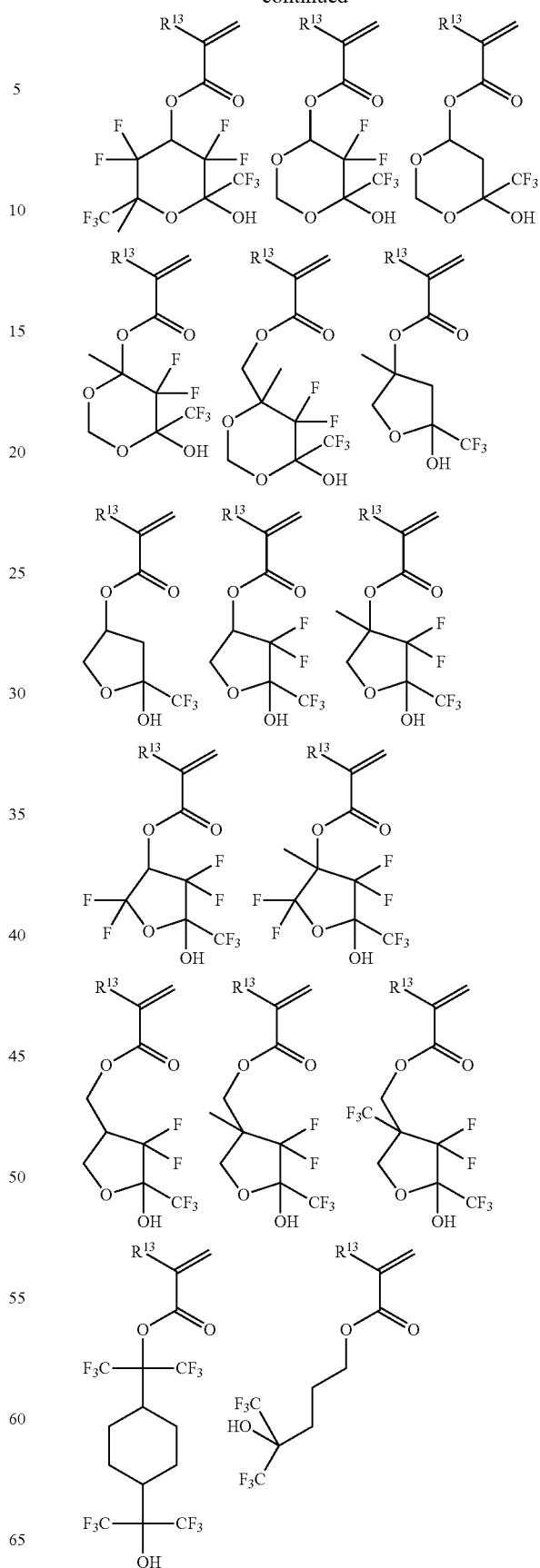

-continued

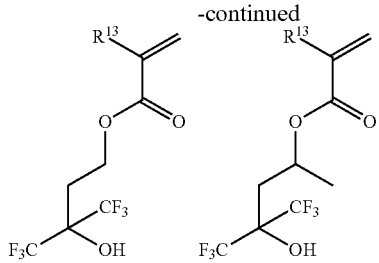

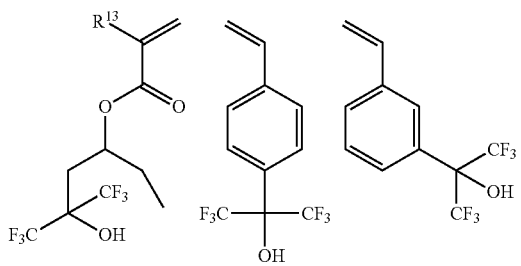

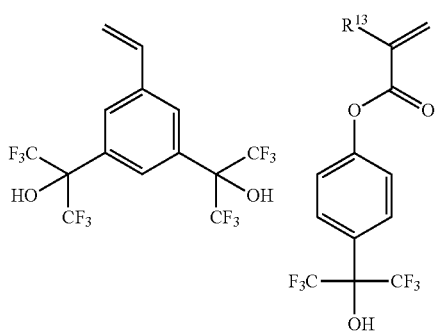

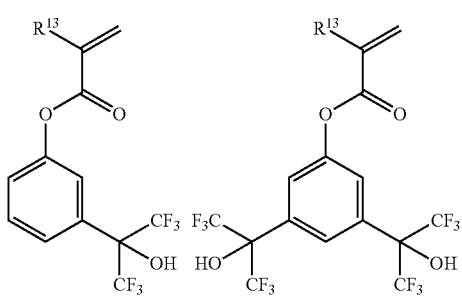

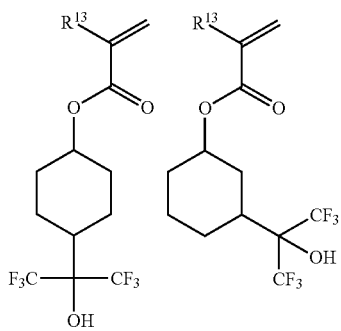

-continued

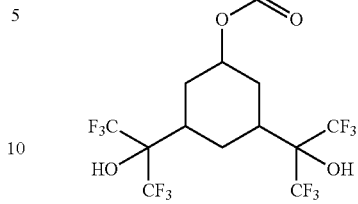

Notably $R^{13}$ is as defined above.

In a preferred embodiment, recurring units D1, D2 or D3 having a sulfonium salt as represented by the following general formula (2) may be copolymerized. It is noted that JP-A 2006-045311 discloses a sulfonium or iodonium salt having polymerizable olefin capable of generating a specific sulfonic acid; and JP-A 2006-178317 discloses a sulfonium salt having sulfonic acid directly attached to the main chain.

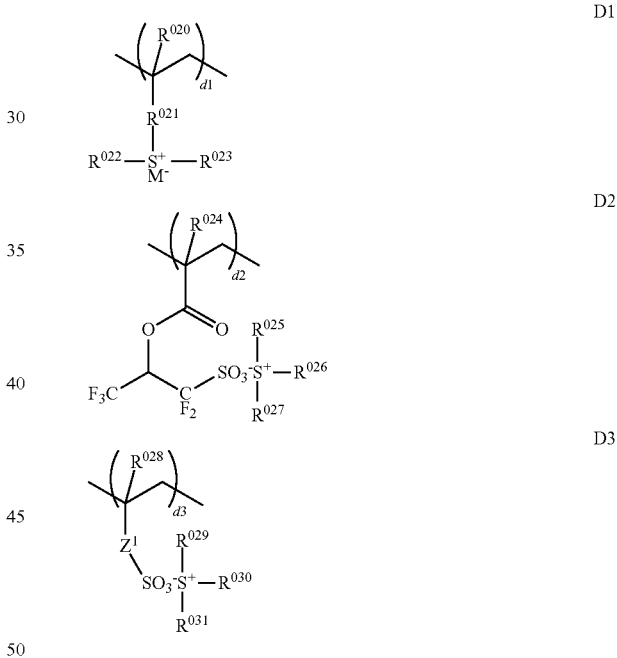

Herein $R^{020}$, $R^{024}$, and $R^{028}$ each are hydrogen or methyl. $R^{021}$ is a single bond, phenylene, —O—$R^{033}$—, or —C(=O)—Y—$R^{033}$— wherein Y is oxygen or NH and $R^{033}$ is a straight, branched or cyclic $C_1$-$C_6$ alkylene group, alkenylene group or phenylene group, which may contain a carbonyl (—CO—), ester (—COO—), ether (—O—), or hydroxyl moiety. $R^{022}$, $R^{023}$, $R^{025}$, $R^{026}$, $R^{027}$, $R^{029}$, $R^{030}$, and $R^{031}$ are each independently a straight, branched or cyclic $C_1$-$C_{12}$ alkyl group which may contain a carbonyl, ester or ether moiety, a $C_6$-$C_{12}$ aryl group, a $C_7$-$C_{20}$ aralkyl group, or a thiophenyl group. $Z^1$ is a single bond, methylene, ethylene, phenylene, fluorinated phenylene, —O—$R^{032}$—, or —C(=O)—$Z^2$—$R^{032}$—, wherein $Z^2$ is oxygen or NH, and $R^{032}$ is a straight, branched or cyclic $C_1$-$C_6$ alkylene group, alkenylene group or phenylene group, which may contain a carbonyl, ester, ether or hydroxyl moiety. M⁻ is a non-nucleophilic counter ion. Molar fractions d1, d2 and d3 are in the range: 0≤d1≤0.5, 0≤d2≤0.5, 0≤d3≤0.5, 0<d1+d2+d3≤0.5, and 0.2≤a+b1+b2+c1+c2<1.0.

It is noted that d1, d2 and d3 in formula (2) are in the range: 0≤d1≤0.5, 0≤d2≤0.5, 0≤d3≤0.5, 0≤d1+d2+d3≤0.5. When recurring units D1, D2 or D3 are incorporated, the preferred range is 0<d1+d2+d3≤0.5 and 0.2≤a+b1+b2+c1+c2+d1+d2+d3≤1.0.

Copolymerization of sulfonium salt units D1, D2 or D3 having formula (2) means the binding of an acid generator with the polymer main chain, which is effective in suppressing acid diffusion, thereby preventing a reduction of resolution due to blur of acid diffusion. Also edge roughness (LER or LWR) is improved since the acid generator is uniformly dispersed.

Examples of the non-nucleophilic counter ion represented by M⁻ include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkylsulfonate ions such as mesylate and butanesulfonate; imidates such as bis(trifluoromethylsulfonyl)imide, bis(perfluoroethylsulfonyl)imide and bis(perfluorobutylsulfonyl)imide; methidates such as tris(trifluoromethylsulfonyl)methide and tris(perfluoroethylsulfonyl)methide.

Other non-nucleophilic counter ions include sulfonates having fluorine substituted at α-position as represented by the general formula (K-1) and sulfonates having fluorine substituted at α- and β-positions as represented by the general formula (K-2).

(K-1)

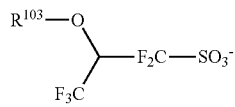
(K-2)

In formula (K-1), $R^{102}$ is hydrogen, or a straight, branched or cyclic $C_1$-$C_{20}$ alkyl group, $C_2$-$C_{20}$ alkenyl group, or $C_6$-$C_{20}$ aryl group, which may have an ether, ester, carbonyl moiety, lactone ring or fluorine. In formula (K-2), $R^{103}$ is hydrogen, or a straight, branched or cyclic $C_1$-$C_{30}$ alkyl or acyl group, $C_2$-$C_{20}$ alkenyl group, or $C_6$-$C_{20}$ aryl or aryloxy group, which may have an ether, ester, carbonyl moiety or lactone ring.

In a more preferred embodiment, the polymer may further comprise recurring units E having an adhesive group as copolymerized (provided that units C1 and C2 are excluded from units E). The adhesive group is selected from among hydroxyl, carboxyl, lactone ring, carbonate, thiocarbonate, carbonyl, cyclic acetal, ether, ester, sulfonic acid ester, cyano, amide, and —O—C(=O)-G- wherein G is sulfur or NH. It is provided that e is a molar fraction of units E in the polymer.

Shown below are examples of the monomer from which the recurring units E are derived.

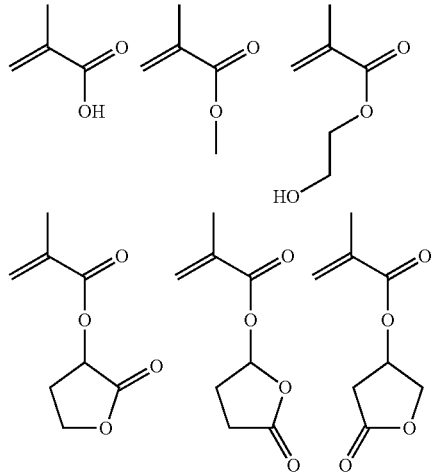

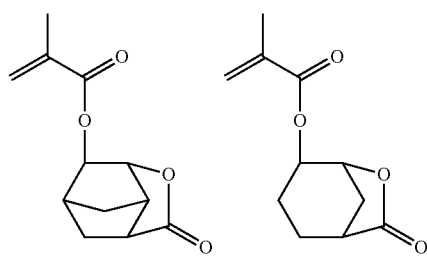

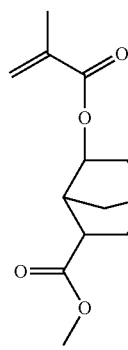
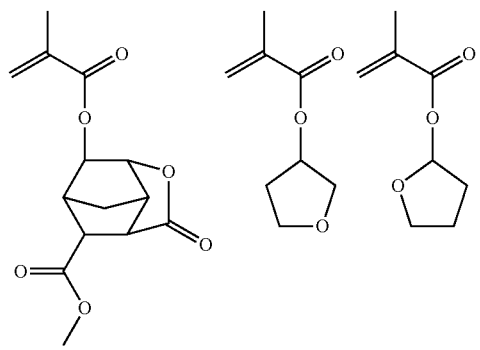

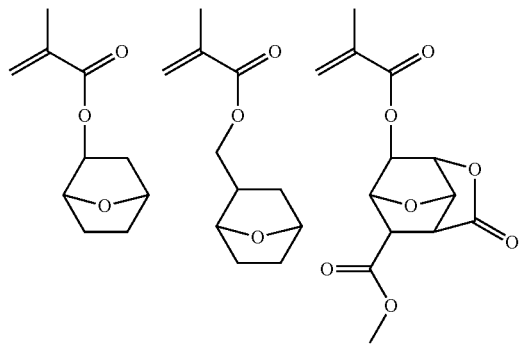

111
-continued
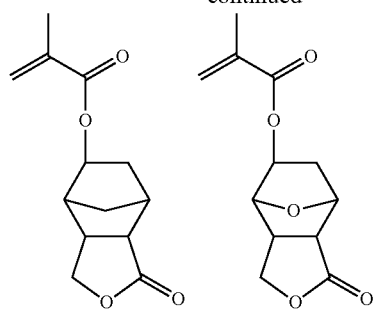
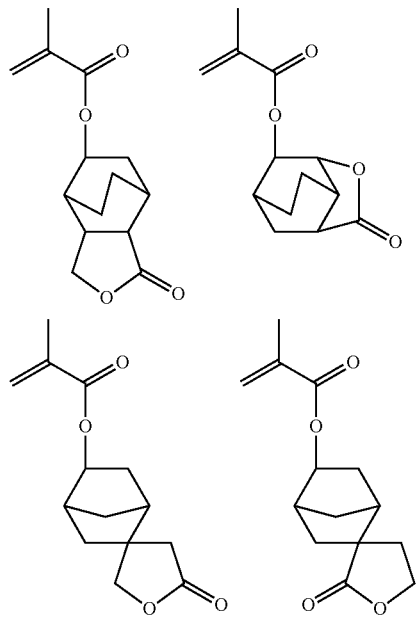
112
-continued
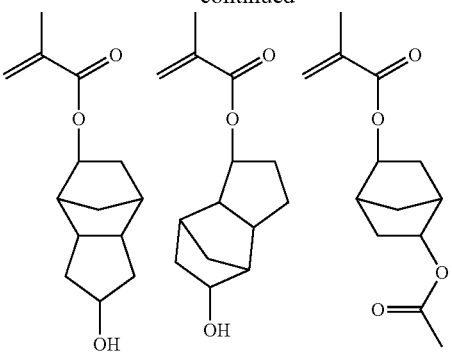
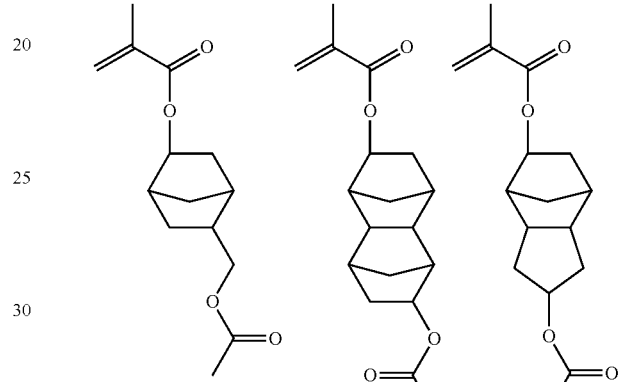
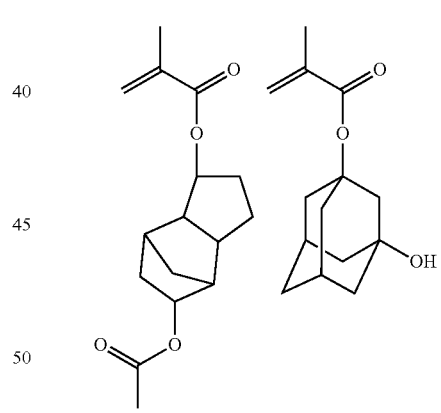
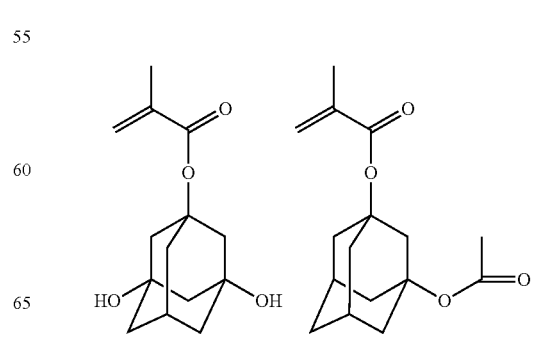

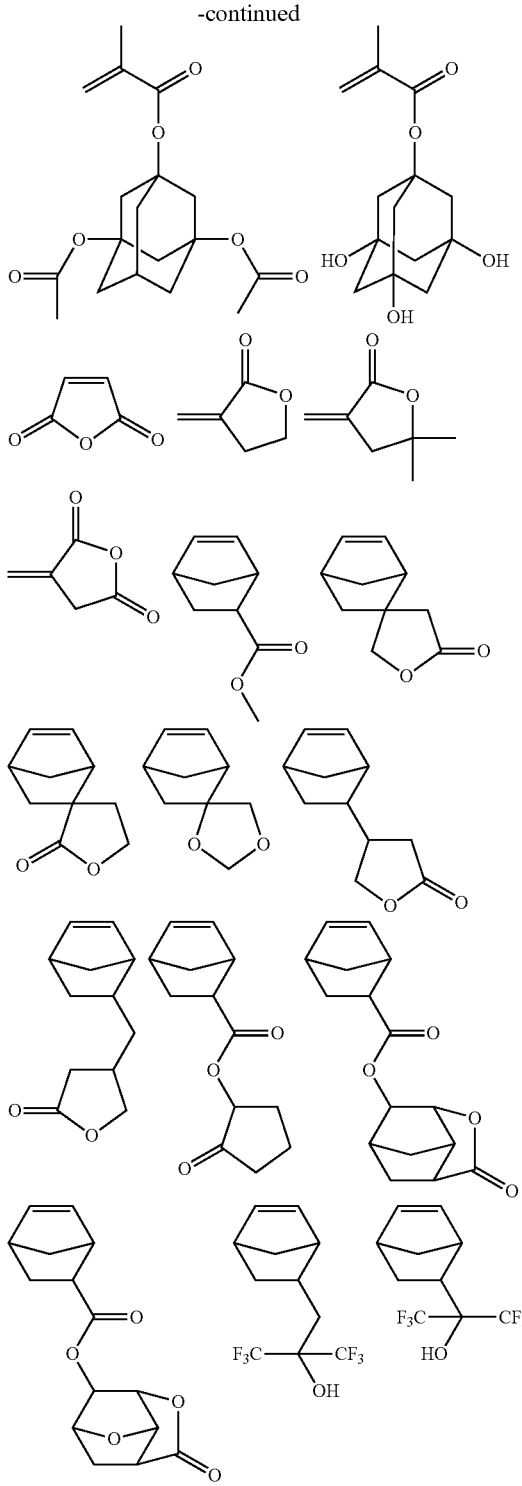
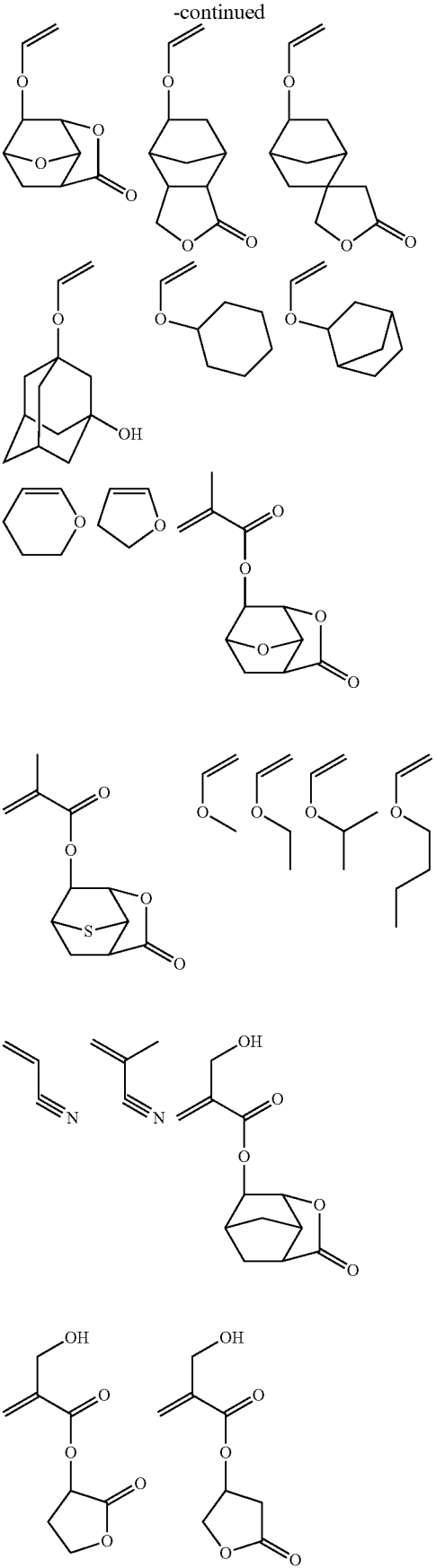

115
-continued
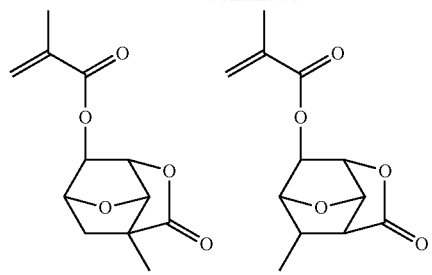
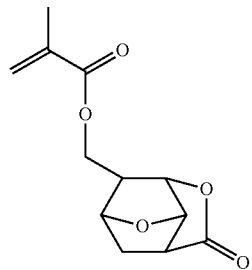
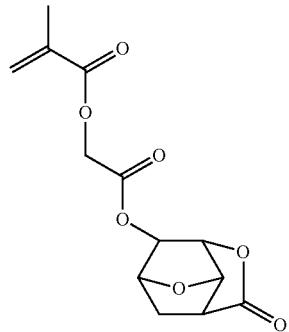
116
-continued
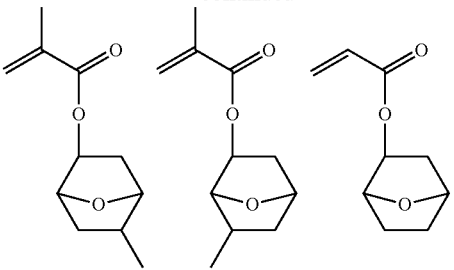
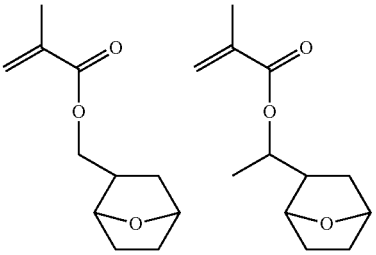
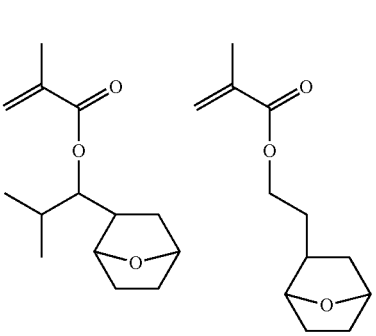
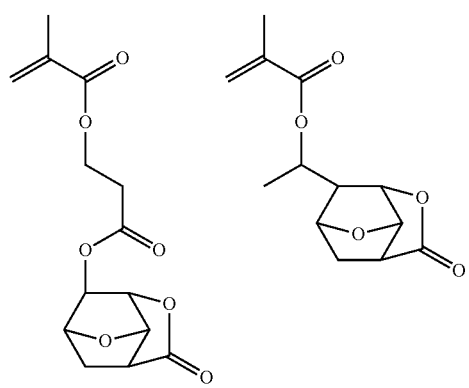
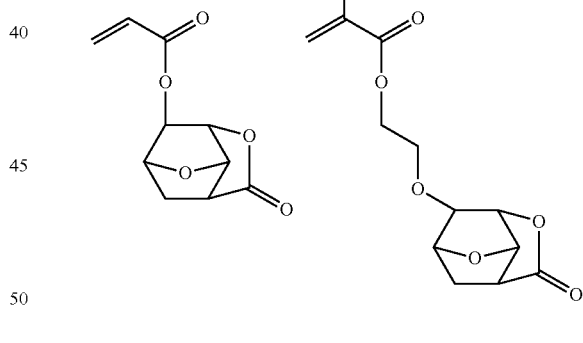
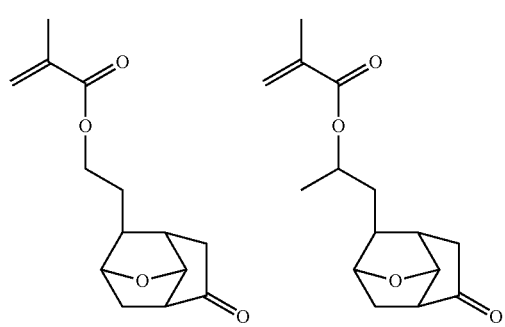
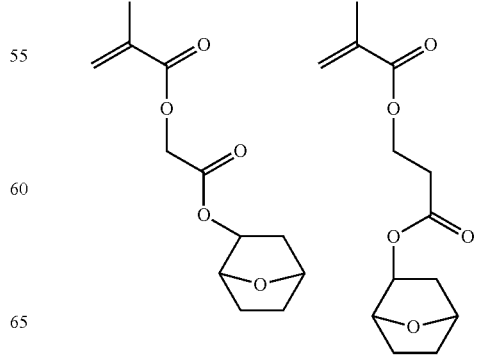

117
-continued
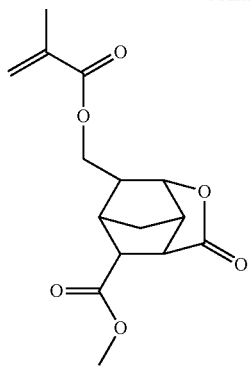
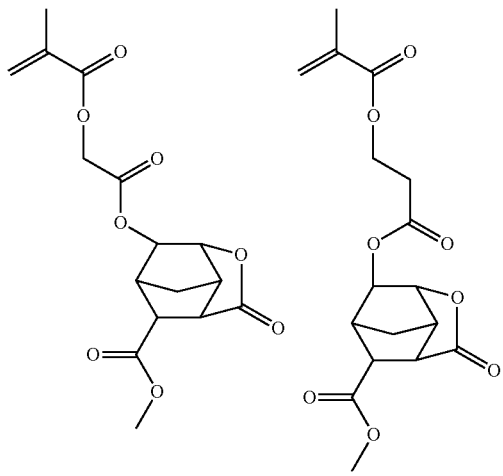
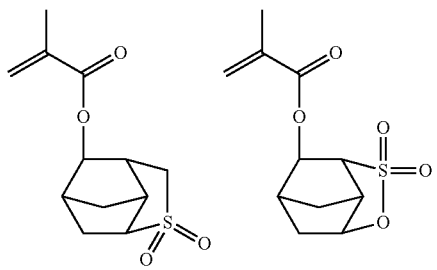
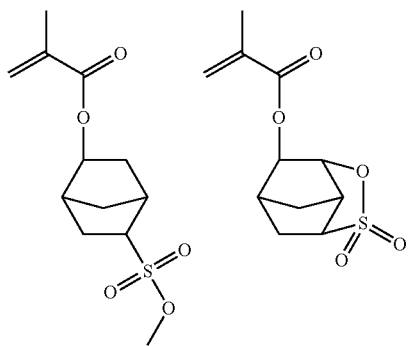
118
-continued
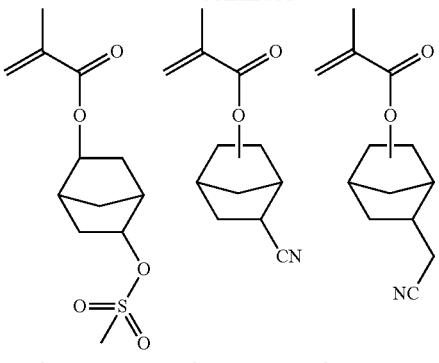
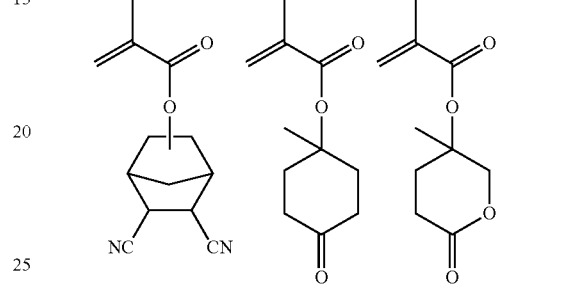
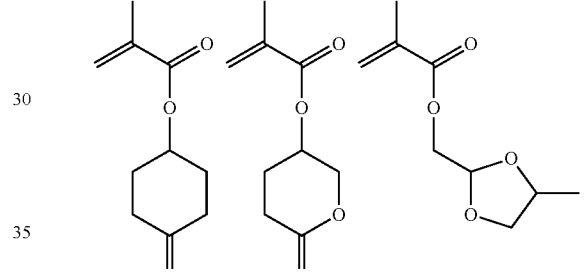
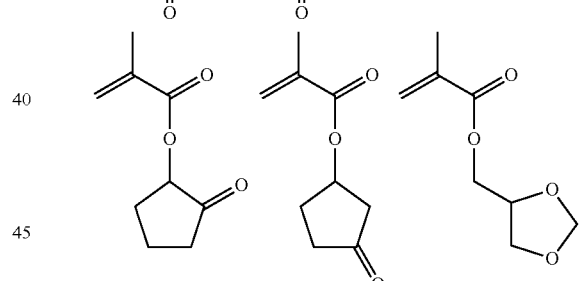
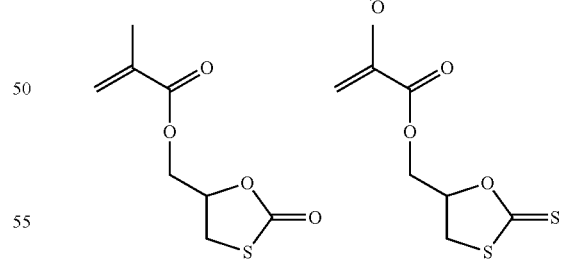
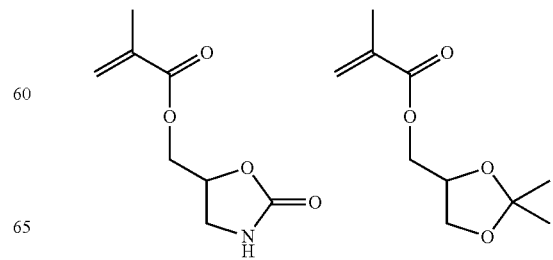

119
-continued
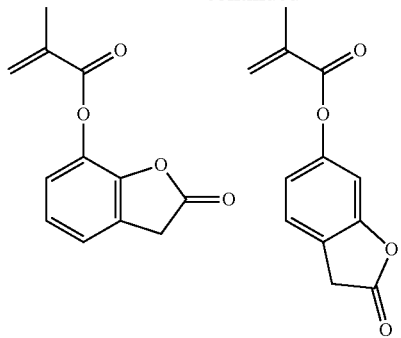
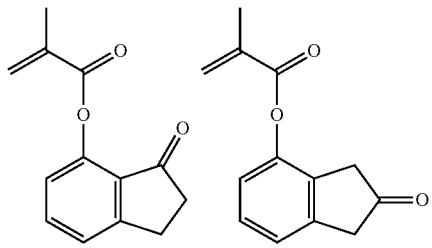
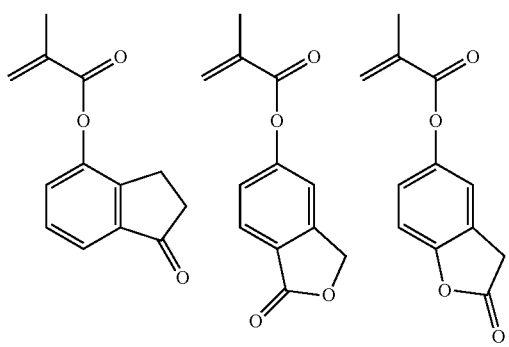
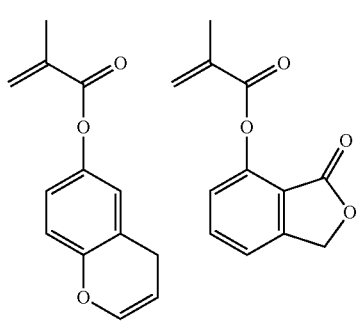
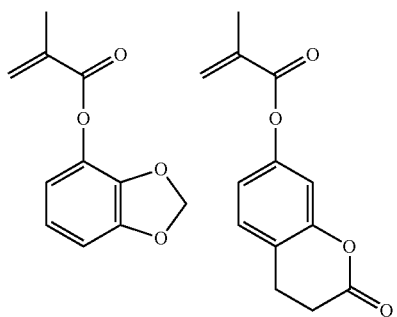
120
-continued
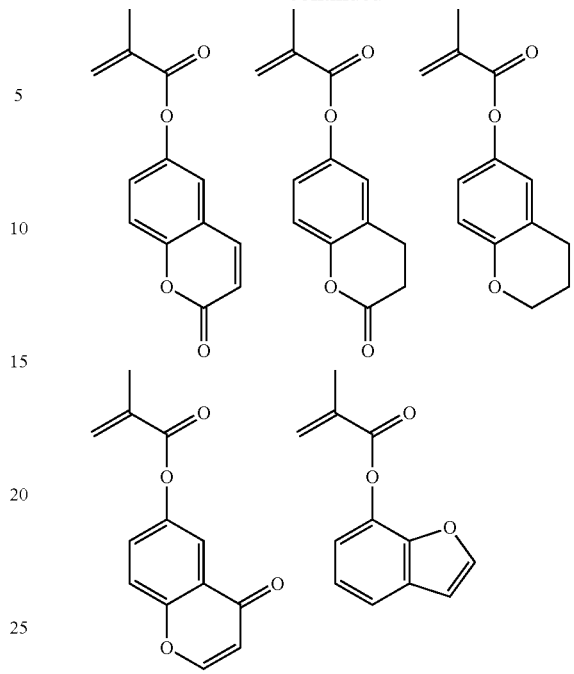
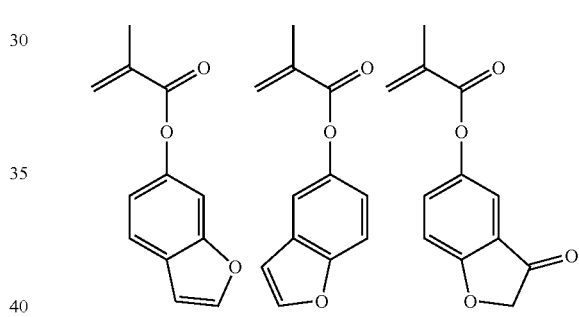
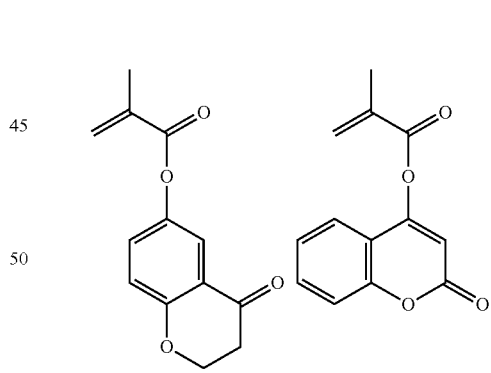
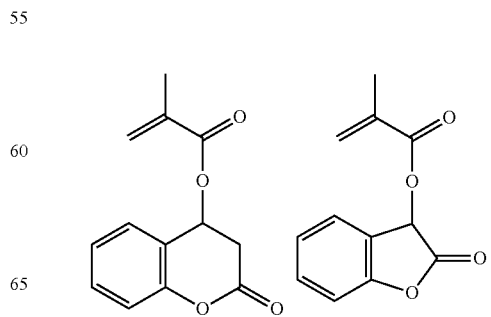

121
-continued
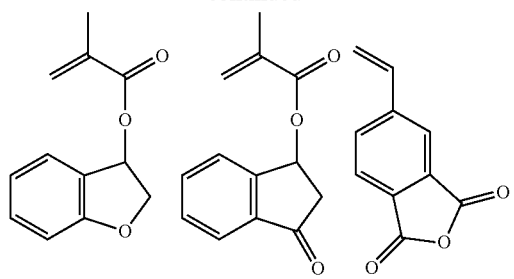
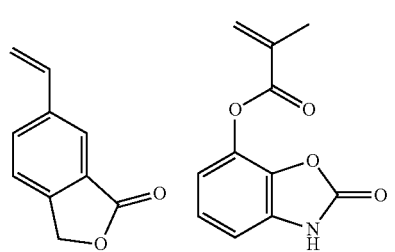
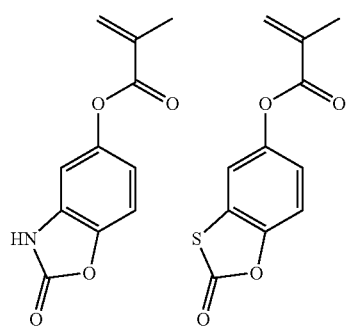
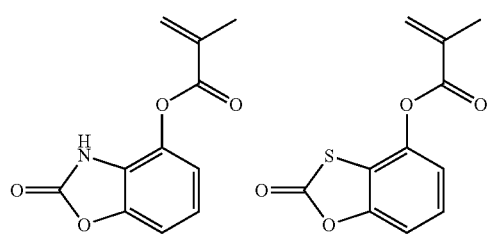
122
-continued
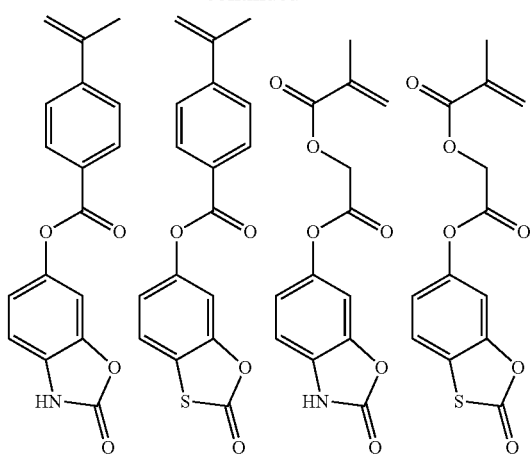
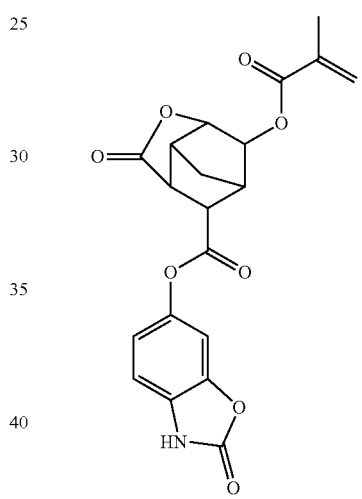
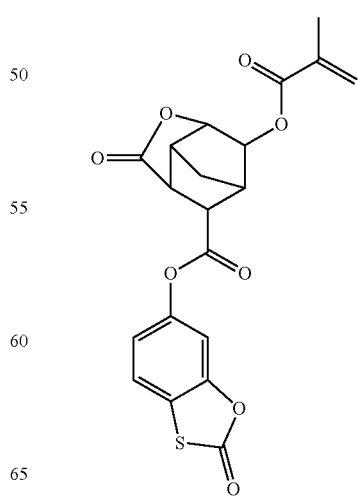

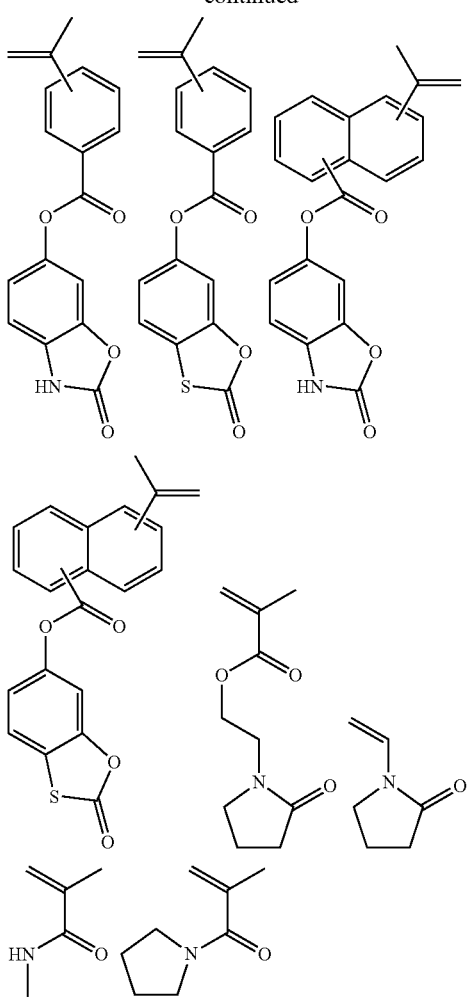

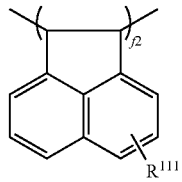
F2

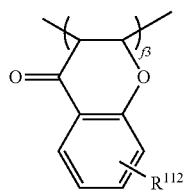
F3

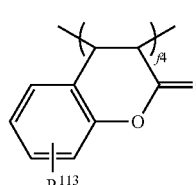
F4

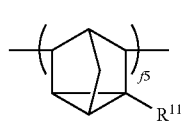
F5

In the case of a monomer having a hydroxyl group, the hydroxyl group may be replaced by an acetal group susceptible to deprotection with acid, typically ethoxyethoxy, prior to polymerization, and the polymerization be followed by deprotection with weak acid and water. Alternatively, the hydroxyl group may be replaced by an acetyl, formyl, pivaloyl or similar group prior to polymerization, and the polymerization be followed by alkaline hydrolysis.

The polymer may have further copolymerized therein recurring units of any type selected from indene units F1, acenaphthylene units F2, chromone units F3, coumarin units F4, and norbornadiene units F5 as represented by the general formula (3).

(3)

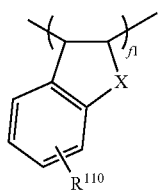
F1

Herein $R^{110}$ to $R^{114}$ each are hydrogen, $C_1$-$C_{30}$ alkyl, partially or entirely halo-substituted alkyl, hydroxyl, alkoxy, alkanoyl, alkoxycarbonyl, $C_6$-$C_{10}$ aryl, halogen, or 1,1,1,3,3,3-hexafluoro-2-propanol group; X is methylene, oxygen or sulfur atom. The molar fractions f1 to f5 of units F1 to F5 are in the range: $0 \leq f1 \leq 0.5$, $0 \leq f2 \leq 0.5$, $0 \leq f3 \leq 0.5$, $0 \leq f4 \leq 0.5$, $0 \leq f5 \leq 0.5$, and $0 \leq f1+f2+f3+f4+f5 \leq 0.5$; preferably $0 \leq f1 \leq 0.4$, $0 \leq f2 \leq 0.4$, $0 \leq f3 \leq 0.4$, $0-f4 \leq 0.4$, $0 \leq f5 \leq 0.4$, and $0 \leq f1+f2+f3+f4+f5 \leq 0.4$; and more preferably $0 \leq f1 \leq 0.3$, $0 \leq f2 \leq 0.3$, $0 \leq f3 \leq 0.3$, $0 \leq f4 \leq 0.3$, $0 \leq f5 \leq 0.3$, and $0 \leq f1+f2+f3+f4+f5 \leq 0.3$.

Besides the recurring units XA, B1, B2, C1, C2, D1 to D3, E, F1 to F5, additional recurring units G may be copolymerized in the polymer. Exemplary are recurring units G derived from styrene, vinylnaphthalene, vinylanthracene, vinylpyrene, methyleneindane, and the like. It is provided that g is a molar fraction of units G in the polymer.

The polymer disclosed herein may be synthesized by any desired methods, for example, by dissolving suitable monomers selected from the monomers to form the recurring units XA to G in an organic solvent, adding a radical polymerization initiator thereto, and effecting heat polymerization. Examples of the organic solvent which can be used for polymerization include toluene, benzene, tetrahydrofuran, diethyl ether, dioxane, cyclohexane, cyclopentane, methyl ethyl ketone, and γ-butyrolactone. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the system is heated at 50 to 80° C. for polymerization to take place. The reaction time is 2 to 100 hours, preferably 5 to 20 hours.

When hydroxystyrene or hydroxyvinylnaphthalene is copolymerized, an alternative method is possible. Specifically, acetoxystyrene or acetoxyvinylnaphthalene is used instead of hydroxystyrene or hydroxyvinylnaphthalene, and after polymerization, the acetoxy group is deprotected by alkaline hydrolysis as mentioned above, for thereby converting the polymer product to polyhydroxystyrene or hydroxypolyvinylnaphthalene. For alkaline hydrolysis, a base such as aqueous ammonia or triethylamine may be used. The reaction temperature is −20° C. to 100° C., preferably 0° C. to 60° C., and the reaction time is 0.2 to 100 hours, preferably 0.5 to 20 hours.

In the copolymer, recurring units XA to G may be incorporated in the following molar fraction:
$0<a<1.0$, $0\leq b1<1.0$, $0\leq b2<1.0$, $0<b1+b2<1.0$, $0\leq c1<1.0$, $0\leq c2<1.0$, $0<c1+c2<1.0$, $0\leq d1\leq 0.5$, $0\leq d2\leq 0.5$, $0\leq d3\leq 0.5$, $0\leq d1+d2+d3\leq 0.5$, $0\leq e\leq 0.9$, $0\leq f1+f2+f3+f4+f5\leq 0.5$, and $0\leq g\leq 0.5$;
preferably $0.1\leq a\leq 0.9$, $0\leq b1\leq 0.9$, $0\leq b2\leq 0.9$, $0<b1+b2<0.9$, $0\leq c1<0.8$, $0\leq c2<0.8$, $0<c1+c2<0.8$, $0\leq d1\leq 0.4$, $0\leq d2\leq 0.4$, $0\leq d3\leq 0.4$, $0\leq d1+d2+d3\leq 0.4$, $0<e<0.8$, $0\leq f1+f2+f3+f4+f5\leq 0.4$, and $0\leq g\leq 0.4$; and
more preferably $0.15\leq a\leq 0.8$, $0\leq b1\leq 0.8$, $0\leq b2\leq 0.8$, $0<b1+b2\leq 0.8$, $0\leq c1\leq 0.7$, $0\leq c2\leq 0.7$, $0<c1+c2\leq 0.7$, $0\leq d1\leq 0.35$, $0\leq d2\leq 0.35$, $0\leq d3\leq 0.35$, $0\leq d1+d2+d3\leq 0.35$, $0<e\leq 0.7$, $0\leq f1+f2+f3+f4+f5\leq 0.3$, and $0\leq g\leq 0.3$, provided that $a+b1+b2+c1+c2+d1+d2+d3+e+f1+f2+f3+f4+f5+g=1$.

The polymer serving as the base resin in the positive resist composition should have a weight average molecular weight (Mw) in the range of 1,000 to 500,000, and preferably 2,000 to 30,000, as measured by gel permeation chromatography (GPC) versus polystyrene standards using tetrahydrofuran as a solvent. With too low a Mw, the resist composition becomes less heat resistant. A polymer with too high a Mw loses alkaline solubility and is likely to give rise to a footing phenomenon after pattern formation.

If a multi-component polymer has a wide molecular weight distribution or dispersity (Mw/Mn), which indicates the presence of lower and higher molecular weight polymer fractions, there is a possibility that foreign matter is left on the pattern or the pattern profile is degraded. The influences of molecular weight and dispersity become stronger as the pattern rule becomes finer. Therefore, the multi-component copolymer should preferably have a narrow dispersity (Mw/Mn) of 1.0 to 2.0, especially 1.0 to 1.5, in order to provide a resist composition suitable for micropatterning to a small feature size.

It is understood that a blend of two or more polymers which differ in compositional ratio, molecular weight or dispersity is acceptable as well as a blend of an inventive polymer and a polymer free of recurring units XA.

Another embodiment is a positive resist composition, typically chemically amplified positive resist composition comprising the polymer defined above as base resin. Specifically, the polymer is used as base resin and combined with any desired components including an organic solvent, acid generator, dissolution regulator, basic compound, surfactant, and acetylene alcohol to formulate a resist composition.

The acid generator used herein is typically a photoacid generator (PAG) capable of generating an acid in response to actinic light or radiation. It is any compound capable of generating an acid upon exposure to high-energy radiation. Suitable PAGs include sulfonium salts, iodonium salts, sulfonyldiazomethane, N-sulfonyloxyimide, and oxime-O-sulfonate acid generators. The acid generators may be used alone or in admixture of two or more. Exemplary acid generators are described in U.S. Pat. No. 7,537,880 (JP-A 2008-111103, paragraphs [0122] to [0142]). Understandably, where the polymer contains recurring units D1, D2 or D3, the addition of the acid generator may be omitted.

Examples of the organic solvent used herein are described in JP-A 2008-111103, paragraphs [0144] to [0145](U.S. Pat. No. 7,537,880). Exemplary basic compounds are described in JP-A 2008-111103, paragraphs [0146] to [0164]. Exemplary surfactants are described in JP-A 2008-111103, paragraphs [0165] to [0166]. Exemplary dissolution regulators are described in JP-A 2008-122932 (US 2008090172), paragraphs [0155] to [0178], and exemplary acetylene alcohols in paragraphs [0179] to [0182]. Also useful are quenchers of polymer type as described in JP-A 2008-239918. The polymeric quencher segregates at the resist surface after coating and thus enhances the rectangularity of resist pattern. When a protective film is applied, the polymeric quencher is also effective for preventing a film loss of resist pattern or rounding of pattern top.

An appropriate amount of the acid generator used is 0.01 to 100 parts, and preferably 0.1 to 80 parts. An appropriate amount of the organic solvent used is 50 to 10,000 parts, especially 100 to 5,000 parts. The dissolution regulator may be blended in an amount of 0 to 50 parts, preferably 0 to 40 parts, the basic compound in an amount of 0 to 100 parts, preferably 0.001 to 50 parts, and the surfactant in an amount of 0 to 10 parts, preferably 0.0001 to 5 parts. All amounts are expressed in parts by weight relative to 100 parts by weight of the base resin.

The polymer is advantageously used as a base resin in a positive resist composition, typically chemically amplified positive resist composition. Specifically, the polymer is used as a base resin and combined with any desired components including an organic solvent, acid generator, dissolution regulator, basic compound, surfactant, and acetylene alcohol to formulate a resist composition. This resist composition has a very high sensitivity in that the dissolution rate in developer of the polymer in exposed areas is accelerated by catalytic reaction. In addition, the resist film has a high dissolution contrast, resolution, exposure latitude, and process adaptability, and provides a good pattern profile after exposure, yet better etching resistance, and minimal proximity bias because of restrained acid diffusion. By virtue of these advantages, the composition is fully useful in commercial application and suited as a pattern-forming material for the fabrication of VLSIs or photomasks. Particularly when an acid generator is added to formulate a chemically amplified positive resist composition capable of utilizing acid catalyzed reaction, the composition is quite useful because of a higher sensitivity and more improved other properties.

Inclusion of a dissolution regulator may lead to an increased difference in dissolution rate between exposed and unexposed areas and a further improvement in resolution. Addition of a basic compound may be effective in suppressing the diffusion rate of acid in the resist film, achieving a further improvement in resolution. Addition of a surfactant may improve or control the coating characteristics of the resist composition.

Process

The positive resist composition, typically chemically amplified positive resist composition comprising a polymer of formula (1), acid generator and basic compound in an organic solvent is used in the fabrication of various integrated circuits. Pattern formation using the resist composition may be performed by well-known lithography processes. The process generally involves coating, heat treatment (or prebaking), exposure, heat treatment (PEB), and development. If necessary, any additional steps may be added.

The resist composition is first applied onto a substrate on which an integrated circuit is to be formed (e.g., Si, $SiO_2$, SiN, SiON, TiN, WSi, BPSG, SOG, or organic antireflective coating) or a substrate on which a mask circuit is to be formed (e.g., Cr, CrO, CrON, or MoSi) by a suitable coating technique such as spin coating, roll coating, flow coating, dip coating, spray coating or doctor coating. The coating is prebaked on a hot plate at a temperature of 60 to 150° C. for 10 seconds to 30 minutes, preferably 80 to 120° C. for 30 seconds to 20 minutes. The resulting resist film is generally 0.1 to 2.0 μm thick.

If desired, a protective film may be formed on the resist film. The protective film is preferably formed of an alkaline developer-soluble composition so that formation of a resist pattern and stripping of the protective film may be simultaneously achieved during development. The protective film has the functions of restraining outgassing from the resist film, filtering or cutting off out-of-band (OOB) light having a wavelength of 140 to 300 nm emitted by the EUV laser (other than 13.5 nm), and preventing the resist film from assuming T-top profile or from losing its thickness under environmental impacts.

The resist film is then exposed to a desired pattern of high-energy radiation such as UV, deep-UV, EB, x-ray, excimer laser light, γ-ray, synchrotron radiation or EUV (soft x-ray), directly or through a mask. The exposure dose is preferably about 1 to 200 mJ/cm$^2$, more preferably about 10 to 100 mJ/cm$^2$, or 0.1 to 100 μC/cm$^2$, more preferably 0.5 to 50 μC/cm$^2$. The resist film is further baked (PEB) on a hot plate at 60 to 150° C. for 10 seconds to 30 minutes, preferably 80 to 120° C. for 30 seconds to 20 minutes.

Thereafter the resist film is developed in a developer in the form of an aqueous base solution for 3 seconds to 3 minutes, preferably 5 seconds to 2 minutes by conventional techniques such as dip, puddle or spray techniques. Suitable developers are 0.1 to 10 wt %, preferably 2 to 5 wt % aqueous solutions of tetramethylammonium hydroxide (TMAH), tetraethylammonium hydroxide (TEAH), tetrapropylammonium hydroxide (TPAH) and tetrabutylammonium hydroxide (TBAH). The resist film in the exposed area is dissolved in the developer whereas the resist film in the unexposed area is not dissolved. In this way, the desired positive pattern is formed on the substrate. It is appreciated that the resist composition of the invention is best suited for micro-patterning using high-energy radiation, typically EB, EUV (soft x-ray), x-ray, γ-ray or synchrotron radiation.

Although TMAH aqueous solution is generally used as the developer, TEAH, TPAH and TBAH having a longer alkyl chain are effective in inhibiting the resist film from being swollen during development and thus preventing pattern collapse. JP 3429592 describes an example using an aqueous TBAH solution for the development of a polymer comprising recurring units having an alicyclic structure such as adamantane methacrylate and recurring units having an acid labile group such as tert-butyl methacrylate, the polymer being water repellent due to the absence of hydrophilic groups.

The TMAH developer is most often used as 2.38 wt % aqueous solution, which corresponds to 0.26N. The TEAH, TPAH, and TBAH aqueous solutions should preferably have an equivalent normality. The concentration of TEAH, TPAH, and TBAH that corresponds to 0.26N is 3.84 wt %, 5.31 wt %, and 6.78 wt %, respectively.

When a pattern with a line size of 32 nm or less is resolved by the EB and EUV lithography, there arises a phenomenon that lines become wavy, lines merge together, and merged lines collapse. It is believed that this phenomenon occurs because lines are swollen in the developer and the thus expanded lines merge together. Since the swollen lines containing liquid developer are as soft as sponge, they readily collapse under the stress of rinsing. For this reason, the developer using a long-chain alkyl developing agent is effective for preventing film swell and hence, pattern collapse.

EXAMPLE

Synthesis Examples, Comparative Synthesis Examples, Examples and Comparative Examples are given below for further illustrating the invention, but they should not be construed as limiting the invention thereto. Mw is a weight average molecular weight as measured by gel permeation chromatography (GPC) versus polystyrene standards using tetrahydrofuran as a solvent, and Mw/Mn designates molecular weight distribution or dispersity. All parts (pbw) are by weight.

Synthesis Example 1

Synthesis of Polymer 1

In a nitrogen atmosphere, 38 g of 2,3-dimethyl-5-oxotetrahydrofuran-3-yl methacrylate, 40 g of 1-methylcyclohexan-1-yl methacrylate, 13 g of 3-hydroxyadamantan-1-yl methacrylate, 8.1 g of 4,4,4-trifluoro-3-trifluoromethyl-3-hydroxy-2-methylbutan-2-yl methacrylate, and 6.4 g of dimethyl 2,2'-azobisisobutyrate were dissolved in 183 g of methyl ethyl ketone (MEK). With stirring in a nitrogen atmosphere, the solution was added dropwise to 50 g of MEK at 80° C. over 4 hours. After the completion of dropwise addition, stirring was continued at 80° C. for 2 hours. The polymerization solution was cooled to room temperature and added dropwise to 1,500 g of hexane. The solid precipitate was collected by filtration, washed with 1,000 g of hexane, and vacuum dried at 60° C. for 20 hours. A polymer was obtained as white powder solid. Amount 86 g, yield 87%. This is designated Polymer 1.

Polymer 1

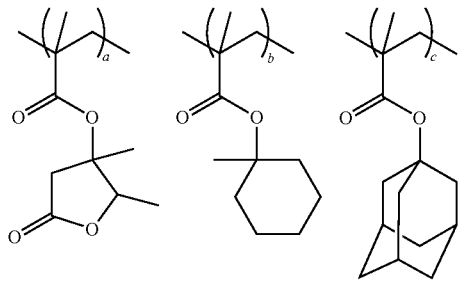

(a = 0.35, b = 0.50, c = 0.10, d = 0.05, Mw = 8,400)

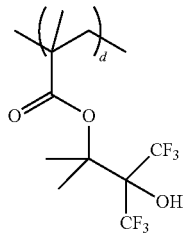

Synthesis Examples 2 to 15 and Comparative Synthesis Examples 1 to 8

Synthesis of Polymers 2 to 15 and Comparative Polymers 1 to 8

A series of polymers (Polymers 2 to 15 and Comparative Polymers 1 to 8) were prepared by the same procedure as in Synthesis Example 1 except that the type and amount of monomers were changed.

Polymer 2
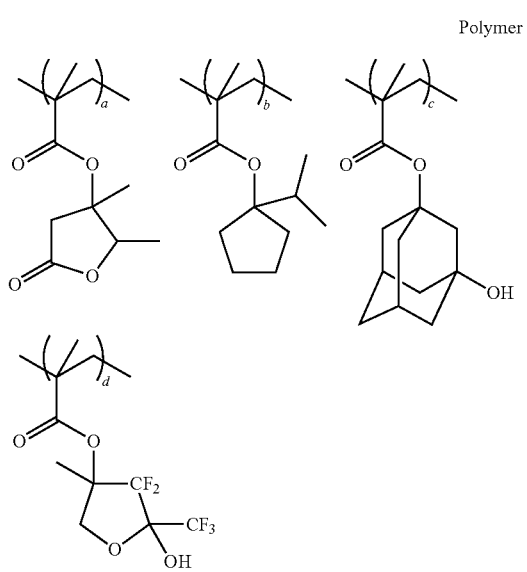
(a = 0.35, b = 0.50, c = 0.10, d = 0.05, Mw = 8,200)
Polymer 3
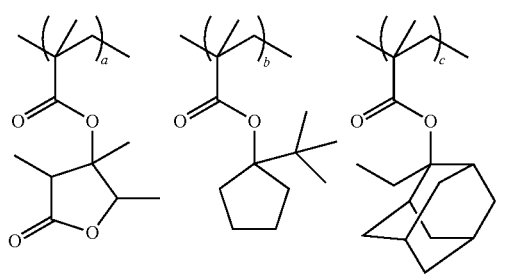
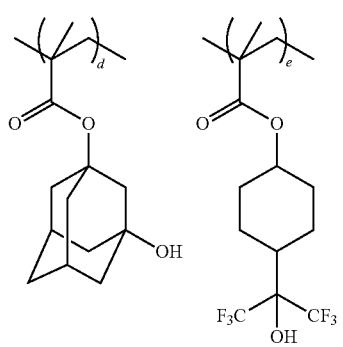
(a = 0.35, b = 0.35, c = 0.15, d = 0.10, e = 0.05, Mw = 8,100)
Polymer 4
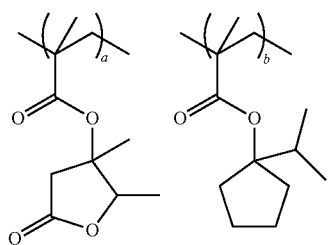
-continued
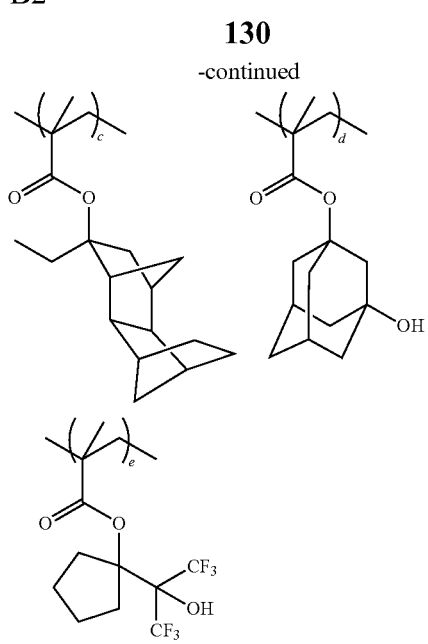
(a = 0.35, b = 0.40, c = 0.10, d = 0.10, e = 0.05, Mw = 8,200)
Polymer 5
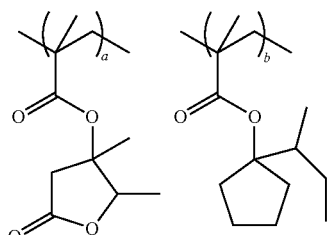
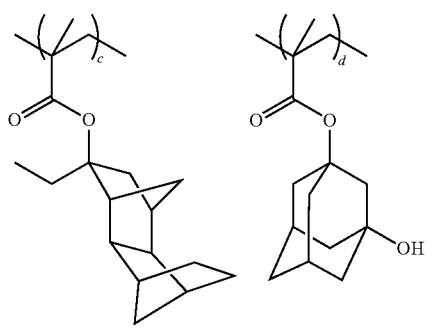
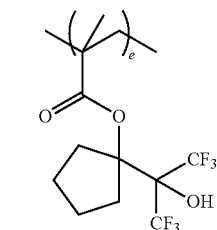
(a = 0.35, b = 0.40, c = 0.10, d = 0.10, e = 0.05, Mw = 8,200)

Polymer 6
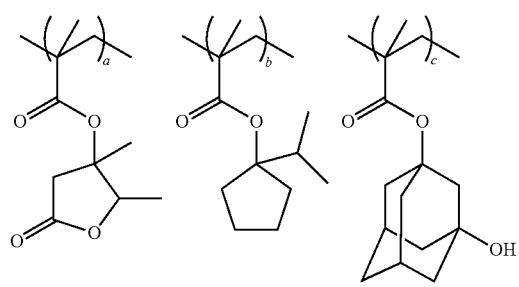
(a = 0.25, b = 0.50, c = 0.10, d = 0.10, e = 0.05, Mw = 7,900)
Polymer 7
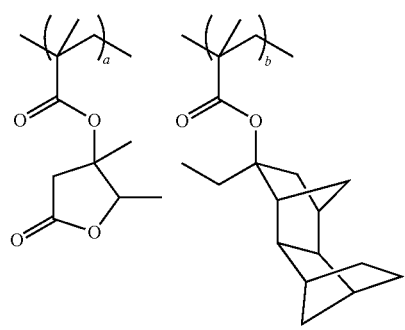
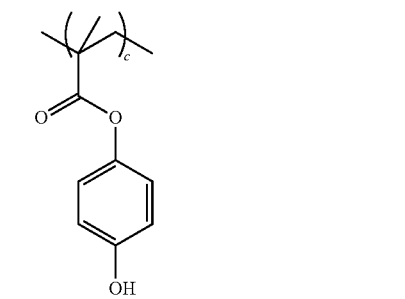
(a = 0.50, b = 0.30, c = 0.20, Mw = 8,300)
Polymer 8
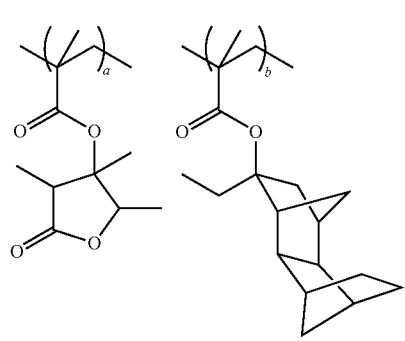
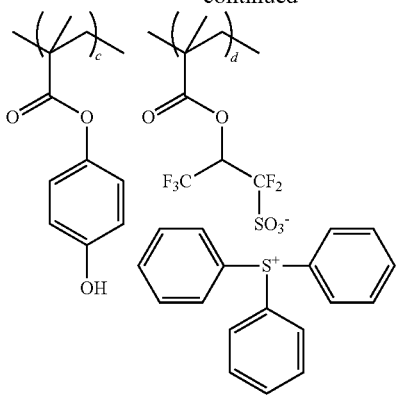
(a = 0.30, b = 0.30, c = 0.30, d = 0.10, Mw = 7,900)
Polymer 9
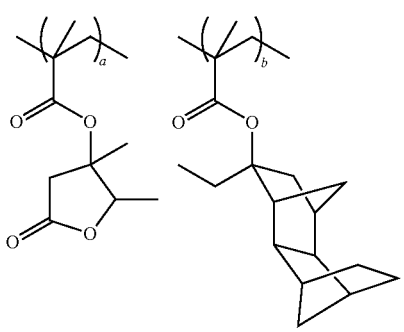
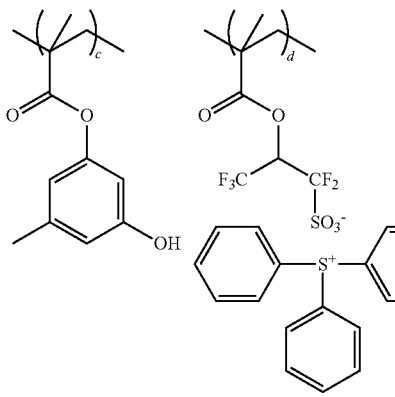
(a = 0.20, b = 0.30, c = 0.40, d = 0.10, Mw = 8,000)
Polymer 10
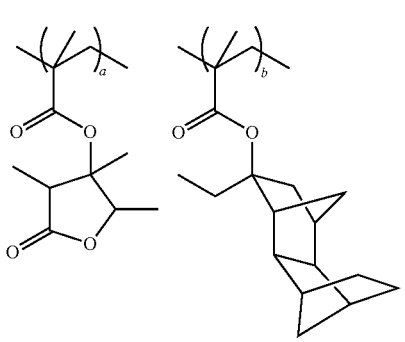

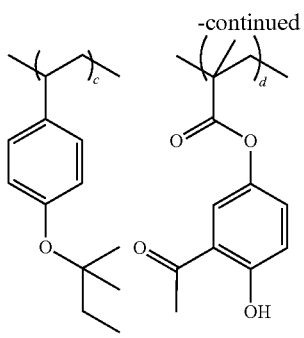
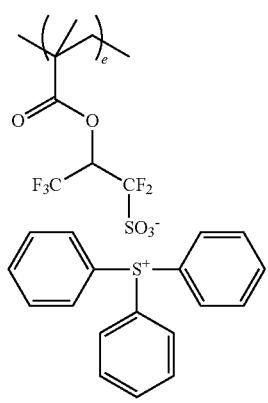
(a = 0.25, b = 0.20, c = 0.15,
d = 0.30, e = 0.10, Mw = 8,400)
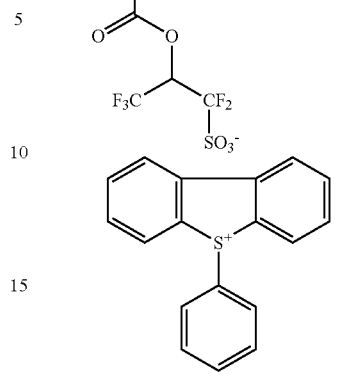
(a = 0.25, b = 0.20, c = 0.15,
d = 0.30, e = 0.10, Mw = 8,100)
Polymer 11
Polymer 12
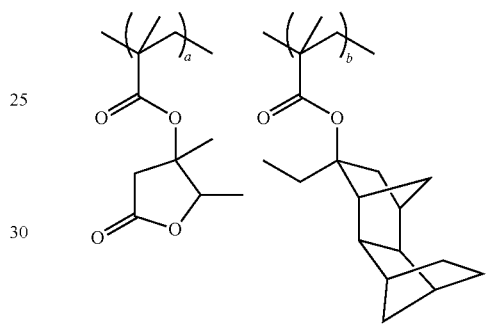
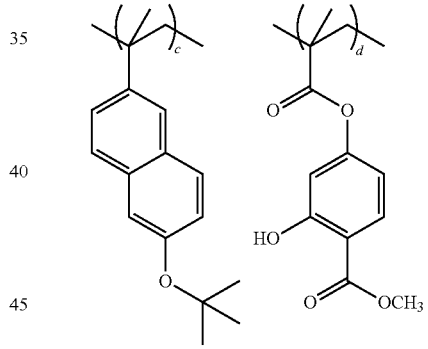
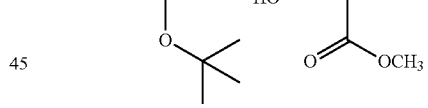
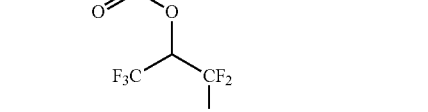
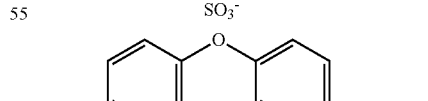
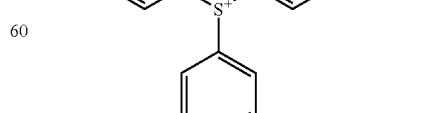
(a = 0.25, b = 0.20, c = 0.15,
d = 0.30, e = 0.10, Mw = 7,900)

Polymer 13
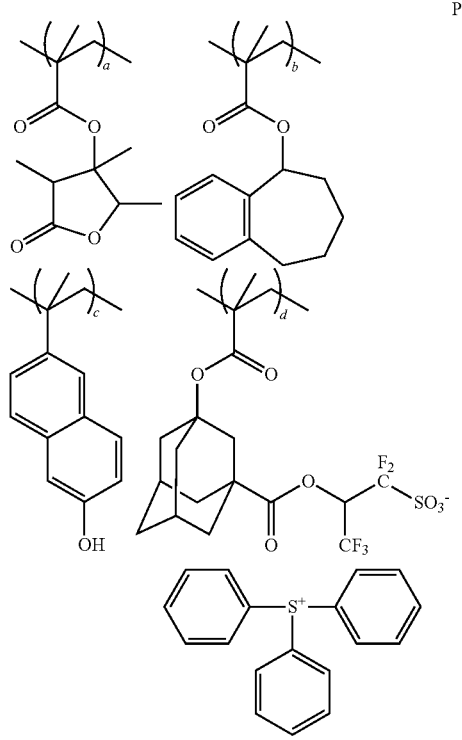
(a = 0.30, b = 0.30, c = 0.30, d = 0.10, Mw = 8,200)
Polymer 14
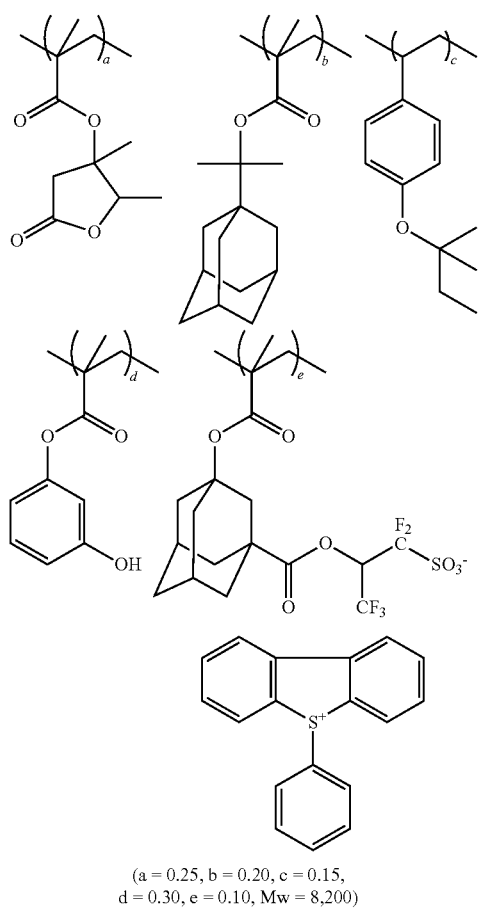
(a = 0.25, b = 0.20, c = 0.15, d = 0.30, e = 0.10, Mw = 8,200)
Polymer 15
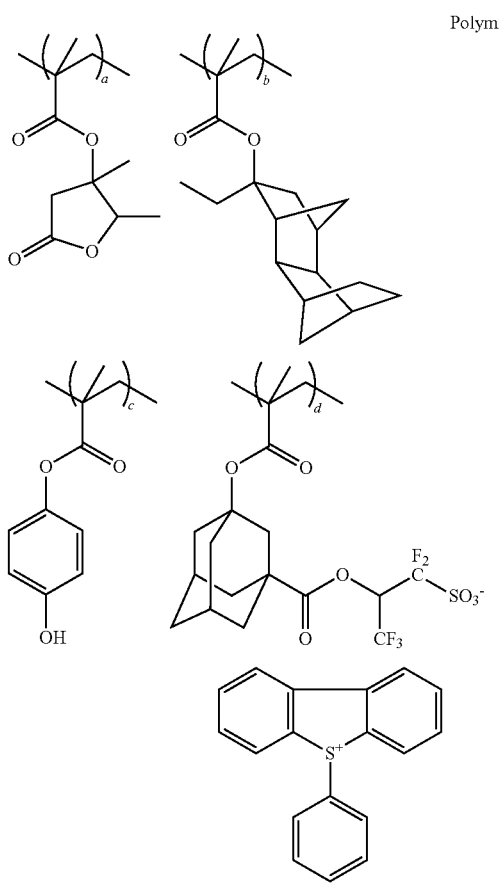
(a = 0.35, b = 0.30, c = 0.20, d = 0.15, Mw = 8,900)
Comparative Polymer 1
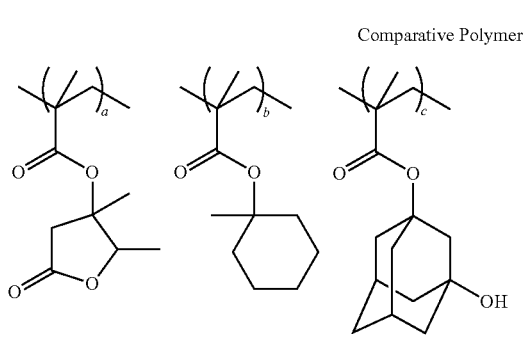
(a = 0.40, b = 0.50, c = 0.10, Mw = 8,600)
Comparative Polymer 2
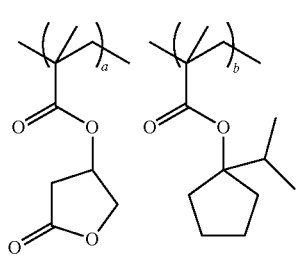

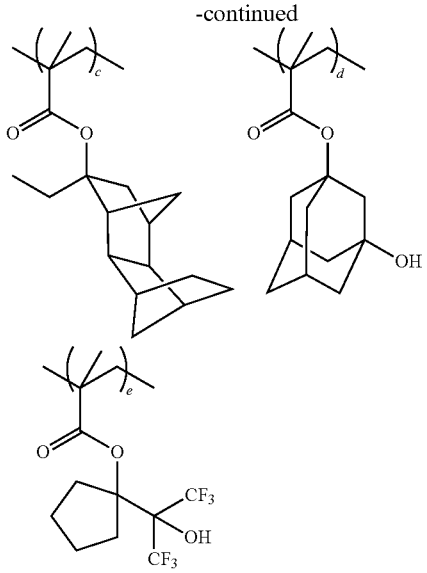
(a = 0.35, b = 0.40, c = 0.10, d = 0.10, e = 0.05, Mw = 8,200)
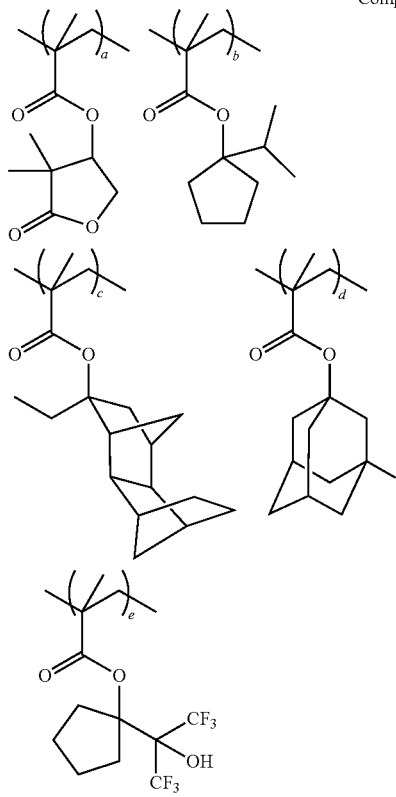
(a = 0.35, b = 0.40, c = 0.10, d = 0.10, e = 0.05, Mw = 8,400)
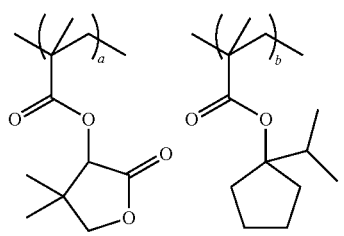
Comparative Polymer 3
Comparative Polymer 4
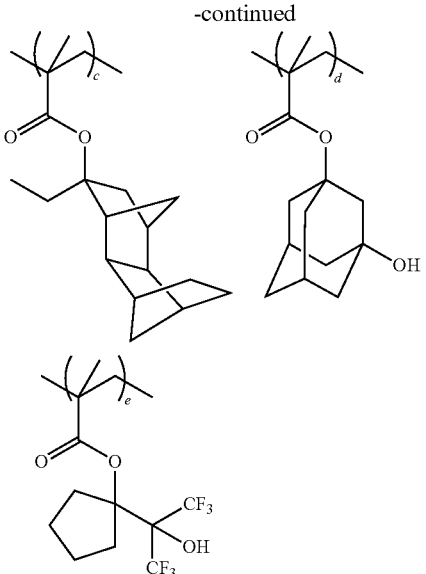
(a = 0.35, b = 0.40, c = 0.10, d = 0.10, e = 0.05, Mw = 8,100)
Comparative Polymer 5
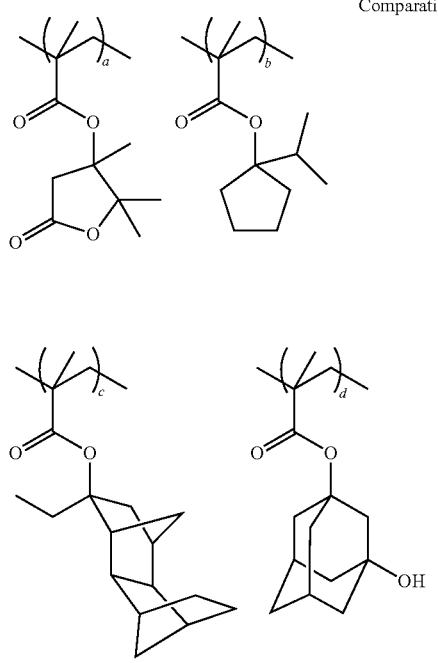
(a = 0.35, b = 0.40, c = 0.10, d = 0.10, e = 0.05, Mw = 8,200)

Comparative Polymer 6

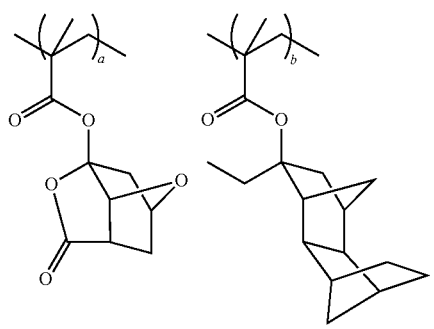

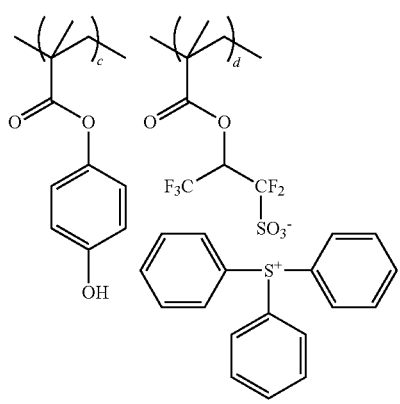

(a = 0.30, b = 0.30, c = 0.30, d = 0.10, Mw = 8,300)

Comparative Polymer 7

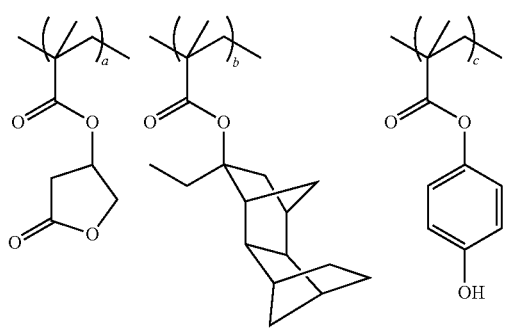

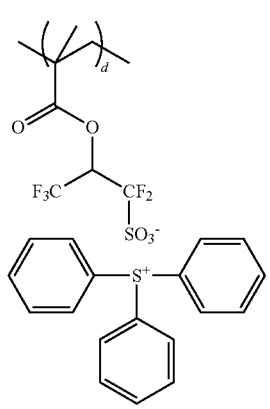

(a = 0.30, b = 0.30, c = 0.30, d = 0.10, Mw = 8,300)

Comparative Polymer 8

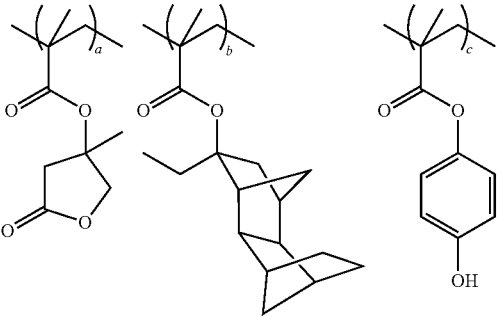

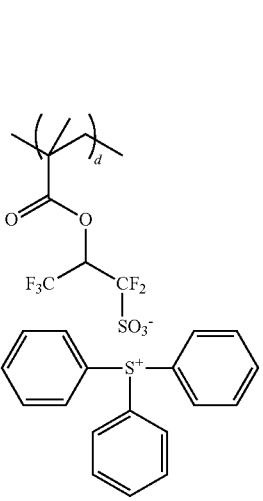

(a = 0.30, b = 0.30, c = 0.30, d = 0.10, Mw = 8,300)

Examples 1-1 to 1-15 and Comparative Examples 1-1 to 1-8

Preparation of Resist Solution

Positive resist compositions were prepared by dissolving each of the polymers synthesized above, photoacid generator (PAG), quencher and water-repellent polymer in a solvent in accordance with the recipe shown in Table 1, and filtering through a filter having a pore size of 0.2 μm. The solvent contained 100 ppm of a surfactant FC-4430 (3M Sumitomo Co., Ltd.).

The components in Table 1 are as identified below.

Polymers 1 to 15: polymers synthesized in Synthesis Examples 1 to 15

Comparative Polymers 1 to 8:
polymers synthesized in Comparative Synthesis Examples 1 to 8

Organic solvents: propylene glycol monomethyl ether acetate (PGMEA)
propylene glycol monomethyl ether (PGME)
cyclohexanone (CyH)

Acid generator: PAG1 of the structural formula shown below

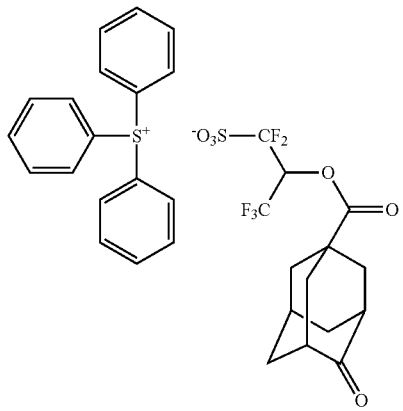

Quencher: Quenchers 1 and 2 of the structural formula shown below

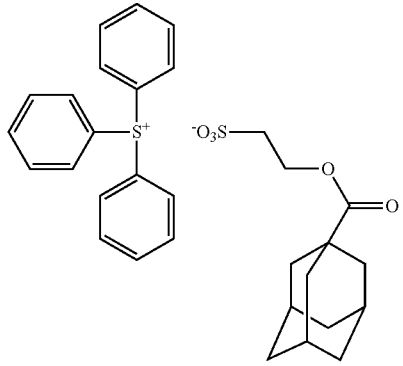

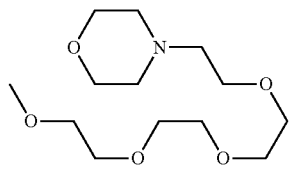

Water-repellent polymer:
SF-1 of the structural formula shown below

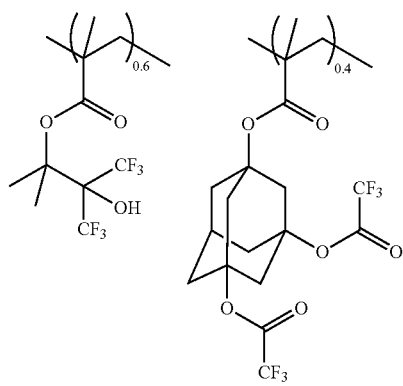

Mw = 8,000
Mw/Mn = 1.77

TABLE 1

|  |  | Resist | Resin (pbw) | PAG (pbw) | Quencher (pbw) | Water-repellent polymer (pbw) | Organic solvent (pbw) |
|---|---|---|---|---|---|---|---|
| Example | 1-1 | R-01 | Polymer 1 (100) | PAG 1 (6.0) | Quencher 1 (6.0) | SF-1 (4.0) | PGMEA (2,000) CyH (500) |
|  | 1-2 | R-02 | Polymer 2 (100) | PAG 1 (6.0) | Quencher 1 (6.0) | SF-1 (4.0) | PGMEA (2,000) CyH (500) |
|  | 1-3 | R-03 | Polymer 3 (100) | PAG 1 (6.0) | Quencher 1 (6.0) | SF-1 (4.0) | PGMEA (2,000) CyH (500) |
|  | 1-4 | R-04 | Polymer 4 (100) | PAG 1 (6.0) | Quencher 1 (6.0) | SF-1 (4.0) | PGMEA (2,000) CyH (500) |
|  | 1-5 | R-05 | Polymer 5 (100) | PAG 1 (6.0) | Quencher 1 (6.0) | SF-1 (4.0) | PGMEA (2,000) CyH (500) |
|  | 1-6 | R-06 | Polymer 6 (100) | PAG 1 (6.0) | Quencher 1 (6.0) | SF-1 (4.0) | PGMEA (2,000) CyH (500) |
|  | 1-7 | R-07 | Polymer 7 (100) | PAG 1 (6.0) | Quencher 2 (0.8) | — | PGMEA (500) CyH (1,450) PGME (50) |
|  | 1-8 | R-08 | Polymer 8 (100) | — | Quencher 2 (0.8) | — | PGMEA (500) CyH (1,450) PGME (50) |
|  | 1-9 | R-09 | Polymer 9 (100) | — | Quencher 2 (0.8) | — | PGMEA (500) CyH (1,450) PGME (50) |
|  | 1-10 | R-10 | Polymer 10 (100) | — | Quencher 2 (0.8) | — | PGMEA (500) CyH (1,450) PGME (50) |
|  | 1-11 | R-11 | Polymer 11 (100) | — | Quencher 2 (0.8) | — | PGMEA (500) CyH (1,450) PGME (50) |

TABLE 1-continued

| | | Resist | Resin (pbw) | PAG (pbw) | Quencher (pbw) | Water-repellent polymer (pbw) | Organic solvent (pbw) |
|---|---|---|---|---|---|---|---|
| | 1-12 | R-12 | Polymer 12 (100) | — | Quencher 2 (0.8) | — | PGMEA (500) CyH (1,450) PGME (50) |
| | 1-13 | R-13 | Polymer 13 (100) | — | Quencher 2 (0.8) | — | PGMEA (500) CyH (1,450) PGME (50) |
| | 1-14 | R-14 | Polymer 14 (100) | — | Quencher 2 (0.8) | — | PGMEA (500) CyH (1,450) PGME (50) |
| | 1-15 | R-15 | Polymer 15 (100) | — | Quencher 2 (0.8) | — | PGMEA (500) CyH (1,450) PGME (50) |
| Comparative Example | 1-1 | R-16 | Comparative Polymer 1 (100) | PAG1 (6.0) | Quencher 1 (6.0) | SF-1 (4.0) | PGMEA (2,000) CyH (500) |
| | 1-2 | R-17 | Comparative Polymer 2 (100) | PAG1 (6.0) | Quencher 1 (6.0) | SF-1 (4.0) | PGMEA (2,000) CyH (500) |
| | 1-3 | R-18 | Comparative Polymer 3 (100) | PAG1 (6.0) | Quencher 1 (6.0) | SF-1 (4.0) | PGMEA (2,000) CyH (500) |
| | 1-4 | R-19 | Comparative Polymer 4 (100) | PAG1 (6.0) | Quencher 1 (6.0) | SF-1 (4.0) | PGMEA (2,000) CyH (500) |
| | 1-5 | R-20 | Comparative Polymer 5 (100) | PAG1 (6.0) | Quencher 1 (6.0) | SF-1 (4.0) | PGMEA (2,000) CyH (500) |
| | 1-6 | R-21 | Comparative Polymer 6 (100) | — | Quencher 2 (0.8) | — | PGMEA (500) CyH (1,450) PGME (50) |
| | 1-7 | R-22 | Comparative Polymer 7 (100) | — | Quencher 2 (0.8) | — | PGMEA (500) CyH (1,450) PGME (50) |
| | 1-8 | R-23 | Comparative Polymer 8 (100) | — | Quencher 2 (0.8) | — | PGMEA (500) CyH (1,450) PGME (50) |

Examples 2-1 to 2-6 and Comparative Examples 2-1 to 2-5

ArF Lithography

A trilayer process substrate was prepared by forming a spin-on carbon film (ODL-50 by Shin-Etsu Chemical Co., Ltd., carbon content 80 wt %) of 200 nm thick on a silicon wafer and forming a silicon-containing spin-on hard mask (SHB-A940 by Shin-Etsu Chemical Co., Ltd., silicon content 43 wt %) of 35 nm thick thereon. The resist solution in Table 1 was spin coated on the trilayer process substrate, then baked (PAB) on a hot plate at 100° C. for 60 seconds to form a resist film of 90 nm thick. Using an ArF excimer laser immersion lithography scanner (NSR-610C by Nikon Corp., NA 1.30, σ 0.98/0.74, dipole opening 35 deg., azimuthally polarized illumination, 6% halftone phase shift mask), exposure was carried out. After exposure, the resist film was baked (PEB) at the temperature shown in Table 2 for 60 seconds, developed in 2.38 wt % tetramethylammonium hydroxide (TMAH) aqueous solution for 30 seconds, forming a positive, 40-nm line-and-space 1:1 pattern. The LWR of the pattern was measured using TDSEM (CG4000 by Hitachi Hitechnologies, Ltd.) The results are shown in Table 2.

TABLE 2

| | | Resist | PEB temp. (° C.) | Sensitivity (mJ/cm$^2$) | LWR (nm) | Pattern profile |
|---|---|---|---|---|---|---|
| Example | 2-1 | R-01 | 90 | 28.0 | 3.0 | Rectangular |
| | 2-2 | R-02 | 90 | 26.5 | 2.9 | Rectangular |
| | 2-3 | R-03 | 90 | 25.0 | 2.8 | Rectangular |
| | 2-4 | R-04 | 90 | 24.5 | 2.5 | Rectangular |
| | 2-5 | R-05 | 90 | 26.0 | 2.7 | Rectangular |
| | 2-6 | R-06 | 90 | 25.0 | 2.6 | Rectangular |
| Comparative Example | 2-1 | R-16 | 90 | 26.0 | 3.9 | Pattern collapsed |
| | 2-2 | R-17 | 90 | 26.0 | 3.9 | Noticeable film thickness loss |
| | 2-3 | R-18 | 90 | 25.6 | 4.1 | Pattern collapsed |
| | 2-4 | R-19 | 90 | 25.5 | 4.2 | Pattern collapsed |
| | 2-5 | R-20 | 90 | 25.5 | 4.1 | Pattern collapsed |

Examples 3-1 to 3-9 and Comparative Examples 3-1 to 3-3

EB Image Writing

Using a coater/developer system Clean Track Mark 5 (Tokyo Electron Ltd.), the resist composition of Table 1 was spin coated onto a silicon substrate (diameter 6 inches, vapor primed with hexamethyldisilazane (HMDS)) and pre-baked on a hot plate at 110° C. for 60 seconds to form a resist film of 100 nm thick. Using a system HL-800D (Hitachi Ltd.) at a HV voltage of 50 kV, the resist film was exposed imagewise to EB in a vacuum chamber.

Using Clean Track Mark 5, immediately after the imagewise exposure, the resist film was baked (PEB) on a hot plate at the temperature shown in Table 3 for 60 seconds and puddle developed in a 2.38 wt % TMAH aqueous solution for 30 seconds to form a positive pattern.

Sensitivity is the exposure dose ($\mu C/cm^2$) that provides a 1:1 resolution of a 100-nm line-and-space pattern. Resolution is a minimum size at the exposure dose. The 100-nm L/S pattern was measured for LWR under SEM. The results are shown in Table 3.

As seen from the results in Tables 2 to 4, the resist compositions within the scope of the invention are resistant to pattern collapse and film thickness loss during development, exhibit high resolution, and form patterns of good profile with minimal edge roughness.

Japanese Patent Application No. 2012-142572 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

TABLE 3

|  |  | Resist | PEB temp. (° C.) | Sensitivity ($\mu C/cm^2$) | Resolution (nm) | LWR (nm) | Pattern profile |
|---|---|---|---|---|---|---|---|
| Example | 3-1 | R-07 | 90 | 27.0 | 70 | 4.4 | Rectangular |
|  | 3-2 | R-08 | 90 | 26.8 | 70 | 4.5 | Rectangular |
|  | 3-3 | R-09 | 90 | 26.5 | 70 | 4.3 | Rectangular |
|  | 3-4 | R-10 | 90 | 25.8 | 70 | 4.1 | Rectangular |
|  | 3-5 | R-11 | 90 | 25.6 | 70 | 4.0 | Rectangular |
|  | 3-6 | R-12 | 90 | 25.7 | 70 | 4.2 | Rectangular |
|  | 3-7 | R-13 | 90 | 26.3 | 70 | 4.0 | Rectangular |
|  | 3-8 | R-14 | 90 | 26.0 | 70 | 3.9 | Rectangular |
|  | 3-9 | R-15 | 90 | 25.6 | 70 | 3.9 | Rectangular |
| Comparative Example | 3-1 | R-21 | 90 | 27.0 | 90 | 8.7 | Pattern collapsed |
|  | 3-2 | R-22 | 90 | 26.6 | 90 | 8.8 | Noticeable film thickness loss |
|  | 3-3 | R-23 | 90 | 26.6 | 90 | 8.9 | Noticeable film thickness loss |

Example 4-1 and Comparative Example 4-1

EUV Lithography

The resist composition of Table 1 was spin coated on a silicon substrate (diameter 4 inches, HMDS vapor primed) and prebaked on a hot plate at 105° C. for 60 seconds to form a resist film of 40 nm thick. EUV exposure was performed by dipole illumination at NA 0.3. Immediately after the exposure, the resist film was baked (PEB) on a hot plate at the temperature shown in Table 4 for 60 seconds and puddle developed in a 2.38 wt % TMAH aqueous solution for 30 seconds to form a positive pattern.

Sensitivity is the exposure dose ($mJ/cm^2$) that provides a 1:1 resolution of a 30-nm line-and-space pattern. Resolution is a minimum size at the exposure dose. The 35-nm L/S pattern was measured for LWR under SEM. The results are shown in Table 4.

The invention claimed is:

1. A polymer consisting of recurring units XA, recurring units B1 and/or B2 having a carboxyl and/or phenolic hydroxyl group whose hydrogen atom is substituted by an acid labile group, and recurring units C1 having a hydroxyaromatic group and/or recurring units C2 having a 2,2,2-trifluoro-1-hydroxyethyl group, as represented by the general formula (1) and recurring units E having an adhesive group selected from the class consisting of hydroxyl, carboxyl, lactone ring, carbonate, thiocarbonate, carbonyl, cyclic acetal, ether, ester, sulfonic acid ester, and cyano with proviso that said recurring units E having an adhesive group being different from the recurring unit XA, B1, B2, C1, and C2, the polymer having a weight average molecular weight of 1,000 to 500,000,

TABLE 4

|  | Resist | PEB temp. (° C.) | Sensitivity ($mJ/cm^2$) | Resolution (nm) | LWR (nm) | Pattern profile |
|---|---|---|---|---|---|---|
| Example 4-1 | R-08 | 90 | 12 | 23 | 4.0 | Rectangular |
| Comparative Example 4-1 | R-22 | 90 | 12 | 26 | 5.1 | Noticeable film thickness loss |

(1)

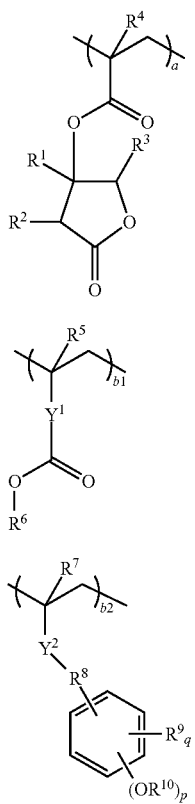

XA

B1

B2

C1

C2 wherein $R^1$ and $R^3$ are each independently a $C_1$-$C_3$ alkyl group, $R^2$ is hydrogen or a $C_1$-$C_3$ alkyl group, $R^4$ is hydrogen or methyl, $R^5$ and $R^7$ are each independently hydrogen or methyl, $R^6$ and $R^{10}$ are each independently an acid labile group, $R^8$ is a single bond or a $C_1$-$C_6$ straight or branched alkylene group, $R^9$ is hydrogen, fluorine, trifluoromethyl, cyano or a $C_1$-$C_6$ straight, branched or cyclic alkyl group, p is 1 or 2, q is an integer of 0 to 4, $Y^1$ is a single bond, a $C_1$-$C_{12}$ linking group having an ester radical, ether radical or lactone ring, phenylene group or naphthylene group, $Y^2$ is a single bond, —C(=O)—O— or —C(=O)—NH—, $R^{11}$ and $R^{13}$ are each independently hydrogen or methyl, $W^1$ and $W^2$ are each independently a single bond, phenylene group, —$R^{15}$—C(=O)—O—$R^{16}$—, —$R^{15}$—O—$R^{16}$—, or —$R^{15}$—C(=O)—NH—$R^{16}$—, $R^{15}$ is a single bond or a $C_6$-$C_{10}$ arylene group, $R^{16}$ is a single bond or a $C_1$-$C_{10}$ straight, branched, cyclic or bridged alkylene group, $C_6$-$C_{10}$ arylene group, or $C_2$-$C_{10}$ alkenylene group, which may contain an ether radical, ester radical or fluorine, $R^{12}$ is hydrogen, fluorine, trifluoromethyl, cyano, $C_1$-$C_6$ straight, branched or cyclic alkyl, alkoxy, acyl, acyloxy, or alkoxycarbonyl group, $R^{14}$ is hydrogen, fluorine, methyl, trifluoromethyl, or difluoromethyl, $R^{14}$ and $W^2$ may bond together to form a $C_3$-$C_6$ ring which may be substituted with fluorine or have an ether radical within the ring, r is 0 or 1, s is 1 or 2, v is 1 or 2, w is an integer of 0 to 4, a, b1, b2, c1, c2 and e are numbers in the range: $0 < a < 1.0$, $0 \le b1 < 1.0$, $0 \le b2 < 1.0$, $0 < b1+b2 < 1.0$, $0 \le c1 < 1.0$, $0 \le c2 < 1.0$, $0 < c1+c2 < 1.0$, $0 < e \le 0.9$ wherein e is a molar fraction of units E, and $a+b1+b2+c1+c2+e=1.0$.

2. A positive resist composition comprising the polymer of claim 1 as a base resin.

3. The resist composition of claim 2, further comprising an organic solvent and an acid generator.

4. A polymer consisting of recurring units XA, recurring units B1 and/or B2 having a carboxyl and/or phenolic hydroxyl group whose hydrogen atom is substituted by an acid labile group, recurring units C1 having a hydroxy-aromatic group and/or recurring units C2 having a 2,2,2-trifluoro-1-hydroxyethyl group, as represented by the general formula (1) and recurring units of at least one type selected from sulfonium salt units D1 to D3 represented by the general formula (2), the polymer having a weight average molecular weight of 1,000 to 500,000, (1)

XA

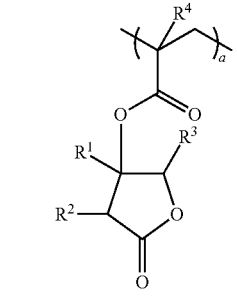

B1

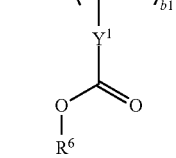

B2

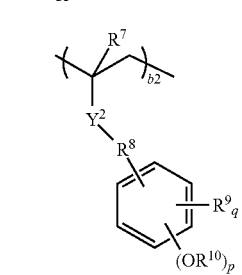

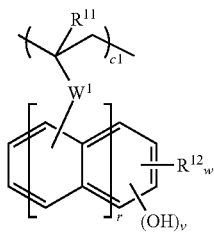

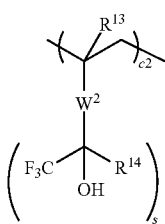

wherein $R^1$ and $R^3$ are each independently a $C_1$-$C_3$ alkyl group, $R^2$ is hydrogen or a $C_1$-$C_3$ alkyl group, $R^4$ is hydrogen or methyl, $R^5$ and $R^7$ are each independently hydrogen or methyl, $R^6$ and $R^{10}$ are each independently an acid labile group, $R^8$ is a single bond or a $C_1$-$C_6$ straight or branched alkylene group, $R^9$ is hydrogen, fluorine, trifluoromethyl, cyano or a $C_1$-$C_6$ straight, branched or cyclic alkyl group, p is 1 or 2, q is an integer of 0 to 4, $Y^1$ is a single bond, a $C_1$-$C_{12}$ linking group having an ester radical, ether radical or lactone ring, phenylene group or naphthylene group, $Y^2$ is a single bond, —C(=O)—O— or —C(=O)—NH—, $R^{11}$ and $R^{13}$ are each independently hydrogen or methyl, $W^1$ and $W^2$ are each independently a single bond, phenylene group, —$R^{15}$—C(=O)—O—$R^{16}$—, —$R^{15}$—O—$R^{16}$—, or —$R^{15}$—C(=O)—NH—$R^{16}$—, $R^{15}$ is a single bond or a $C_6$-$C_{10}$ arylene group, $R^{16}$ is a single bond or a $C_1$-$C_{10}$ straight, branched, cyclic or bridged alkylene group, $C_6$-$C_{10}$ arylene group, or $C_2$-$C_{10}$ alkenylene group, which may contain an ether radical, ester radical or fluorine, $R^{12}$ is hydrogen, fluorine, trifluoromethyl, cyano, $C_1$-$C_6$ straight, branched or cyclic alkyl, alkoxy, acyl, acyloxy, or alkoxycarbonyl group, $R^{14}$ is hydrogen, fluorine, methyl, trifluoromethyl, or difluoromethyl, $R^{14}$ and $W^2$ may bond together to form a $C_3$-$C_6$ ring which may be substituted with fluorine or have an ether radical within the ring, r is 0 or 1, s is 1 or 2, v is 1 or 2, w is an integer of 0 to 4, (2)

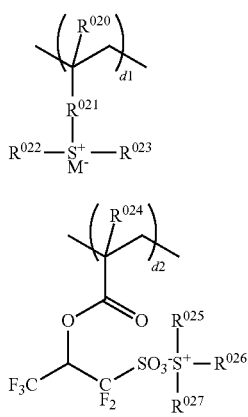

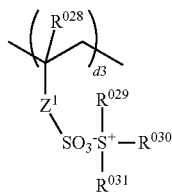

wherein $R^{020}$, $R^{024}$, and $R^{028}$ each are hydrogen or methyl, $R^{021}$ is a single bond, phenylene, —O—$R^{033}$—, or —C(=O)—Y—$R^{033}$—, Y is oxygen or NH, $R^{033}$ is a straight, branched or cyclic $C_1$-$C_6$ alkylene group, alkenylene or phenylene group, which may contain a carbonyl (—CO—), ester (—COO—), ether (—O—) or hydroxyl radical, $R^{022}$, $R^{023}$, $R^{025}$, $R^{026}$, $R^{027}$, $R^{029}$, $R^{030}$, and $R^{031}$ are each independently a straight, branched or cyclic $C_1$-$C_{12}$ alkyl group which may contain a carbonyl, ester or ether radical, or a $C_6$-$C_{12}$ aryl, $C_7$-$C_{20}$ aralkyl, or thiophenyl group, $Z^1$ is a single bond, methylene, ethylene, phenylene, fluorophenylene, —O—$R^{032}$—, or —C(=O)—$Z^2$—$R^{032}$—, $Z^2$ is oxygen or NH, $R^{032}$ is a straight, branched or cyclic $C_1$-$C_6$ alkylene group, alkenylene or phenylene group, which may contain a carbonyl, ester, ether or hydroxyl radical, M⁻ is a non-nucleophilic counter ion, a, b1, b2, c1, c2, d1, d2 and d3 are numbers in the range: $0 < a < 1.0$, $0 \le b1 < 1.0$, $0 \le b2 < 1.0$, $0 < b1+b2 < 1.0$, $0 \le c1 < 1.0$, $0 \le c2 < 1.0$, $0 < c1+c2 < 1.0$, $0 \le d1 \le 0.5$, $0 \le d2 \le 0.5$, $0 \le d3 \le 0.5$, $0 < d1+d2+d3 \le 0.5$, and $a+b1+b2+c1+c2+d1+d2+d3=1.0$.

5. A positive resist composition comprising the polymer of claim 4 as a base resin.

6. The resist composition of claim 5, further comprising an organic solvent.

7. A polymer consisting of recurring units XA, recurring units B1 and/or B2 having a carboxyl and/or phenolic hydroxyl group whose hydrogen atom is substituted by an acid labile group, recurring units C1 having a hydroxy-aromatic group and/or recurring units C2 having a 2,2,2-trifluoro-1-hydroxyethyl group, as represented by the general formula (1), recurring units of at least one type selected from sulfonium salt units D1 to D3 represented by the general formula (2), and recurring units E having an adhesive group selected from the class consisting of hydroxyl, carboxyl, lactone ring, carbonate, thiocarbonate, carbonyl, cyclic acetal, ether, ester, sulfonic acid ester, and cyano with proviso that said recurring units E having an adhesive group being different from the recurring units XA, B1, B2, C1 and C2, the polymer having a weight average molecular weight of 1,000 to 500,000, (1)

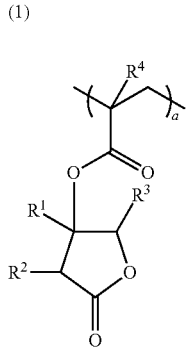

-continued

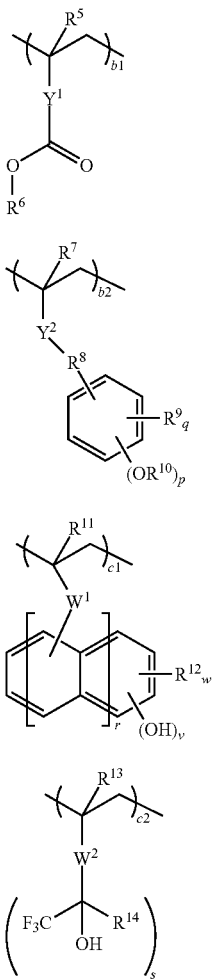

B1

B2

C1

C2

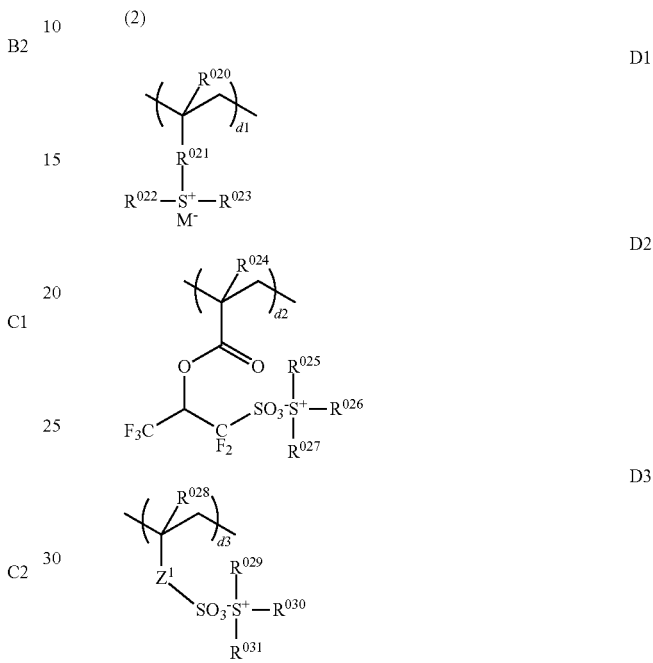

D1

D2

D3 wherein $R^1$ and $R^3$ are each independently a $C_1$-$C_3$ alkyl group, $R^2$ is hydrogen or a $C_1$-$C_3$ alkyl group, $R^4$ is hydrogen or methyl, $R^5$ and $R^7$ are each independently hydrogen or methyl, $R^6$ and $R^{10}$ are each independently an acid labile group, $R^8$ is a single bond or a $C_1$-$C_6$ straight or branched alkylene group, $R^9$ is hydrogen, fluorine, trifluoromethyl, cyano or a $C_1$-$C_6$ straight, branched or cyclic alkyl group, p is 1 or 2, q is an integer of 0 to 4, $Y^1$ is a single bond, a $C_1$-$C_{12}$ linking group having an ester radical, ether radical or lactone ring, phenylene group or naphthylene group, $Y^2$ is a single bond, —C(=O)—O— or —C(=O)—NH—, $R^{11}$ and $R^{13}$ are each independently hydrogen or methyl, $W^1$ and $W^2$ are each independently a single bond, phenylene group, —$R^{15}$—C(=O)—O—$R^{16}$—, —$R^{15}$—O—$R^{16}$—, or —$R^{15}$—C(=O)—NH—$R^{16}$—, $R^{15}$ is a single bond or a $C_6$-$C_{10}$ arylene group, $R^{16}$ is a single bond or a $C_1$-$C_{10}$ straight, branched, cyclic or bridged alkylene group, $C_6$-$C_{10}$ arylene group, or $C_2$-$C_{10}$ alkenylene group, which may contain an ether radical, ester radical or fluorine, $R^{12}$ is hydrogen, fluorine, trifluoromethyl, cyano, $C_1$-$C_6$ straight, branched or cyclic alkyl, alkoxy, acyl, acyloxy, or alkoxycarbonyl group, $R^{14}$ is hydrogen, fluorine, methyl, trifluoromethyl, or difluoromethyl, $R^{14}$ and $W^2$ may bond together to form a $C_3$-$C_6$ ring which may be substituted with fluorine or have an ether radical within the ring, r is 0 or 1, s is 1 or 2, v is 1 or 2, w is an integer of 0 to 4, (2)

wherein $R^{020}$, $R^{024}$, and $R^{028}$ each are hydrogen or methyl, $R^{021}$ is a single bond, phenylene, —O—$R^{033}$—, or —C(=O)—Y—$R^{033}$—, Y is oxygen or NH, $R^{033}$ is a straight, branched or cyclic $C_1$-$C_6$ alkylene group, alkenylene or phenylene group, which may contain a carbonyl (—CO—), ester (—COO—), ether (—O—) or hydroxyl radical, $R^{022}$, $R^{023}$, $R^{025}$, $R^{026}$, $R^{027}$, $R^{029}$, $R^{030}$, and $R^{031}$ are each independently a straight, branched or cyclic $C_1$-$C_{12}$ alkyl group which may contain a carbonyl, ester or ether radical, or a $C_6$-$C_{12}$ aryl, $C_7$-$C_{20}$ aralkyl, or thiophenyl group, $Z^1$ is a single bond, methylene, ethylene, phenylene, fluorophenylene, —O—$R^{032}$—, or —C(=O)—$Z^2$—$R^{032}$—, $Z^2$ is oxygen or NH, $R^{032}$ is a straight, branched or cyclic $C_1$-$C_6$ alkylene group, alkenylene or phenylene group, which may contain a carbonyl, ester, ether or hydroxyl radical, M⁻ is a non-nucleophilic counter ion, a, b1, b2, c1, c2, d1, d2, d3 and e are numbers in the range: $0 < a < 1.0$, $0 \le b1 < 1.0$, $0 \le b2 < 1.0$, $0 < b1+b2 < 1.0$, $0 \le c1 < 1.0$, $0 \le c2 < 1.0$, $0 < c1+c2 < 1.0$, $0 \le d1 \le 0.5$, $0 \le d2 \le 0.5$, $0 \le d3 \le 0.5$, $0 < d1+d2+d3 \le 0.5$, $0 < e \le 0.9$ wherein e is a molar fraction of units E, and a+b1+b2+c1+c2+d1+d2+d3+e=1.0.

8. A positive resist composition comprising the polymer of claim 7 as a base resin.

9. The resist composition of claim 8, further comprising an organic solvent.

* * * * *